(12) United States Patent
Lomayev et al.

(10) Patent No.: US 11,502,774 B2
(45) Date of Patent: Nov. 15, 2022

(54) APPARATUS, SYSTEM AND METHOD OF COMMUNICATING A PHYSICAL LAYER PROTOCOL DATA UNIT (PPDU)

(71) Applicant: INTEL CORPORATION, Santa Clara, CA (US)

(72) Inventors: Artyom Lomayev, Nizhny Novgorod (RU); Alexander Maltsev, Nizhny Novgorod (RU); Michael Genossar, Modiin (IL); Claudio Da Silva, Portland, OR (US); Carlos Cordeiro, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/356,266

(22) Filed: Jun. 23, 2021

(65) Prior Publication Data
US 2021/0328709 A1    Oct. 21, 2021

Related U.S. Application Data

(63) Continuation of application No. 16/626,555, filed as application No. PCT/US2018/039248 on Jun. 25, 2018.
(Continued)

(51) Int. Cl.
*H04L 1/00* (2006.01)
*H03M 13/11* (2006.01)
(Continued)

(52) U.S. Cl.
CPC ....... *H04L 1/0008* (2013.01); *H03M 13/1148* (2013.01); *H04L 1/0057* (2013.01);
(Continued)

(58) Field of Classification Search
CPC ... H04L 1/0008; H04L 5/0007; H04L 1/0057; H04L 69/324; H04L 1/0041; H04L 1/06;
(Continued)

(56) References Cited

U.S. PATENT DOCUMENTS 8,437,440 B1    5/2013 Zhang et al.
9,100,074 B1    8/2015 Zhang et al.
(Continued)

FOREIGN PATENT DOCUMENTS

WO    2016/175943    11/2016
WO    2017044420     3/2017
WO    2018216922    11/2018

OTHER PUBLICATIONS

Office Action for U.S. Appl. No. 16/910,269, dated Aug. 19, 2021, 37 pages.
(Continued)

*Primary Examiner* — Jung Liu
(74) *Attorney, Agent, or Firm* — Shichrur & Co.

(57) ABSTRACT

Some demonstrative embodiments include apparatuses, devices, systems and methods of communicating a Physical Layer Protocol Data Unit (PPDU). For example, an Enhanced Directional Multi-Gigabit (DMG) (EDMG) station (STA) may be configured to encode a Physical Layer (PHY) Service Data Unit (PSDU) of at least one user in an EDMG PM Protocol Data Unit (PPDU) according to an EDMG Low-Density Parity-Check (LDPC) encoding scheme, which is based at least on a count of one or more spatial streams for transmission to the user; and transmit the EDMG PPDU in a transmission over a channel bandwidth in a frequency band above 45 Gigahertz (GHz).

25 Claims, 7 Drawing Sheets

Related U.S. Application Data

(60) Provisional application No. 62/527,754, filed on Jun. 30, 2017, provisional application No. 62/524,761, filed on Jun. 26, 2017, provisional application No. 62/524,633, filed on Jun. 26, 2017.

(51) Int. Cl.
   *H04L 5/00* (2006.01)
   *H04L 69/324* (2022.01)
   *H04W 72/04* (2009.01)

(52) U.S. Cl.
   CPC .......... *H04L 5/0007* (2013.01); *H04L 69/324* (2013.01); *H04W 72/0466* (2013.01)

(58) Field of Classification Search
   CPC ............... H04L 27/2636; H04L 5/0048; H04L 27/2602; H04L 25/0226; H04L 27/265; H04L 27/262; H04L 27/2603; H04L 27/2613; H04W 72/0466; H04W 52/52; H03M 13/1148; H03M 13/1102; H03M 13/6527; H03M 13/6362; H03M 13/6356; H04B 7/0413
   See application file for complete search history.

(56) References Cited

U.S. PATENT DOCUMENTS

| | | | |
|---|---|---|---|
| 9,749,087 | B2 | 8/2017 | Cordeiro et al. |
| 10,728,070 | B2 | 7/2020 | Kim et al. |
| 11,012,124 | B2 | 5/2021 | Lou et al. |
| 2015/0365263 | A1* | 12/2015 | Zhang ................ H04L 27/2627 375/295 |
| 2016/0249332 | A1 | 8/2016 | Xin et al. |
| 2017/0048095 | A1 | 2/2017 | Sun et al. |
| 2017/0048844 | A1 | 2/2017 | Chen et al. |
| 2017/0078008 | A1 | 3/2017 | Kasher et al. |
| 2017/0127386 | A1 | 5/2017 | Kasher et al. |
| 2017/0202011 | A1 | 7/2017 | Trainin et al. |
| 2017/0207905 | A1* | 7/2017 | Eitan ....................... H04L 43/16 |
| 2017/0257201 | A1* | 9/2017 | Eitan ..................... H04L 27/265 |
| 2018/0324695 | A1 | 11/2018 | Trainin et al. |
| 2018/0367650 | A1 | 12/2018 | Motozuka et al. |
| 2019/0182893 | A1* | 6/2019 | Sakamoto ............. H04L 1/0003 |
| 2019/0191331 | A1* | 6/2019 | Park ....................... H04W 28/06 |
| 2019/0999979 | | 7/2019 | Montorsi et al. |
| 2019/0260446 | A1* | 8/2019 | Oteri .................. H04W 72/042 |
| 2019/0288763 | A1 | 9/2019 | Oteri et al. |
| 2019/0305996 | A1 | 10/2019 | Handte et al. |
| 2020/0007211 | A1* | 1/2020 | Liu ....................... H04B 7/0491 |
| 2020/0127719 | A1 | 4/2020 | Lomayev et al. |
| 2020/0145137 | A1 | 5/2020 | Handte et al. |
| 2020/0162135 | A1 | 5/2020 | Sun et al. |
| 2020/0252156 | A1 | 8/2020 | Lomayev et al. |
| 2020/0304189 | A1 | 9/2020 | Lomayev et al. |
| 2020/0322008 | A1 | 10/2020 | Lomayev et al. |
| 2020/0322019 | A1 | 10/2020 | Lomayev et al. |
| 2020/0328842 | A1 | 10/2020 | Lomayev et al. |
| 2020/0328843 | A1 | 10/2020 | Lomayev et al. |
| 2020/0358491 | A1 | 11/2020 | Lomayev et al. |
| 2021/0006308 | A1 | 1/2021 | Lomayev et al. |
| 2021/0006309 | A1 | 1/2021 | Lomayev et al. |
| 2021/0226723 | A1 | 7/2021 | Lomayev et al. |
| 2021/0226724 | A1 | 7/2021 | Lomayev et al. |
| 2021/0273688 | A1 | 9/2021 | Lou et al. |

OTHER PUBLICATIONS

Office Action for U.S. Appl. No. 16/940,897, dated Mar. 24, 2022, 85 pages.
Office Action for U.S. Appl. No. 16/753,343, dated Dec. 24, 2021, 48 pages.
International Search Report and the Written Opinion for International Application No. PCT/US2018/039248, dated Oct. 26, 2018, 13 pages.
Artyom Lomayev et al., '30.5.2 Transmitter Block Diagram for SC Mode', IEEE 802.11-17/0752r2, May 8, 2017, 7 pages.
Artyom Lomayev et al., '29.5.7.27 Encoding', IEEE 802.11-17/0214r1, Feb. 14, 2017, 6 pages.
Artyom Lomayev et al., '30.5 8 Non-EDMG Duplicate Transmission', IEEE 802.11-17/0525r0, Mar. 21, 2017, 6 pages.
IEEE Std 802.11™-2016. IEEE Standard for Information technology—Telecommunications and information exchange between systems Local and metropolitan area networks—Specific requirements Part 11: Wireless LAN Medium Access Control (MAC) and Physical Layer (PHY) Specifications, Dec. 7, 2016, 3534 pages.
International Preliminary Report on Patentability for International Application No. PCT/US2018/039248, dated Jan. 9, 2020, 10 pages.
International Search Report and the Written Opinion for International Application No. PCT/US2018/035792, dated Sep. 27, 2018, 13 pages.
International Preliminary Report on Patentability for International Application No. PCT/US2018/035792, dated Dec. 19, 2019, 10 pages.
Claudio Da Silva, Intel, "64 EDMG control mode", IEEE 802.11-16/01630r0, Dec. 21, 2016, 6 pages.
Artyom Lomayev et al., "30.5.8 Non-EDMG Duplicate Transmission", IEEE 802.11-17/0525r1, Mar. 29, 2017, 6 pages.
Christopher Hansen, Peraso, "Draft text for TX Masks", IEEE 802.11-16/1627r0, Dec. 21, 2016, 6 pages.
International Search Report and the Written Opinion for International Application No. PCT/US2018/052998, dated Jan. 17, 2019, 13 pages.
International Preliminary Report on Patentability for International Application No. PCT/US2018/052998, dated Apr. 30, 2020, 10 pages.
Artyom Lomayev et al., 'Proposed Comment Resolution for CID 1, 2, 23, 525', IEEE 802.11-17/0880r1, Jul. 9, 2017, 12 pages.
Takenori Sakamoto et al., 'EDMG-Header-A Encoding and Modulation for EDMG SC mode A-PPDU', IEEE 802.11-17/1411r2, Sep. 13, 2017, 6 pages.
Artyom Lomayev et al., '30.6.8 OFDM PPDU Transmission', IEEE 802.11-17/1568r0, Oct. 10, 2017, 12 pages.
International Search Report and the Written Opinion for International Application No. PCT/US2018/037467, dated Nov. 28, 2018, 11 pages.
Artyom Lomayev et al., 'Proposed Comment Resolution for CID 63, 68 in 11ay', IEEE 802.11-17/0893r2, Jun. 12, 2017, 9 pages.
Claudio Da Silva et al., 'EDMG Control Mode Data Field', IEEE 802.11-17/0277r0, Feb. 27, 2017, 5 pages.
Takenori Sakamoto et al., 'Comment Resolution on EDMG A-PPDU Structure', IEEE 802.11-17/0760r3, May 10, 2017, 9 pages.
International Preliminary Report on Patentability for International Application No. PCT/US2018/037467 dated Jan. 2, 2020, 8 pages.
Notice of Allowance for U.S. Appl. No. 16/624,449, dated May 18, 2020, 19 Pages.
Notice of Allowance for U.S. Appl. No. 16/898,489, dated Aug. 18, 2020, 16 pages.
Notice of Allowance for U.S. Appl. No. 16/624,449, dated Aug. 31, 2020, 16 pages.
Notice of Allowance for U.S. Appl. No. 16/910,243, dated Sep. 3, 2020, 21 pages.
Office Action for U.S. Appl. No. 16/626,555, dated May 17, 2021, 50 pages.
Notice of Allowance for U.S. Appl. No. 16/626,555, dated Sep. 13, 2021, 10 pages.
Notice of Allowance for U.S. Appl. No. 16/626,555, dated Mar. 17, 2022, 14 pages.
Notice of Allowance for U.S. Appl. No. 16/910,269 dated Dec. 14, 2021, 13 pages.
Notice of Allowance for U.S. Appl. No. 16/911,738, dated Jul. 21, 2021, 37 pages.
Office Action for U.S. Appl. No. 17/028,309, dated Apr. 14, 2022, 57 pages.
Office Action for U.S. Appl. No. 17/213,220, dated Apr. 28, 2022, 53 pages.

(56) References Cited

OTHER PUBLICATIONS

Notice of Allowance for U.S. Appl. No. 17/213,222, dated May 12, 2022, 46 pages.
Notice of Allowance for U.S. Appl. No. 17/028,356, dated May 27, 2022, 55 pages.
Office Action for U.S. Appl. No. 16/753,343, dated Jun. 6, 2022, 23 pages.
Notice of Allowance for U.S. Appl. No. 16/940,897, dated Jul. 7, 2022, 17 pages.
Notice of Allowance for U.S. Appl. No. 17/028,309, dated Aug. 10, 2022, 29 pages.

* cited by examiner

APPARATUS, SYSTEM AND METHOD OF COMMUNICATING A PHYSICAL LAYER PROTOCOL DATA UNIT (PPDU)

CROSS REFERENCE

This application claims the benefit of and priority from US Provisional Patent Application No. 62/524,633 entitled "Apparatus, System and Method of Communicating a Physical Layer Protocol Data Unit (PPDU)", filed Jun. 26, 2017, U.S. Provisional Patent Application No. 62/524,761 entitled "Apparatus, System and Method of Communicating a Physical Layer Protocol Data Unit (PPDU)", filed Jun. 26, 2017, and U.S. Provisional Patent Application No. 62/527,754 entitled "ENHANCED ENCODING FOR WIRELESS COMMUNICATIONS", filed Jun. 30, 2017, the entire disclosures of which are incorporated herein by reference.

TECHNICAL FIELD

Embodiments described herein generally relate to communicating a Physical Layer Protocol Data Unit (PPDU).

BACKGROUND

A wireless communication network in a millimeter-wave band may provide high-speed data access for users of wireless communication devices.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
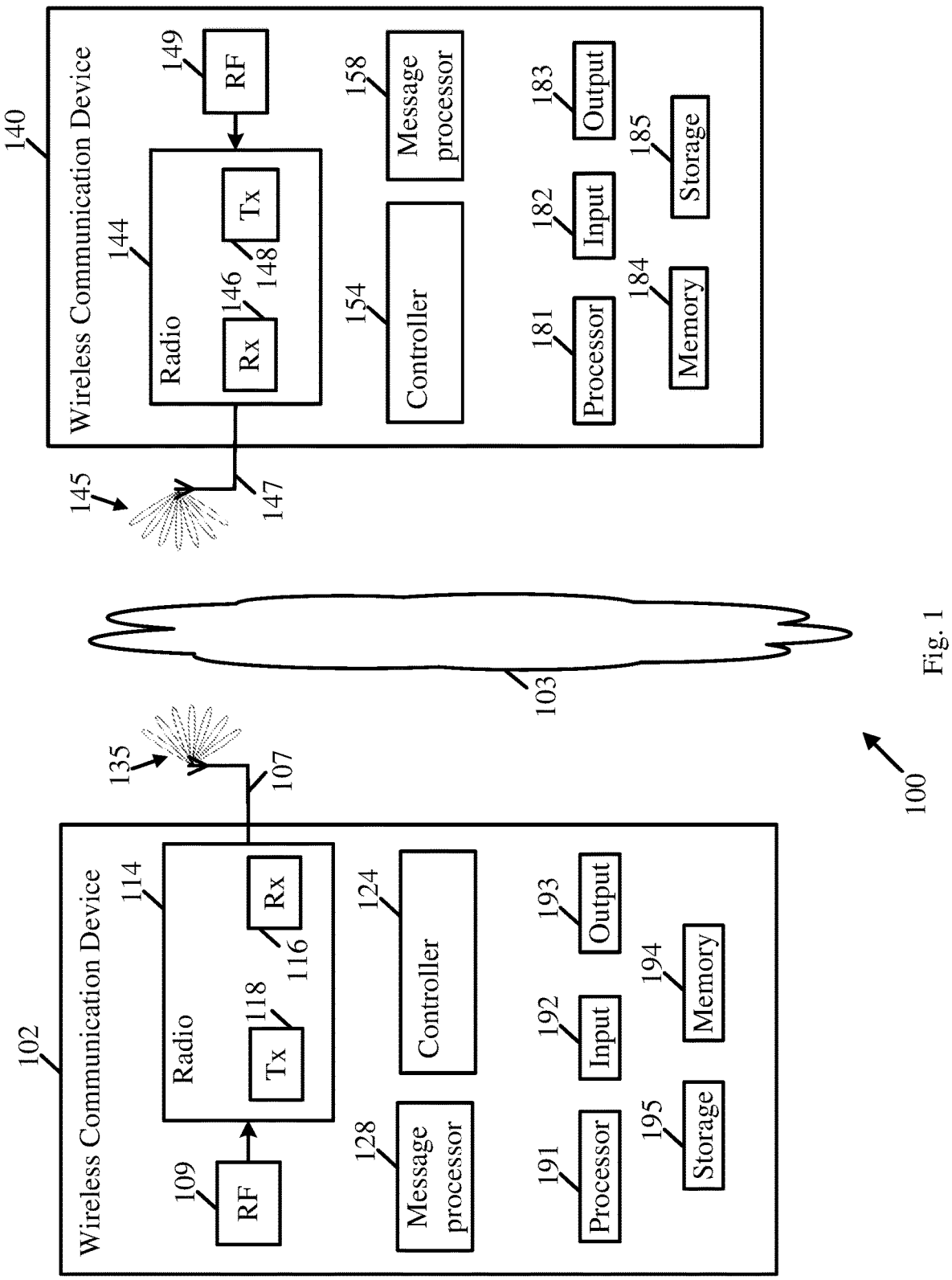
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a handheld device, a wearable device, a sensor device, an Internet of Things (IoT) device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with devices and/or networks operating in accordance with existing IEEE 802.11 standards (including IEEE 802.11-2016 (*IEEE 802.11-2016, IEEE Standard for Information technology—Telecommunications and information exchange between systems Local and metropolitan area networks—Specific requirements Part 11: Wireless LAN Medium Access Control (MAC) and Physical Layer (PHY) Specifications*, Dec. 7, 2016); and/or IEEE 802.11ay (*P802.11ay/D1.0 Draft Standard for Information Technology—Telecommunications and Information Exchange Between Systems—Local and Metropolitan Area Networks—Specific Requirements*

Part 11: *Wireless LAN Medium Access Control (MAC) and Physical Layer (PHY) Specifications—Amendment 7: Enhanced Throughput for Operation in License Exempt Bands Above 45 GHz, November,* 2017)) and/or future versions and/or derivatives thereof, devices and/or networks operating in accordance with existing WFA Peer-to-Peer (P2P) specifications (*WiFi P2P technical specification, version* 1.7, *Jul.* 6, 2016) and/or future versions and/or derivatives thereof, devices and/or networks operating in accordance with existing Wireless-Gigabit-Alliance (WGA) specifications (including *Wireless Gigabit Alliance, Inc WiGig MAC and PHY Specification Version* 1.1, *April* 2011, *Final specification*) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Orthogonal Frequency-Division Multiple Access (OFDMA), FDM Time-Division Multiplexing (TDM), Time-Division Multiple Access (TDMA), Multi-User MIMO (MU-MIMO), Spatial Division Multiple Access (SDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G), or Sixth Generation (6G) mobile networks, 3GPP, Long Term Evolution (LTE), LTE advanced, Enhanced Data rates for GSM Evolution (EDGE), or the like. Other embodiments may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device. The communication signal may be transmitted and/or received, for example, in the form of Radio Frequency (RF) communication signals, and/or any other type of signal.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

Some demonstrative embodiments may be used in conjunction with a WLAN, e.g., a WiFi network. Other embodiments may be used in conjunction with any other suitable wireless communication network, for example, a wireless area network, a "piconet", a WPAN, a WVAN and the like.

Some demonstrative embodiments may be used in conjunction with a wireless communication network communicating over a frequency band above 45 Gigahertz (GHz), e.g., 60 GHz. However, other embodiments may be implemented utilizing any other suitable wireless communication frequency bands, for example, an Extremely High Frequency (EHF) band (the millimeter wave (mmWave) frequency band), e.g., a frequency band within the frequency band of between 20 Ghz and 300 GHz, a frequency band above 45 GHz, a 5G frequency band, a frequency band below 20 GHz, e.g., a Sub 1 GHz (S1G) band, a 2.4 GHz band, a 5 GHz band, a WLAN frequency band, a WPAN frequency band, a frequency band according to the WGA specification, and the like.

The term "antenna", as used herein, may include any suitable configuration, structure and/or arrangement of one or more antenna elements, components, units, assemblies and/or arrays. In some embodiments, the antenna may implement transmit and receive functionalities using separate transmit and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

The phrases "directional multi-gigabit (DMG)" and "directional band" (DBand), as used herein, may relate to a frequency band wherein the Channel starting frequency is above 45 GHz. In one example, DMG communications may involve one or more directional links to communicate at a rate of multiple gigabits per second, for example, at least 1 Gigabit per second, e.g., at least 7 Gigabit per second, at least 30 Gigabit per second, or any other rate.

Some demonstrative embodiments may be implemented by a DMG STA (also referred to as a "mmWave STA (mSTA)"), which may include for example, a STA having a radio transmitter, which is capable of operating on a channel that is within the DMG band. The DMG STA may perform other additional or alternative functionality. Other embodiments may be implemented by any other apparatus, device and/or station.

Reference is made to FIG. 1, which schematically illustrates a system 100, in accordance with some demonstrative embodiments.

As shown in FIG. 1, in some demonstrative embodiments, system 100 may include one or more wireless communication devices. For example, system 100 may include a wireless communication device 102, a wireless communication device 140, and/or one more other devices.

In some demonstrative embodiments, devices 102 and/or 140 may include a mobile device or a non-mobile, e.g., a static, device.

For example, devices 102 and/or 140 may include, for example, a UE, an MD, a STA, an AP, a PC, a desktop computer, a mobile computer, a laptop computer, an Ultrabook™ computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a media player, a Smartphone, a television, a music player, or the like.

In some demonstrative embodiments, device 102 may include, for example, one or more of a processor 191, an input unit 192, an output unit 193, a memory unit 194, and/or a storage unit 195; and/or device 140 may include, for example, one or more of a processor 181, an input unit 182, an output unit 183, a memory unit 184, and/or a storage unit 185. Devices 102 and/or 140 may optionally include other suitable hardware components and/or software components. In some demonstrative embodiments, some or all of the components of one or more of devices 102 and/or 140 may be enclosed in a common housing or packaging, and may be interconnected or operably associated using one or more wired or wireless links. In other embodiments, components of one or more of devices 102 and/or 140 may be distributed among multiple or separate devices.

In some demonstrative embodiments, processor 191 and/or processor 181 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 may execute instructions, for example, of an Operating System (OS) of device 102 and/or of one or more suitable applications. Processor 181 may execute instructions, for example, of an Operating System (OS) of device 140 and/or of one or more suitable applications.

In some demonstrative embodiments, input unit 192 and/or input unit 182 may include, for example, a keyboard, a keypad, a mouse, a touch-screen, a touch-pad, a track-ball, a stylus, a microphone, or other suitable pointing device or input device. Output unit 193 and/or output unit 183 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 194 and/or memory unit 184 includes, for example, a Random Access Memory (RAM), a Read Only Memory (ROM), a Dynamic RAM (DRAM), a Synchronous DRAM (SDRAM), a flash memory, a volatile memory, a non-volatile memory, a cache memory, a buffer, a short term memory unit, a long term memory unit, or other suitable memory units. Storage unit 195 and/or storage unit 185 may include, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102. Memory unit 184 and/or storage unit 185, for example, may store data processed by device 140.

In some demonstrative embodiments, wireless communication devices 102 and/or 140 may be capable of communicating content, data, information and/or signals via a wireless medium (WM) 103. In some demonstrative embodiments, wireless medium 103 may include, for example, a radio channel, a cellular channel, an RF channel, a WiFi channel, a 5G channel, an IR channel, a Bluetooth (BT) channel, a Global Navigation Satellite System (GNSS) Channel, and the like.

In some demonstrative embodiments, WM 103 may include one or more directional bands and/or channels. For example, WM 103 may include one or more millimeter-wave (mmWave) wireless communication bands and/or channels.

In some demonstrative embodiments, WM 103 may include one or more DMG channels. In other embodiments WM 103 may include any other directional channels.

In other embodiments, WM 103 may include any other type of channel over any other frequency band.

In some demonstrative embodiments, device 102 and/or device 140 may include one or more radios including circuitry and/or logic to perform wireless communication between devices 102, 140 and/or one or more other wireless communication devices. For example, device 102 may include at least one radio 114, and/or device 140 may include at least one radio 144.

In some demonstrative embodiments, radio 114 and/or radio 144 may include one or more wireless receivers (Rx) including circuitry and/or logic to receive wireless communication signals, RF signals, frames, blocks, transmission streams, packets, messages, data items, and/or data. For example, radio 114 may include at least one receiver 116, and/or radio 144 may include at least one receiver 146.

In some demonstrative embodiments, radio 114 and/or radio 144 may include one or more wireless transmitters (Tx) including circuitry and/or logic to transmit wireless communication signals, RF signals, frames, blocks, transmission streams, packets, messages, data items, and/or data. For example, radio 114 may include at least one transmitter 118, and/or radio 144 may include at least one transmitter 148.

In some demonstrative embodiments, radio 114 and/or radio 144, transmitters 118 and/or 148, and/or receivers 116 and/or 146 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like. For example, radio 114 and/or radio 144 may include or may be implemented as part of a wireless Network Interface Card (NIC), and the like.

In some demonstrative embodiments, radios 114 and/or 144 may be configured to communicate over a directional band, for example, an mmWave band, a 5G band, and/or any other band, for example, a 2.4 GHz band, a 5 GHz band, a S1G band, and/or any other band.

In some demonstrative embodiments, radios 114 and/or 144 may include, or may be associated with one or more, e.g., a plurality of, directional antennas.

In some demonstrative embodiments, device 102 may include one or more, e.g., a plurality of, directional antennas 107, and/or device 140 may include on or more, e.g., a plurality of, directional antennas 147.

Antennas 107 and/or 147 may include any type of antennas suitable for transmitting and/or receiving wireless communication signals, blocks, frames, transmission streams, packets, messages and/or data. For example, antennas 107 and/or 147 may include any suitable configuration, structure and/or arrangement of one or more antenna elements, components, units, assemblies and/or arrays. Antennas 107 and/or 147 may include, for example, antennas suitable for directional communication, e.g., using beamforming techniques. For example, antennas 107 and/or 147 may include a phased array antenna, a multiple element antenna, a set of switched beam antennas, and/or the like. In some embodiments, antennas 107 and/or 147 may implement transmit and receive functionalities using separate transmit and receive antenna elements. In some embodiments, antennas 107 and/or 147 may implement transmit and receive functionalities using common and/or integrated transmit/receive elements.

In some demonstrative embodiments, antennas 107 and/or 147 may include directional antennas, which may be steered to one or more beam directions. For example, antennas 107 may be steered to one or more beam directions 135, and/or antennas 147 may be steered to one or more beam directions 145.

In some demonstrative embodiments, antennas 107 and/or 147 may include and/or may be implemented as part of a single Phased Antenna Array (PAA).

In some demonstrative embodiments, antennas 107 and/or 147 may be implemented as part of a plurality of PAAs, for example, as a plurality of physically independent PAAs.

In some demonstrative embodiments, a PAA may include, for example, a rectangular geometry, e.g., including an integer number, denoted M, of rows, and an integer number, denoted N, of columns. In other embodiments, any other types of antennas and/or antenna arrays may be used.

In some demonstrative embodiments, antennas 107 and/or antennas 147 may be connected to, and/or associated with, one or more Radio Frequency (RF) chains.

In some demonstrative embodiments, device 102 may include one or more, e.g., a plurality of, RF chains 109 connected to, and/or associated with, antennas 107.

In some demonstrative embodiments, one or more of RF chains 109 may be included as part of, and/or implemented as part of one or more elements of radio 114, e.g., as part of transmitter 118 and/or receiver 116.

In some demonstrative embodiments, device 140 may include one or more, e.g., a plurality of, RF chains 149 connected to, and/or associated with, antennas 147.

In some demonstrative embodiments, one or more of RF chains 149 may be included as part of, and/or implemented as part of one or more elements of radio 144, e.g., as part of transmitter 148 and/or receiver 146.

In some demonstrative embodiments, device 102 may include a controller 124, and/or device 140 may include a controller 154. Controller 124 may be configured to perform and/or to trigger, cause, instruct and/or control device 102 to perform, one or more communications, to generate and/or communicate one or more messages and/or transmissions, and/or to perform one or more functionalities, operations and/or procedures between devices 102, 140 and/or one or more other devices; and/or controller 154 may be configured to perform, and/or to trigger, cause, instruct and/or control device 140 to perform, one or more communications, to generate and/or communicate one or more messages and/or transmissions, and/or to perform one or more functionalities, operations and/or procedures between devices 102, 140 and/or one or more other devices, e.g., as described below.

In some demonstrative embodiments, controllers 124 and/or 154 may include, or may be implemented, partially or entirely, by circuitry and/or logic, e.g., one or more processors including circuitry and/or logic, memory circuitry and/ or logic, Media-Access Control (MAC) circuitry and/or logic, Physical Layer (PHY) circuitry and/or logic, baseband (BB) circuitry and/or logic, a BB processor, a BB memory, Application Processor (AP) circuitry and/or logic, an AP processor, an AP memory, and/or any other circuitry and/or logic, configured to perform the functionality of controllers 124 and/or 154, respectively. Additionally or alternatively, one or more functionalities of controllers 124 and/or 154 may be implemented by logic, which may be executed by a machine and/or one or more processors, e.g., as described below.

In one example, controller 124 may include circuitry and/or logic, for example, one or more processors including circuitry and/or logic, to cause, trigger and/or control a wireless device, e.g., device 102, and/or a wireless station, e.g., a wireless STA implemented by device 102, to perform one or more operations, communications and/or functionalities, e.g., as described herein. In one example, controller 124 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In one example, controller 154 may include circuitry and/or logic, for example, one or more processors including circuitry and/or logic, to cause, trigger and/or control a wireless device, e.g., device 140, and/or a wireless station, e.g., a wireless STA implemented by device 140, to perform one or more operations, communications and/or functionalities, e.g., as described herein. In one example, controller 154 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In some demonstrative embodiments, device 102 may include a message processor 128 configured to generate, process and/or access one or messages communicated by device 102.

In one example, message processor 128 may be configured to generate one or more messages to be transmitted by device 102, and/or message processor 128 may be configured to access and/or to process one or more messages received by device 102, e.g., as described below.

In one example, message processor 128 may include at least one first component configured to generate a message, for example, in the form of a frame, field, information element and/or protocol data unit, for example, a MAC Protocol Data Unit (MPDU); at least one second component configured to convert the message into a PHY Protocol Data Unit (PPDU), for example, by processing the message generated by the at least one first component, e.g., by encoding the message, modulating the message and/or performing any other additional or alternative processing of the message; and/or at least one third component configured to cause transmission of the message over a wireless communication medium, e.g., over a wireless communication channel in a wireless communication frequency band, for example, by applying to one or more fields of the PPDU one or more transmit waveforms. In other embodiments, message processor 128 may be configured to perform any other additional or alternative functionality and/or may include any other additional or alternative components to generate and/or process a message to be transmitted.

In some demonstrative embodiments, device 140 may include a message processor 158 configured to generate, process and/or access one or messages communicated by device 140.

In one example, message processor 158 may be configured to generate one or more messages to be transmitted by device 140, and/or message processor 158 may be configured to access and/or to process one or more messages received by device 140, e.g., as described below.

In one example, message processor 158 may include at least one first component configured to generate a message, for example, in the form of a frame, field, information element and/or protocol data unit, for example, a MAC Protocol Data Unit (MPDU); at least one second component configured to convert the message into a PHY PPDU, for example, by processing the message generated by the at least one first component, e.g., by encoding the message, modulating the message and/or performing any other additional or alternative processing of the message; and/or at least one third component configured to cause transmission of the message over a wireless communication medium, e.g., over a wireless communication channel in a wireless communication frequency band, for example, by applying to one or more fields of the PPDU one or more transmit waveforms. In other embodiments, message processor 158 may be configured to perform any other additional or alternative functionality and/or may include any other additional or alternative components to generate and/or process a message to be transmitted.

In some demonstrative embodiments, message processors 128 and/or 158 may include, or may be implemented, partially or entirely, by circuitry and/or logic, e.g., one or more processors including circuitry and/or logic, memory circuitry and/or logic, MAC circuitry and/or logic, PHY circuitry and/or logic, BB circuitry and/or logic, a BB processor, a BB memory, AP circuitry and/or logic, an AP processor, an AP memory, and/or any other circuitry and/or logic, configured to perform the functionality of message processors 128 and/or 158, respectively. Additionally or alternatively, one or more functionalities of message processors 128 and/or 158 may be implemented by logic, which may be executed by a machine and/or one or more processors, e.g., as described below.

In some demonstrative embodiments, at least part of the functionality of message processor 128 may be implemented as part of radio 114, and/or at least part of the functionality of message processor 158 may be implemented as part of radio 144.

In some demonstrative embodiments, at least part of the functionality of message processor 128 may be implemented as part of controller 124, and/or at least part of the functionality of message processor 158 may be implemented as part of controller 154.

In other embodiments, the functionality of message processor 128 may be implemented as part of any other element of device 102, and/or the functionality of message processor 158 may be implemented as part of any other element of device 140.

In some demonstrative embodiments, at least part of the functionality of controller 124 and/or message processor 128 may be implemented by an integrated circuit, for example, a chip, e.g., a System on Chip (SoC). In one example, the chip or SoC may be configured to perform one or more functionalities of radio 114. For example, the chip or SoC may include one or more elements of controller 124, one or more elements of message processor 128, and/or one or more elements of radio 114. In one example, controller 124, message processor 128, and radio 114 may be implemented as part of the chip or SoC.

In other embodiments, controller 124, message processor 128 and/or radio 114 may be implemented by one or more additional or alternative elements of device 102.

In some demonstrative embodiments, at least part of the functionality of controller 154 and/or message processor 158 may be implemented by an integrated circuit, for example, a chip, e.g., a System on Chip (SoC). In one example, the chip or SoC may be configured to perform one or more functionalities of radio 144. For example, the chip or SoC may include one or more elements of controller 154, one or more elements of message processor 158, and/or one or more elements of radio 144. In one example, controller 154, message processor 158, and radio 144 may be implemented as part of the chip or SoC.

In other embodiments, controller 154, message processor 158 and/or radio 144 may be implemented by one or more additional or alternative elements of device 140.

In some demonstrative embodiments, device 102 and/or device 140 may include, operate as, perform the role of, and/or perform one or more functionalities of, one or more STAs. For example, device 102 may include at least one STA, and/or device 140 may include at least one STA.

In some demonstrative embodiments, device 102 and/or device 140 may include, operate as, perform the role of, and/or perform one or more functionalities of, one or more DMG STAs. For example, device 102 may include, operate as, perform the role of, and/or perform one or more functionalities of, at least one DMG STA, and/or device 140 may include, operate as, perform the role of, and/or perform one or more functionalities of, at least one DMG STA.

In other embodiments, devices 102 and/or 140 may include, operate as, perform the role of, and/or perform one or more functionalities of, any other wireless device and/or station, e.g., a WLAN STA, a WiFi STA, and the like.

In some demonstrative embodiments, device 102 and/or device 140 may be configured operate as, perform the role of, and/or perform one or more functionalities of, an access point (AP), e.g., a DMG AP, and/or a personal basic service set (PBSS) control point (PCP), e.g., a DMG PCP, for example, an AP/PCP STA, e.g., a DMG AP/PCP STA.

In some demonstrative embodiments, device 102 and/or device 140 may be configured to operate as, perform the role of, and/or perform one or more functionalities of, a non-AP STA, e.g., a DMG non-AP STA, and/or a non-PCP STA, e.g., a DMG non-PCP STA, for example, a non-AP/PCP STA, e.g., a DMG non-AP/PCP STA.

In other embodiments, device 102 and/or device 140 may operate as, perform the role of, and/or perform one or more functionalities of, any other additional or alternative device and/or station.

In one example, a station (STA) may include a logical entity that is a singly addressable instance of a MAC and PHY interface to the wireless medium (WM). The STA may perform any other additional or alternative functionality.

In one example, an AP may include an entity that contains a station (STA), e.g., one STA, and provides access to distribution services, via the wireless medium (WM) for associated STAs. The AP may perform any other additional or alternative functionality.

In one example, a personal basic service set (PBSS) control point (PCP) may include an entity that contains a STA, e.g., one station (STA), and coordinates access to the wireless medium (WM) by STAs that are members of a PBSS. The PCP may perform any other additional or alternative functionality.

In one example, a PBSS may include a directional multi-gigabit (DMG) basic service set (BSS) that includes, for example, one PBSS control point (PCP). For example, access to a distribution system (DS) may not be present, but, for example, an intra-PBSS forwarding service may optionally be present.

In one example, a PCP/AP STA may include a station (STA) that is at least one of a PCP or an AP. The PCP/AP STA may perform any other additional or alternative functionality.

In one example, a non-AP STA may include a STA that is not contained within an AP. The non-AP STA may perform any other additional or alternative functionality.

In one example, a non-PCP STA may include a STA that is not a PCP. The non-PCP STA may perform any other additional or alternative functionality.

In one example, a non PCP/AP STA may include a STA that is not a PCP and that is not an AP. The non-PCP/AP STA may perform any other additional or alternative functionality.

In some demonstrative embodiments devices 102 and/or 140 may be configured to communicate over a Next Generation 60 GHz (NG60) network, an Enhanced DMG (EDMG) network, and/or any other network. For example, devices 102 and/or 140 may perform Multiple-Input-Multiple-Output (MIMO) communication, for example, for communicating over the NG60 and/or EDMG networks, e.g., over an NG60 or an EDMG frequency band.

In some demonstrative embodiments, devices 102 and/or 140 may be configured to operate in accordance with one or more Specifications, for example, including one or more IEEE 802.11 Specifications, e.g., an IEEE 802.11-2016 Specification, an IEEE 802.11ay Specification, and/or any other specification and/or protocol.

Some demonstrative embodiments may be implemented, for example, as part of a new standard in an mmWave band, e.g., a 60 GHz frequency band or any other directional band, for example, as an evolution of an IEEE 802.11-2016 Specification and/or an IEEE 802.11ad Specification.

In some demonstrative embodiments, devices 102 and/or 140 may be configured according to one or more standards, for example, in accordance with an IEEE 802.11ay Standard, which may be, for example, configured to enhance the efficiency and/or performance of an IEEE 802.11ad Specification, which may be configured to provide Wi-Fi connectivity in a 60 GHz band.

Some demonstrative embodiments may enable, for example, to significantly increase the data transmission rates defined in the IEEE 802.11ad Specification, for example, from 7 Gigabit per second (Gbps), e.g., up to 30 Gbps, or to any other data rate, which may, for example, satisfy growing demand in network capacity for new coming applications.

Some demonstrative embodiments may be implemented, for example, to allow increasing a transmission data rate, for example, by applying MIMO and/or channel bonding techniques.

In some demonstrative embodiments, devices 102 and/or 140 may be configured to communicate MIMO communications over the mmWave wireless communication band.

In some demonstrative embodiments, device 102 and/or device 140 may be configured to support one or more mechanisms and/or features, for example, channel bonding, Single User (SU) MIMO, and/or Multi-User (MU) MIMO, for example, in accordance with an IEEE 802.1 lay Standard and/or any other standard and/or protocol.

In some demonstrative embodiments, device 102 and/or device 140 may include, operate as, perform a role of, and/or perform the functionality of, one or more EDMG STAs. For example, device 102 may include, operate as, perform a role of, and/or perform the functionality of, at least one EDMG STA, and/or device 140 may include, operate as, perform a role of, and/or perform the functionality of, at least one EDMG STA.

In some demonstrative embodiments, devices 102 and/or 140 may implement a communication scheme, which may include PHY and/or MAC layer schemes, for example, to support one or more applications, and/or increased transmission data rates, e.g., data rates of up to 30 Gbps, or any other data rate.

In some demonstrative embodiments, the PHY and/or MAC layer schemes may be configured to support frequency channel bonding over an mmWave band, e.g., over a 60 GHz band, SU MIMO techniques, and/or MU MIMO techniques.

In some demonstrative embodiments, devices 102 and/or 140 may be configured to implement one or more mechanisms, which may be configured to enable SU and/or MU communication of Downlink (DL) and/or Uplink frames (UL) using a MIMO scheme.

In some demonstrative embodiments, device 102 and/or device 140 may be configured to implement one or more MU communication mechanisms. For example, devices 102 and/or 140 may be configured to implement one or more MU mechanisms, which may be configured to enable MU communication of DL frames using a MIMO scheme, for example, between a device, e.g., device 102, and a plurality of devices, e.g., including device 140 and/or one or more other devices.

In some demonstrative embodiments, devices 102 and/or 140 may be configured to communicate over an NG60 network, an EDMG network, and/or any other network and/or any other frequency band. For example, devices 102 and/or 140 may be configured to communicate DL MIMO transmissions and/or UL MIMO transmissions, for example, for communicating over the NG60 and/or EDMG networks.

Some wireless communication Specifications, for example, the IEEE 802.11ad-2012 Specification, may be configured to support a SU system, in which a STA may transmit frames to a single STA at a time. Such Specifications may not be able, for example, to support a STA transmitting to multiple STAs simultaneously, for example, using a MU-MIMO scheme, e.g., a DL MU-MIMO, or any other MU scheme.

In some demonstrative embodiments, devices 102 and/or 140 may be configured to communicate over a channel bandwidth, e.g., of at least 2.16 GHz, in a frequency band above 45 GHz.

In some demonstrative embodiments, devices 102 and/or 140 may be configured to implement one or more mechanisms, which may, for example, enable to extend a single-channel BW scheme, e.g., a scheme in accordance with the IEEE 802.11ad Specification or any other scheme, for higher data rates and/or increased capabilities, e.g., as described below.

In one example, the single-channel BW scheme may include communication over a 2.16 GHz channel (also referred to as a "single-channel" or a "DMG channel").

In some demonstrative embodiments, devices 102 and/or 140 may be configured to implement one or more channel bonding mechanisms, which may, for example, support communication over a channel BW (also referred to as a "wide channel", an "EDMG channel", or a "bonded channel") including two or more channels, e.g., two or more 2.16 GHz channels, e.g., as described below.

In some demonstrative embodiments, the channel bonding mechanisms may include, for example, a mechanism and/or an operation whereby two or more channels, e.g., 2.16 GHz channels, can be combined, e.g., for a higher bandwidth of packet transmission, for example, to enable achieving higher data rates, e.g., when compared to transmissions over a single channel. Some demonstrative embodiments are described herein with respect to communication over a channel BW including two or more 2.16 GHz channels, however other embodiments may be implemented with respect to communications over a channel bandwidth, e.g., a "wide" channel, including or formed by any other number of two or more channels, for example, an aggregated channel including an aggregation of two or more channels.

In some demonstrative embodiments, device 102 and/or device 140 may be configured to implement one or more channel bonding mechanisms, which may, for example, support an increased channel bandwidth, for example, a channel BW of 4.32 GHz, a channel BW of 6.48 GHz, a channel BW of 8.64 GHz, and/or any other additional or alternative channel BW, e.g., as described below.

In some demonstrative embodiments, device 102 and/or device 140 may be configured to implement one or more channel bonding mechanisms, which may, for example, support an increased channel bandwidth, for example, a channel BW of 4.32 GHz, e.g., including two 2.16 Ghz channels according to a channel bonding factor of two, a channel BW of 6.48 GHz, e.g., including three 2.16 Ghz channels according to a channel bonding factor of three, a channel BW of 8.64 GHz, e.g., including four 2.16 Ghz channels according to a channel bonding factor of four, and/or any other additional or alternative channel BW, e.g., including any other number of 2.16 Ghz channels and/or according to any other channel bonding factor.

In some demonstrative embodiments, device 102 and/or device 140 may be configured to communicate one or more transmissions over one or more channel BWs, for example, including a channel BW of 2.16 GHz, a channel BW of 4.32 GHz, a channel BW of 6.48 GHz, a channel BW of 8.64 GHz and/or any other channel BW.

In some demonstrative embodiments, introduction of MIMO may be based, for example, on implementing robust transmission modes and/or enhancing the reliability of data transmission, e.g., rather than the transmission rate, compared to a Single Input Single Output (SISO) case. For example, one or more Space Time Block Coding (STBC) schemes utilizing a space-time channel diversity property may be implemented to achieve one or more enhancements for the MIMO transmission.

In some demonstrative embodiments, devices 102 and/or 140 may be configured to generate, process, transmit and/or receive a PHY Protocol Data Unit (PPDU) having a PPDU format (also referred to as "EDMG PPDU format"), which may be configured, for example, for communication between EDMG stations, e.g., as described below.

In some demonstrative embodiments, a PPDU, e.g., an EDMG PPDU, may include at least one non-EDMG fields, e.g., a legacy field, which may be identified, decodable, and/or processed by one or more devices ("non-EDMG devices", or "legacy devices"), which may not support one or more features and/or mechanisms ("non-legacy" mechanisms or "EDMG mechanisms"). For example, the legacy devices may include non-EDMG stations, which may be, for example, configured according to an IEEE 802.11-2016

Standard, and the like. For example, a non-EDMG station may include a DMG station, which is not an EDMG station.

Figure 2:
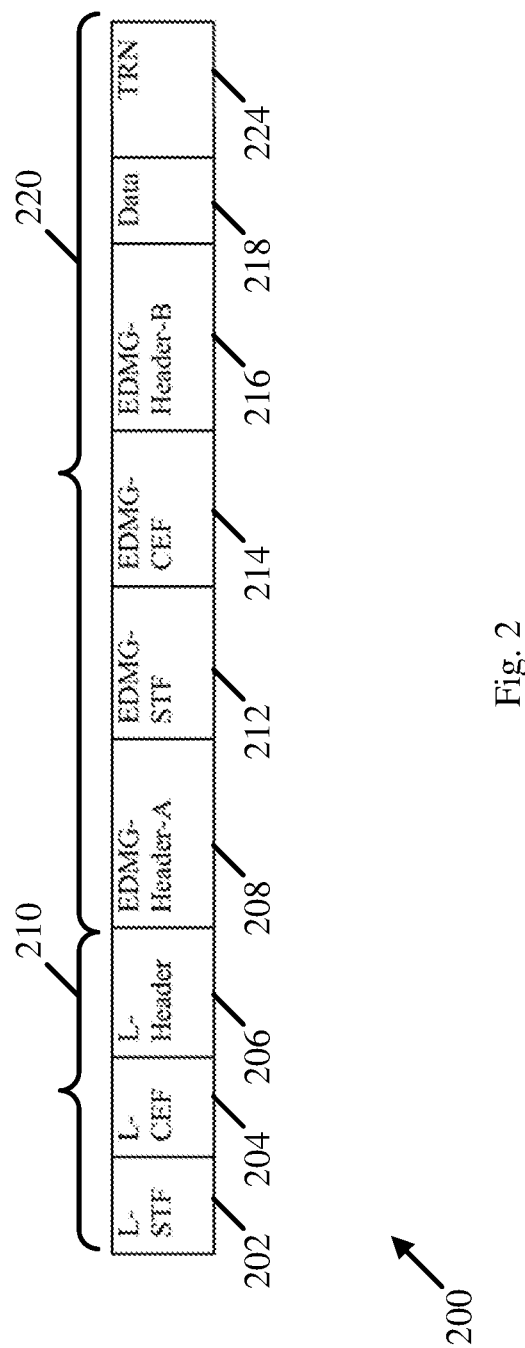
FIG. 2 is a schematic illustration of an Enhanced Directional Multi-Gigabit (EDMG) Physical Layer Protocol Data Unit (PPDU) format, which may be implemented in accordance with some demonstrative embodiments.

Reference is made to FIG. 2, which schematically illustrates an EDMG PPDU format 200, which may be implemented in accordance with some demonstrative embodiments. In one example, devices 102 (FIG. 1) and/or 140 (FIG. 1) may be configured to generate, transmit, receive and/or process one or more EDMG PPDUs having the structure and/or format of EDMG PPDU 200.

In one example, devices 102 (FIG. 1) and/or 140 (FIG. 1) may communicate EDMG PPDU 200, for example, as part of a transmission over a channel, e.g., an EDMG channel, having a channel bandwidth including one or more 2.16 GHz channels, e.g., as described below.

In some demonstrative embodiments, as shown in FIG. 2, EDMG PPDU 200 may include a non-EDMG portion 210 ("legacy portion"), e.g., as described below.

In some demonstrative embodiments, as shown in FIG. 2, non-EDMG portion 210 may include a non-EDMG (legacy) Short Training Field (STF) (L-STF) 202, a non-EDMG (Legacy) Channel Estimation Field (CEF) (L-CEF) 204, and/or a non-EDMG header (L-header) 206.

In some demonstrative embodiments, as shown in FIG. 2, EDMG PPDU 200, may include an EDMG portion 220, for example, following non-EDMG portion 210, e.g., as described below.

In some demonstrative embodiments, as shown in FIG. 2, EDMG portion 220 may include a first EDMG header, e.g., an EDMG-Header-A 208, an EDMG-STF 212, an EDMG-CEF 214, a second EDMG header, e.g., an EDMG-Header-B 216, a Data field 218, and/or one or more beamforming training fields, e.g., a training (TRN) field 224.

In some demonstrative embodiments, EDMG portion 220 may include some or all of the fields shown in FIG. 2 and/or one or more other additional or alternative fields.

In some demonstrative embodiments, Header B field 216 may be included, for example, in EDMG MU PPDUs, for example, on a per STA basis.

In some demonstrative embodiments, Header B field 216 corresponding to a STA addressed by the EDMG MU PPDU may include, for example, information relating to a transmission of a data unit, for example, a PHY Service Data Unit (PSDU) to the STA.

In some demonstrative embodiments, EDMG Header B field 216 may include for example, 64 bits, e.g., as described below. In other embodiments, the EDMG Header B field 216 may include any other number of bits.

In one example, EDMG Header B field 216 corresponding to the STA may include, for example, at least a scrambler seed field, a PSDU length field, e.g., to indicate a length of the PSDU to the STA, and/or one or more Modulation and Coding Scheme (MCS) fields to indicate one or more MCSs. For example, the Header B field may include first and second MCS fields to indicate MCSs for first and second respective spatial streams.

In other embodiments, EDMG Header B field 216 may include any other additional or alternative fields and/or information.

Referring back to FIG. 1, in some demonstrative embodiments, devices 102 and/or 140 may be configured to generate, transmit, receive and/or process one or more transmissions, e.g., including one or more EDMG PPDUs, e.g., as described below.

In some demonstrative embodiments, for example, devices 102 and/or 140 may be configured to perform one or more operations, and/or functionalities of EDMG STA, which may be configured, for example, to generate, transmit, receive and/or process one or more transmissions, e.g., including one or more EDMG PPDUs, e.g., including one or more fields, e.g., some or all of the fields, according to the EDMG PPDU format of FIG. 2.

In some demonstrative embodiments, devices 102 and/or 140 may be configured to generate, transmit, receive and/or process one or more transmissions of PPDUs, for example, EDMG PPDUs, for example, Single Carrier (SC) PHY PPDUs and/or Orthogonal Frequency Divisional Multiplexing (OFDM) PPDUs, e.g., in accordance with an IEEE 802.11ay Specification and/or any other specification.

In some demonstrative embodiments, devices 102 and/or 140 may be configured to generate, transmit, receive and/or process one or more transmissions of SC PHY PPDUs, for example, EDMG SC PHY PPDUs, for example, according to an EDMG transmission mode for SC PHY, e.g., as described below.

In some demonstrative embodiments, devices 102 and/or 140 may be configured to generate, transmit, receive and/or process one or more transmissions of OFDM PPDUs, for example, EDMG OFDM PPDUs, for example, according to an EDMG transmission mode for OFDM PHY, e.g., as described below.

In some demonstrative embodiments, devices 102 and/or 140 may be configured to generate, transmit, receive and/or process one or more transmissions of the SC PHY PPDUs, for example, according to a transmission mode, which may be configured to support transmission of SC PHY PPDUs over a 2.16 GHz bandwidth, a 4.32 GHz bandwidth, a 6.48 GHz bandwidth, a 8.64 GHz bandwidth, and/or any other bandwidth, for example, using single or multiple space-time streams and/or single or multiple transmit chains and/or antennas.

In some demonstrative embodiments, devices 102 and/or 140 may be configured to generate, transmit, receive and/or process one or more transmissions of the OFDM PPDUs, for example, according to a transmission mode, which may be configured to support transmission of OFDM PPDUs over a 2.16 GHz bandwidth, a 4.32 GHz bandwidth, a 6.48 GHz bandwidth, a 8.64 GHz bandwidth, and/or any other bandwidth, for example, using single or multiple space-time streams and/or single or multiple transmit chains and/or antennas.

In some demonstrative embodiments, devices 102 and/or 140 may be configured to implement one or more operations to support and/or enable SC transmission of an EDMG PPDU, for example, an EDMG SC PHY PPDU for SC PHY, e.g., in accordance with an IEEE 802.11ay Specification, e.g., as described below.

In some demonstrative embodiments, devices 102 and/or 140 may be configured to implement one or more operations to support and/or enable OFDM transmission of an EDMG PPDU, for example, an EDMG OFDM PPDU for OFDM PHY, e.g., in accordance with an IEEE 802.11ay Specification, e.g., as described below.

In some demonstrative embodiments, devices 102 and/or 140 may be configured to implement one or more operations to support and/or enable SC transmission of an EDMG PPDU, for example, according to a SC PHY EDMG PPDU transmission mode, which may be configured to support a SU transmission mode and/or a MU transmission mode, e.g., as described below.

In some demonstrative embodiments, devices 102 and/or 140 may be configured to generate, transmit, receive and/or process one or more transmissions of an EDMG SC PHY PPDU, for example, using a SU mode or a MU mode, for example, with different types of spatial mapping, e.g., as described below.

In some demonstrative embodiments, controller 124 may be configured to cause, trigger, and/or control the wireless station implemented by device 102, e.g., an EDMG STA, to encode a PSDU of at least one user in an EDMG PPDU, for example, according to an EDMG Low-Density Parity-Check (LDPC) encoding scheme, e.g., as described below.

In some demonstrative embodiments, the EDMG LDPC encoding scheme may be based, for example, at least on a count of one or more spatial streams for transmission to the user, e.g., as described below.

In some demonstrative embodiments, controller 124 may be configured to cause, trigger, and/or control the wireless station implemented by device 102 to transmit the EDMG PPDU in a transmission over a channel bandwidth in a frequency band above 45 GHz, e.g., as described below.

In some demonstrative embodiments, the EDMG PPDU may include, for example, a SC PPDU, and the transmission may include, for example, a SC transmission, e.g., as described below.

In some demonstrative embodiments, the EDMG PPDU may include, for example, an OFDM PPDU, and the transmission may include, for example, an OFDM transmission, e.g., as described below.

In some demonstrative embodiments, controller 124 may be configured to cause, trigger, and/or control the wireless station implemented by device 102 to encode the PSDU of the user according to a count of data pad zero bits for the user, e.g., as described below.

In some demonstrative embodiments, the count of data pad zero bits for the user may be based on a number of LDPC codewords for the user over the one or more spatial streams, e.g., as described below.

In some demonstrative embodiments, controller 124 may be configured to cause, trigger, and/or control the wireless station implemented by device 102 to generate scrambled PSDU bits for the user, for example, based on the PSDU for the user and the data pad zero bits for the user, e.g., as described below.

In some demonstrative embodiments, controller 124 may be configured to cause, trigger, and/or control the wireless station implemented by device 102 to generate an LDPC coded bit stream for the user, for example, based on the scrambled PSDU bits for the user, e.g., as described below.

In some demonstrative embodiments, controller 124 may be configured to cause, trigger, and/or control the wireless station implemented by device 102 to concatenate the LDPC coded bit stream for the user with coded pad zero bits for the user, for example, to provide an integer number of symbols, e.g., as described below.

In some demonstrative embodiments, a count of the coded pad zero bits for the user may be based on a count of symbols for the user, e.g., as described below.

In some demonstrative embodiments, controller 124 may be configured to cause, trigger, and/or control the wireless station implemented by device 102 to determine the count of symbols for the user, for example, based on a count of coded bits per symbol for the user and a spatial stream of the one or more spatial streams, e.g., as described below.

In some demonstrative embodiments, controller 124 may be configured to cause, trigger, and/or control the wireless station implemented by device 102 to convert the scrambled PSDU for the user into a plurality of LDPC codewords, for example, according to a codeword length and a code rate, e.g., as described below.

In some demonstrative embodiments, controller 124 may be configured to cause, trigger, and/or control the wireless station implemented by device 102 to generate the LDPC coded bit stream, for example, by concatenating the plurality of LDPC codewords, e.g., as described below.

In some demonstrative embodiments, the codeword length may be 672, 1344, 624, or 1248, e.g., as described below.

In other embodiments, any other codeword length may be used.

In some demonstrative embodiments, the code rate may be 7/8, e.g., as described below.

In other embodiments, any other code rate may be used.

In some demonstrative embodiments, controller 124 may be configured to cause, trigger, and/or control the wireless station implemented by device 102 to encode the PSDU for the user into an encoded data field over a plurality of spatial streams for the user, for example, such that the encoded data field has a same length, e.g., in each of the plurality of spatial streams, e.g., as described below.

In some demonstrative embodiments, controller 124 may be configured to cause, trigger, and/or control the wireless station implemented by device 102 to map the one or more spatial streams for the user to one or more space-time streams, e.g., as described below.

In some demonstrative embodiments, the EDMG PPDU may include an EDMG SU PPDU, e.g., as described below.

In some demonstrative embodiments, the EDMG PPDU may include an EDMG MU PPDU, for example, including a plurality of user PPDUs to a respective plurality of users, e.g., as described below.

In some demonstrative embodiments, controller 124 may be configured to cause, trigger, and/or control the wireless station implemented by device 102 to align all of the plurality of user PPDUs, for example, in time, e.g., as described below.

In some demonstrative embodiments, controller 124 may be configured to cause, trigger, and/or control the wireless station implemented by device 102 to align the user PPDUs, for example, by padding one or more PSDUs in the MU PPDU, e.g., as described below.

In some demonstrative embodiments, controller 124 may be configured to cause, trigger, and/or control the wireless station implemented by device 102 to, for example, when the EDMG PPDU includes a SC PPDU, determine a maximum number of SC symbol blocks over all users, and determine a count of pad SC symbol blocks for the user, for example, based on the maximum number of SC symbol blocks and a count of SC symbol blocks for the user, e.g., as described below.

In some demonstrative embodiments, controller 124 may be configured to cause, trigger, and/or control the wireless station implemented by device 102 to determine the count of pad SC symbol blocks for the user, for example, by subtracting from the maximum number of SC symbol blocks the count of SC symbol blocks for the user, e.g., as described below.

In other embodiments, any other additional or alternative calculations and/or operations may be implemented to the count of pad SC symbol blocks for the user.

In some demonstrative embodiments, controller 124 may be configured to cause, trigger, and/or control the wireless station implemented by device 102 to update a number of coded pad zero bits for the user, for example, based on an updated count of SC symbol blocks for the user which is equal, for example, to the maximum number of SC symbol blocks, e.g., as described below.

In other embodiments, any other additional or alternative calculations and/or operations may be implemented to encode and/or align the user PPDUs in an OFDM PPDU.

In some demonstrative embodiments, controller 124 may be configured to cause, trigger, and/or control the wireless station implemented by device 102 to, for example, when the EDMG PPDU includes an OFDM PPDU, determine a maximum number of OFDM symbols over all users, and determine a count of pad OFDM symbols for the user, for example, based on the maximum number of OFDM symbols and a count of OFDM symbols for the user, e.g., as described below.

In some demonstrative embodiments, controller 124 may be configured to cause, trigger, and/or control the wireless station implemented by device 102 to determine the count of pad OFDM symbols for the user, for example, by subtracting from the maximum number of OFDM symbols the count of OFDM symbols for the user, e.g., as described below.

In some demonstrative embodiments, controller 124 may be configured to cause, trigger, and/or control the wireless station implemented by device 102 to update a number of coded pad zero bits for the user based on an updated count of OFDM symbols for the user, for example, which may be equal to the maximum number of OFDM symbols, e.g., as described below.

In other embodiments, any other additional or alternative calculations and/or operations may be implemented to the count of pad OFDM symbols for the user.

In other embodiments, any other additional or alternative calculations and/or operations may be implemented to encode and/or align the user PPDUs in an OFDM PPDU.

In some demonstrative embodiments, encoding and/or transmission of the EDMG SC PHY PPDU may be defined and/or performed based on one or more of the following parameters, and/or one or more additional or alternative parameters, e.g., as described below:

TABLE 1

| Symbol | Explanation |
|---|---|
| $i_{SS}$ | Spatial stream number or index |
| $N_{SS\ i_{user}}$ | Total number of spatial streams for $i_{user}$-th user |
| $i_{user}$ | User number or index |
| $N_{user}$ | Total number of users |
| $i_{STS\ i_{user}}$ | Space-time stream number for $i_{user}$-th user |
| $N_{STS\ i_{user}}$ | Total number of space-time streams for $i_{user}$-th user |
| $i_{STS}$ | Space-time stream number over all users |
| $N_{STS}$ | Total number of space-time streams over all users |
| $Length_{i_{user}}$ | PSDU length in octets for $i_{user}$-th user |
| $L_{CW}$ | LDPC codeword length in bits, it can be equal to 624, 672, 1248, and 1344, or any other value |
| $L_{CWD}$ | Number of systematic data bits per LDPC codeword |
| $L_{CWP}$ | Number of parity bits per LDPC codeword |
| $\rho_{i_{user}}$ | Repetition factor for $i_{user}$-th user, it can be equal to 2 for MCS 1 and equal to 1 for all other MCSs, or any other value |
| $\rho_{i_{user}\ i_{SS}}$ | Repetition factor for $i_{user}$-th user user and $i_{SS}$-th spatial stream, it can be equal to 2 for MCS 1 and equal to 1 for all other MCSs, or any other value |
| $R_{i_{user}\ i_{SS}}$ | LDPC code rate for $i_{user}$-th user and $i_{SS}$-th spatial stream, it can be equal to 1/2, 5/8, 3/4, 13/16, 7/8, or any other value |
| $N_{CW\ i_{user}}$ | Total number of LDPC codewords for $i_{user}$-th user |
| $N_{CW\ i_{user}\ i_{SS}}$ | Total number of LDPC codewords for $i_{user}$-th user and $i_{SS}$-th spatial stream |
| $N_{DATA\_PAD i_{user}}$ | Number of pad bits for $i_{user}$-th user to get integer number of LDPC codewords |
| $N_{BLKS\ i_{user}}$ | Total number of SC symbol blocks for $i_{user}$-th user |
| $N_{BLKSmin}$ | Minimum number of total SC symbol blocks for BRP PPDU transmission |
| $N_{BLK\_PAD\ i_{user}}$ | Number of pad bits for $i_{user}$-th user to get integer number of SC symbol blocks |
| $N_{BLK\_PAD\ i_{user}\ i_{SS}}$ | Number of pad bits for $i_{user}$-th user and $i_{SS}$-th spatial stream to get integer number of SC symbol blocks |
| $N_{CB}$ | Number of contiguous 2.16 GHz channels used for PPDU transmission |
| $N_{CBPB\ i_{user}}$ | Number of coded bits per SC symbol block for $i_{user}$-th user, depends, for example, on modulation type and different for different GI types |
| $N_{CBPS\ i_{user}\ i_{SS}}$ | Number of coded bits per symbol (constellation point) for $i_{user}$-th user and $i_{SS}$-th spatial stream |
| $Ng_{i_{user}\ i_{SS}}$ | Number of bits in the group for $i_{user}$-th user and $i_{SS}$-th spatial stream in the round robin distribution procedure |
| $N_{SPB}$ | Number of symbols (constellation points) per SC symbol block, depends, for example, on the GI type |
| $N_{user}$ | Total number of users in multi user transmission |
| $N_{BLKS\ max}$ | Maximum number of SC symbol blocks over all users |
| $N_{PAD\_BLKS\ i_{user}}$ | The number of pad Sc symbol blocks for $i_{user}$-th user required to align PPDUs over different users in time |

In some demonstrative embodiments, some or all of the parameters of Table 1 may be implemented, one or more parameters may be defined in a different manner, and/or one or more additional or alternative parameters may be implemented.

In some demonstrative embodiments, devices 102 and/or 140 may include, operate as, and/or perform a role of, one or more EDMG STAs, which may be configured to support the transmission of two or more spatial streams using SC modulation, e.g., in the form of a MIMO transmission.

In some demonstrative embodiments, devices 102 and/or 140 may be configured to generate, encode, transmit, receive, decode and/or process EDMG SC PPDUs, for example, according to an encoding procedure for EDMG SC PPDUs, which may be configured, for example, for multi-stream transmission, for example, to support one or both of a SU case and a MU case, e.g., as described below.

In some demonstrative embodiments, devices 102 and/or 140 may be configured to generate, encode, transmit, receive, decode and/or process EDMG SC PPDUs, for example, according to a procedure to spoof legacy devices, for example, non-EDMG STAs, e.g., DMG STAs, for example, when transmitting an EDMG SC MU PPDU, e.g., as described below.

In some demonstrative embodiments, devices 102 and/or 140 may be configured to generate, encode, transmit, receive, decode, and/or process EDMG SC PPDUs, for example, according to an encoding procedure for EDMG SC PPDUs, which may be configured, for example, for multiple spatial stream transmission in a SU case, e.g., as described below.

In some demonstrative embodiments, devices 102 and/or 140 may be configured to generate, encode, transmit, receive, decode, and/or process EDMG SC PPDUs, for example, according to an encoding procedure for EDMG SC MU PPDUs, e.g., as an extension of the encoding procedure for SU, which may be configured, for example, for multiple spatial stream transmission in a MU case, e.g., as described below.

In some demonstrative embodiments, devices 102 and/or 140 may be configured to generate, encode, transmit, receive, decode and/or process EDMG SC PPDUs, for example, according to a procedure to support signaling to a user of a SC MU PPDU, e.g., to each user, of a number of padding blocks present in the EDMG SC MU PPDU, e.g., for the user, e.g., as described below.

In some demonstrative embodiments, devices 102 and/or 140 may be configured to generate, encode, transmit, receive, decode and/or process EDMG SC PPDUs, for example, according to a procedure to support spoofing of legacy devices, e.g., non-EDMG STAs, for example, when transmitting an EDMG SC MU PPDU, for example, with respect to a spoofed length of the EDMG SC MU PPDU, e.g., as described below.

In some demonstrative embodiments, devices 102 and/or 140 may be configured to generate, encode, transmit, receive, decode and/or process EDMG SC PPDUs, for example, according to an encoding procedure, which may support, for example, encoding for multi-stream EDMG PPDUs, which may make use of a SC modulation, e.g., as described below.

In some demonstrative embodiments, devices 102 and/or 140 may be configured to generate, encode, transmit, receive, decode and/or process EDMG SC PPDUs, for example, according to an encoding procedure, which may include, for example, padding a data field of a PPDU, for example, together with and/or as part of an LDPC encoding process, e.g., as described below.

In some demonstrative embodiments, devices 102 and/or 140 may be configured to generate, encode, transmit, receive, decode and/or process EDMG SC PPDUs, for example, according to an encoding procedure, which may encode a SC PHY EDMG PSDU, for example, a SC PHY EDMG SU PSDU or a SC PHY EDMG MU PSDU, for example, per user basis, e.g., with a single stream or multi-stream transmission per user, e.g., as described below.

In some demonstrative embodiments, devices 102 and/or 140 may be configured to generate, encode, transmit, receive, decode and/or process EDMG SC PPDUs, for example, according to an EDMG LDPC encoding procedure, for example, on a per $i_{user}$-th user basis, e.g., as described below.

In some demonstrative embodiments, the EDMG LDPC encoding procedure may include, for example, determining a number of data pad bits corresponding to the $i_{user}$-th user, for example, based at least on a number of LDPC codewords for the $i_{user}$-th user, a number of spatial streams for the $i_{user}$-th user, and/or a number of LDPC codewords per spatial stream for the $i_{user}$, e.g., as described below.

In some demonstrative embodiments, the EDMG LDPC encoding procedure may include, for example, concatenating a PSDU of the $i_{user}$-th user with a plurality of zero bits, for example, based on the number of data pad bits, e.g., as described below.

In some demonstrative embodiments, the EDMG LDPC encoding procedure may include, for example, generating scrambled PSDU data bits, for example, based on the PSDU and the zero bits, e.g., as described below.

In some demonstrative embodiments, the EDMG LDPC encoding procedure may include, for example, distributing the PSDU scrambled bits over a number of spatial streams for the $i_{user}$-th user, e.g., as described below.

In some demonstrative embodiments, the EDMG LDPC encoding procedure may include, for example, converting the scrambled PSDU data bits of a spatial stream, e.g., for each spatial stream, into a plurality of LDPC codewords, for example, based at least on a repetition factor, a codeword length, a code rate and/or one or more additional or alternative parameters, e.g., as described below.

In some demonstrative embodiments, the EDMG LDPC encoding procedure may include, for example, generating a coded bits stream for the $i_{user}$-th user based on the LDPC codewords, e.g., per spatial stream, for examples, by concatenating the LDPC codewords, e.g., as described below.

In some demonstrative embodiments, the EDMG LDPC encoding procedure may include, for example, determining a number of coded pad bits for the $i_{user}$-th user, e.g., per spatial stream, for example, based at least on the number of SC symbol blocks for the $i_{user}$-th user, e.g., as described below.

In some demonstrative embodiments, the EDMG LDPC encoding procedure may include, for example, concatenating the coded bits stream for the $i_{user}$-th user, e.g., per spatial stream, with a plurality of zero bits, e.g., according to the number of coded pad bits for the $i_{user}$-th user, e.g., as described below.

In some demonstrative embodiments, the EDMG LDPC encoding procedure may include, for example, mapping the spatial stream for the $i_{user}$-th user to one or more space-time streams, e.g., as described below.

In some demonstrative embodiments, devices 102 and/or 140 may be configured to generate, encode, transmit, receive, decode and/or process EDMG SC PPDUs, for example, according to an encoding procedure, which may include one or more, e.g., some or all, of the operations described below, for example, for a user, e.g., one user (denoted by the $i_{user}$-th user).

In some demonstrative embodiments, devices 102 and/or 140 may be configured to implement one or more operations of an Algorithm for encoding the PSDU for the $i_{user}$-th user, e.g., as follows:

a) Compute a number of data pad bits $N_{DATA\_PAD_{i_{user}}}$ for example, using a number of LDPC codewords per $i_{SS}$-th spatial stream $N_{CW\ i_{user}i_{SS}}$, e.g., as follows:

$$N_{CW_{i_{user}i_{SS}}} = \left\lceil \frac{Length_{i_{user}} \cdot 8}{\sum_{i_{SS}=1}^{N_{SS_{i_{user}}}} N_{CBPS_{i_{user}i_{SS}}} \cdot \frac{L_{CW}}{\rho_{i_{user}i_{SS}}} \cdot R_{i_{user}i_{SS}}} \right\rceil \cdot N_{CBPS_{i_{user}i_{SS}}} \quad (1)$$

$$N_{DATA\_PAD_{i_{user}}} = \sum_{i_{SS}=1}^{N_{SS}} N_{CW_{i_{user}i_{SS}}} \cdot \frac{L_{CW}}{\rho_{i_{user}i_{SS}}} \cdot R_{i_{user}i_{SS}} - Length_{i_{user}} \cdot 8 \quad$$

The scrambled PSDU is concatenated with $N_{DATA\_PAD_{i_{user}}}$ zero bits. They are scrambled using a continuation of the scrambler sequence that scrambled the PSDU input bits. For example, all spatial streams may use an LDPC codeword of a same length.

In other embodiments, the number of data pad bits may be determined according to any other additional or alternative operations and/or parameters.

b) Distribute the PSDU scrambled bits over $N_{SS_{i_{user}}}$ spatial streams. Bits distribution is performed on the group basis with a number of bits in a group, e.g., as follows:

$$Ng_{i_{user}i_{SS}} = (N_{CBPS_{i_{user}i_{SS}}} \times R_{i_{user}i_{SS}} \times 16)/\rho_{i_{user}i_{SS}} \quad (2)$$

The first group of bits comes to the first stream, the second group of bits comes to the second stream and so on. The procedure is repeated when the maximum number of spatial streams $N_{SS_{i_{user}}}$ is reached.

In other embodiments, the PSDU scrambled bits may be distributed according to any other additional or alternative operations and/or parameters.

c) For each spatial stream convert the scrambled PSDU bits to LDPC codewords, e.g., in accordance with sub-clause 30.5.6.3.3 step b of an IEEE 802.11ay Specification or any other LDPC scheme.

In other embodiments, the LDPC codewords may be determined according to any other additional or alternative operations and/or parameters.

d) For each spatial stream, concatenate LDPC codewords one after the other to create a coded bits stream, e.g., as follows:

$$\left( c_{i_{SS}}^{(1)}, c_{i_{SS}}^{(2)}, \ldots, c_{i_{SS}}^{(N_{CW\ i_{user}i_{SS}})} \right), i_{SS} = 1, 2, \ldots, N_{SS_{i_{user}}} \quad (3)$$

e) Compute the number of coded pad bits per $i_{SS}$-th spatial stream, $N_{BLK\_PAD_{i_{user}i_{SS}}}$ using the number of SC symbol blocks, $N_{BLKS_{i_{user}}}$, e.g., as follows:

$$N_{BLKS_{i_{user}}} = \left\lceil \frac{N_{CW_{i_{user}i_{SS}}} \cdot L_{CW}}{N_{CB} \cdot N_{SPB} \cdot N_{CBPS_{i_{user}i_{SS}}}} \right\rceil \quad (4)$$

If $BRP\ PPDU$ and $N_{BLKS_{i_{user}}} < N_{BLKSmin}$,

-continued then $N_{BLKS_{i_{user}}} = N_{BLKSmin}$ $$N_{BLK\_PAD_{i_{user}i_{SS}}} = N_{BLKS_{i_{user}}} \cdot N_{CB} \cdot N_{SPB} \cdot N_{CBPS_{i_{user}i_{SS}}} - N_{CW_{i_{user}i_{SS}}} \cdot L_{CW}$$

In other embodiments, the number of coded pad bits per $i_{SS}$-th spatial stream may be determined according to any other additional or alternative operations and/or parameters.

f) Concatenate coded bits for $i_{SS}$-th spatial stream with $N_{BLK\_PAD_{i_{user}i_{SS}}}$ zero bits.

They are scrambled using a continuation of the scrambler sequence that scrambled the PSDU input bits and data pad bits at step a). The pad bits of the first spatial stream may be scrambled first, the pad bits of the second spatial stream may be scrambled second, and so on.

g) For each user a one-to-one mapping of $N_{SS_{i_{user}}}$ spatial streams to $N_{STS_{i_{user}}}$, space-time streams may be applied.

h) The space-time stream index per user $i_{STS_{i_{user}}}$ is mapped to the space-time user stream index over all users $i_{STS}$, e.g., as follows:

$$i_{STS} = \sum_{m=0}^{i_{user}-1} Num_m + i_{STS_{i_{user}}}, \quad (5)$$

$1 \le i_{STS_{i_{user}}} \le N_{STS_{i_{user}}}, 1 \le i_{user} \le N_{user}$ $Num_m = N_{STSm}$ for $m > 0$ and $Num_m = 0$ otherwise In other embodiments, the space-time stream may be mapped according to any other additional or alternative operations and/or parameters.

In some demonstrative embodiments, the parameters used in the above algorithm may include one or more of the parameters defined above in Table 1, and/or any other parameters may be used.

In some demonstrative embodiments, the Algorithm for encoding the PSDU for the $i_{user}$-th user, e.g., as described above, may allow a technical benefit, at least by ensuring that a number of blocks to be transmitted in each stream may be kept the same. For example, the Algorithm for encoding the PSDU for the $i_{user}$-th user, e.g., as described above, may allow to have the length of the data field to be transmitted to the same user, e.g., in the same EDMG SC PPDU, to be the same, e.g., over multiple streams. As a result, an end of the data field for all streams may be "aligned", e.g., as described below.

Figure 3:
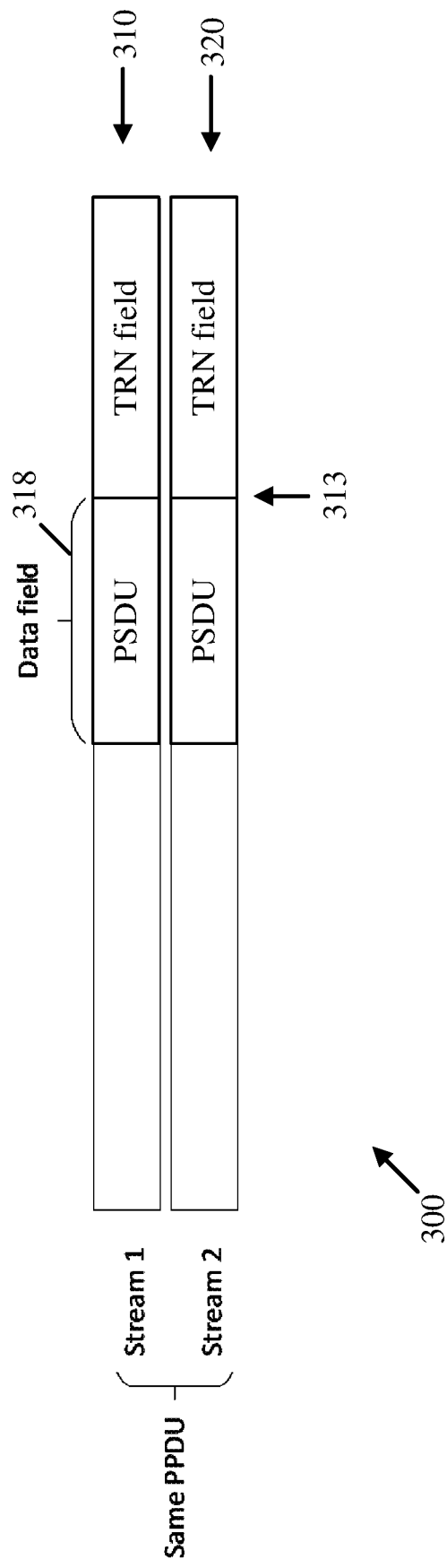
FIG. 3 is a schematic illustration of a PPDU transmission to a user, in accordance with some demonstrative embodiments.

FIG. 3 is a schematic illustration of a PPDU transmission 300 to a user, in accordance with some demonstrative embodiments. As shown in FIG. 3, a data field 318, which is transmitted over two different streams 310 and 320 to the same user, may be aligned, e.g., to end at the same time 313.

Referring back to FIG. 1, in some demonstrative embodiments, devices 102 and/or 140 may be configured to generate, encode, transmit, receive and/or process EDMG SC MU PPDUs, for example, as part of a MU transmission, e.g., as described below.

In some demonstrative embodiments, for example, when transmitting a multi-stream EDMG PPDU to multiple users, the encoding procedure, for example, using one or more operations of the Algorithm for encoding the PSDU for the $i_{user}$-th user, e.g., as described above, may be repeated N times, wherein N is the number of users addressed in the EDMG MU SC PPDU.

In some demonstrative embodiments, after performing the encoding process to encode the EDMG MU SC PPDU, it may be possible that, e.g., at the end of the process, the encoded data to be sent to different users may result in a different numbers of symbol blocks.

For example, the Algorithm for encoding the PSDU for the $i_{user}$-th user, e.g., as described above, may guarantee that all streams sent to the same user have the same length. However, in some cases, implementations and/or scenarios, the streams to two or more users may have different lengths.

Figure 4:
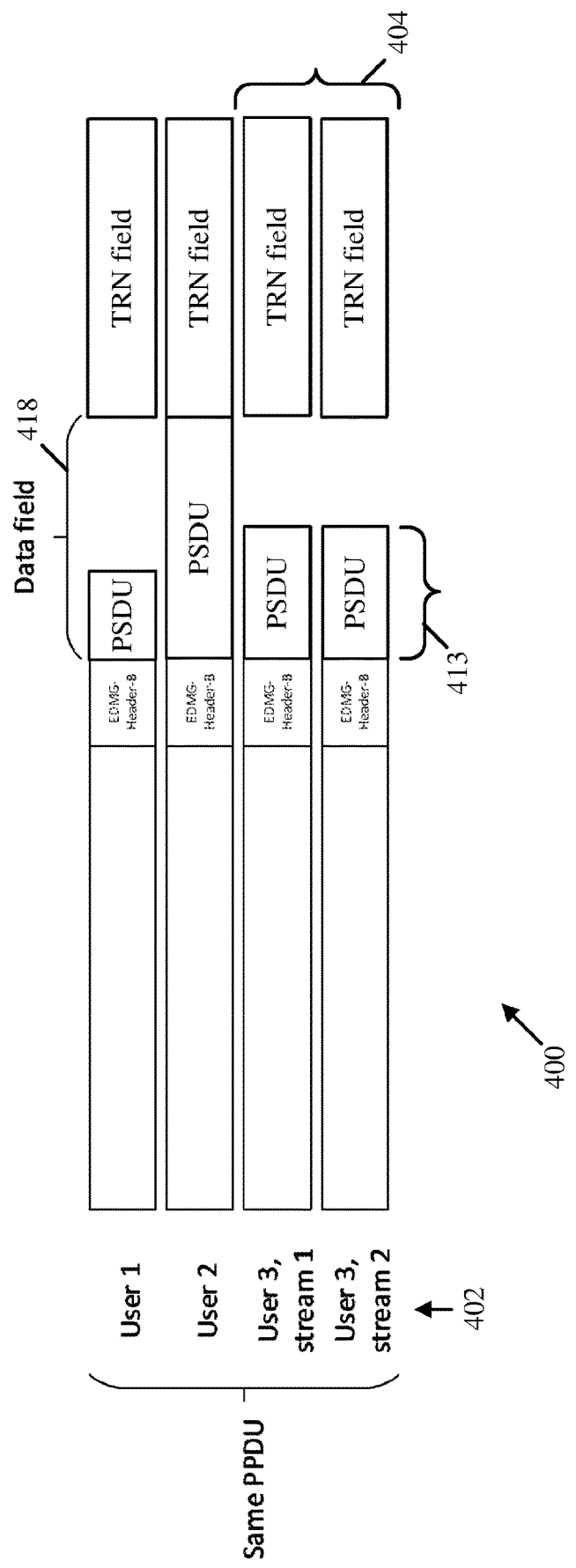
FIG. 4 is a schematic illustration of a PPDU transmission to a plurality of users, to illustrate one or more technical aspects, which may be addressed, in accordance with some demonstrative embodiments.

FIG. 4 is a schematic illustration of a PPDU transmission 400 to a plurality of users 402, in accordance with some demonstrative embodiments.

In some demonstrative embodiments, for example, as shown in FIG. 4, 1 or 2 spatial streams 404 or any other number of streams, may be directed to the same user ("user 3"), e.g., when using an EDMG SC MU PPDU. For example, as shown in FIG. 4, at least one user, e.g., a first user ("user 1") and a second user ("user 2"), may have a single stream, and/or at least one user, e.g., the user 3 may have two or more spatial streams 404.

In some demonstrative embodiments, as shown in FIG. 4, the Algorithm for encoding the PSDU for the $i_{user}$-th user, e.g., as described above, may allow forcing the streams 404 sent to the same user to have the same length 413, e.g., the same number of SC blocks.

In some demonstrative embodiments, for example, as shown in FIG. 4, the data field 418 of the streams sent to the different users may have different lengths. It may be required that such a scenario is not to be possibly allowed, for example, in order that data to be sent to the different users may be multiplexed in the same PPDU.

In some demonstrative embodiments, for example, in order to avoid a situation of the data field of the streams sent to the different users having different lengths, an encoder at the transmitter may pad the data to be sent to different users, for example, in such a way that the resulting number of symbols sent to each user is the same, and thus the "data field" of each user has the same length.

Referring back to FIG. 1, in some demonstrative embodiments, devices 102 and/or 140 may be configured to generate, encode, transmit, receive, decode and/or process EDMG SC MU PPDUs, for example, according to an EDMG LDPC encoding procedure, which may be configured to guarantee that all user PPDUs should be aligned in time, for example, to end at the same time and/or to have a same length, e.g., as described below.

In some demonstrative embodiments, if necessary, for example, user PSDUs may be padded according to a padding procedure, e.g., as described below.

In some demonstrative embodiments, devices 102 and/or 140 may be configured to generate, encode, transmit, receive, decode, and/or process EDMG SC PPDUs, for example, according to an encoding procedure, which may include one or more, e.g., some or all, of the operations described below, for example, for transmission of an EDMG MU SC PPDU.

In some demonstrative embodiments, devices 102 and/or 140 may be configured to implement one or more operations to support and/or enable encoding of a MU PPDU according to a Multi-user encoding Algorithm, e.g., as follows:

a) Compute a maximum number of SC symbol blocks over all users $$N_{BLKSmax} = \max_{i_{user}}(N_{BLKSi_{user}}) \text{ for } i_{user} = 1, 2, \ldots, N_{user}.$$

b) Update a number of SC symbol blocks, e.g., at step d) in 30.5.6.3.3 of the IEEE 802.11ay Specification, and/or step e) in the above Algorithm for encoding the PSDU for the $i_{user}$-th user as $N_{BLKSi_{user}} = N_{BLKS\ max}$ for $i_{user}=1, 2, \ldots, N_{user}$. Update a number of pad bits for $i_{user}$-th user accordingly.

c) The number of pad SC symbol blocks for MU PPDU transmission for $i_{user}$-th user may be defined, e.g., as follows:

$$N_{PAD\_BLKS\ i_{user}} = N_{BLKS\ max} - N_{BLKS\ i_{user}} \quad (6)$$

In some demonstrative embodiments, one or more operations of the Multi-user encoding Algorithm described above may be configured to add padding bits to the data to be transmitted to different users, for example, in such a way that the number of SC blocks required to transmit the data plus padding bits for all streams of all users may become the same, e.g., similar to the PPDU shown in FIG. 3.

In some demonstrative embodiments, for example, an EDMG-Header-B, e.g., EDMG Header B 216 (FIG. 2), of an EDMG SC MU PPDU may be sent on a per-user basis, e.g., in accordance with an IEEE 802.11ay Specification.

In some demonstrative embodiments, the EDMG-Header-B, e.g., EDMG Header B 216 (FIG. 2), of an EDMG SC MU PPDU), may include values transmitted in one or more fields, e.g., a PSDU Length field, an EDMG-MCS1 field, and/or an EDMG-MCS2 field and/or any other field, which may allow a STA, e.g., each STA addressed by an EDMG SC MU PPDU, to calculate the duration of the data field after padding. However, in order to decode the received data field, a user, e.g., each user, may be required to know the number of padded SC symbols added to their stream(s) in the encoding process.

In some demonstrative embodiments, the EDMG-Header-B of EDMG SC PPDUs may be configured to include a field, e.g., a new field, which may be configured to indicate the number of padded SC bits added in the transmission of the corresponding data field, e.g., as the EDMG-Header-B is transmitted on a per user-basis.

In some demonstrative embodiments, the field indicating the number of padded SC bits may be a "Number of Padded SC Symbols" field or any other field with any other name.

In some demonstrative embodiments, the number of bits allocated to the field indicating the number of padded SC bits may be configured, for example, to support a maximum number of SC Symbols that could be added in the padding process, which may assume different values, e.g., depending on system requirements. One possible value could be 6 bits, or any other number of bits.

In some demonstrative embodiments, one or more values indicated in one or more fields of EDMG SC PPDUs, for example, a Length field, a TRN Length field, and/or one or more MCS fields in the L-Header of EDMG SC PPDUs for MIMO transmission and/or any other field, may be configured, for example, such that a spoofing error is smaller than one symbol block, e.g., 512×Tc, and non-negative. For example, the spoofing error may be defined as the difference between the PPDU duration calculated based on L-Header and the actual PPDU duration.

In some demonstrative embodiments, devices 102 and/or 140 may be configured to implement one or more operations to support and/or enable an OFDM transmission of an EDMG PPDU, for example, according to an OFDM EDMG PPDU transmission mode, which may be configured to support a SU transmission mode and/or a MU transmission mode, e.g., as described below.

In some demonstrative embodiments, devices 102 and/or 140 may be configured to generate, transmit, receive and/or process one or more transmissions of an EDMG OFDM PPDU, for example, using a SU mode or a MU mode, for example, with different types of spatial mapping, e.g., as described below.

In some demonstrative embodiments, encoding and/or transmission of the EDMG OFDM PPDU may be defined and/or performed based on one or more of the following parameters, and/or one or more additional or alternative parameters, e.g., as described below:

TABLE 2

| Symbol | Explanation |
| --- | --- |
| $i_{SS}$ | Spatial stream number |
| $N_{SS\ i_{user}}$ | Total number of spatial streams for $i_{user}$-th user |
| $i_{user}$ | User number |
| $N_{user}$ | Total number of users |
| $i_{STS\ i_{user}}$ | Space-time stream number for $i_{user}$-th user |
| $N_{STS\ i_{user}}$ | Total number of space-time streams for $i_{user}$-th user |
| $i_{STS}$ | Space-time stream number over all users |
| $N_{STS}$ | Total number of space-time streams over all users |
| $Length_{i_{user}}$ | PSDU length in octets for $i_{user}$-th user |
| $L_{CW}$ | LDPC codeword length in bits, it can be equal to 624, 672, 1248, and 1344 |
| $L_{CWD}$ | Number of systematic data bits per LDPC codeword |
| $L_{CWP}$ | Number of parity bits per LDPC codeword |
| $R_{i_{user}\ i_{SS}}$ | LDPC code rate for $i_{user}$-th user and $i_{SS}$-th spatial stream, it can be equal to 1/2, 5/8, 3/4, 13/16, 7/8 |
| $N_{CW\ i_{user}}$ | Total number of LDPC codewords for $i_{user}$-th user |
| $N_{CW\ i_{user}\ i_{SS}}$ | Total number of LDPC codewords for $i_{user}$-th user and $i_{SS}$-th spatial stream |
| $N_{DATA\_PAD\ i_{user}}$ | Number of pad bits for $i_{user}$-th user to get integer number of LDPC codewords |
| $N_{SYMS\ i_{user}}$ | Total number of OFDM symbols for $i_{user}$-th user |
| $N_{SYMSmin}$ | Minimum number of total OFDM symbols for BRP PPDU transmission |
| $N_{SYM\_PAD\ i_{user}}$ | Number of pad bits for $i_{user}$-th user to get integer number of OFDM symbols |
| $N_{SYM\_PAD\ i_{user}\ i_{SS}}$ | Number of pad bits for $i_{user}$-th user and $i_{SS}$-th spatial stream to get integer number of OFDM symbols |
| $N_{BPSC\ i_{user}\ i_{SS}}$ | Number of coded bits per constellation point for $i_{user}$-th user and $i_{SS}$-th spatial stream |
| $Ng_{i_{user}\ i_{SS}}$ | Number of bits in the group for $i_{user}$-th user and $i_{SS}$-th spatial stream in the round robin distribution procedure |
| $N_{user}$ | Total number of users in multi user transmission |
| $N_{SYMS\ max}$ | Maximum number of OFDM symbols over all users |
| $N_{PAD\_SYMS\ i_{user}}$ | The number of pad OFDM symbols for $i_{user}$-th user required to align PPDUs over different users in time |

In some demonstrative embodiments, some or all of the parameters of Table 2 may be implemented, one or more parameters may be defined in a different manner, and/or one or more additional or alternative parameters may be implemented.

In some demonstrative embodiments, devices 102 and/or 140 may include, operate as, and/or perform a role of, one or more EDMG STAs, which may be configured to support the transmission of two or more spatial streams using OFDM modulation, e.g., in the form of a MIMO transmission.

In some demonstrative embodiments, devices 102 and/or 140 may be configured to implement one or more operations to support and/or enable an encoding procedure for EDMG OFDM PPDUs, which may be configured, for example, for both single spatial stream and multi-spatial stream transmission, for example, to support one or both of a SU case and a MU case, e.g., as described below.

In some demonstrative embodiments, for example, a data codeword, e.g., each data codeword, of $L_{CWD}$ information bits may be concatenated with $L_{CWP}$ parity bits, for example, to create a codeword of length $L_{CW}=L_{CWD}+L_{CWP}$ bits, e.g., as described below.

In some demonstrative embodiments, devices 102 and/or 140 may be configured to generate, encode, transmit, receive, decode and/or process EDMG OFDM PPDUs, for example, according to an EDMG LDPC encoding procedure, for example, on a per $i_{user}$-th user basis, e.g., as described below.

In some demonstrative embodiments, the EDMG LDPC encoding procedure may support, for example, employing, at an LDPC encoder, codeword lengths $L_{CW}=624$, 672, 1248, and/or 1344, e.g., which may result in code rates R=1/2, 5/8, 3/4, 13/16, and/or 7/8.

In other embodiments, any other codeword lengths and/or code rates may be used.

In some demonstrative embodiments, the EDMG LDPC encoding procedure may be defined and/or performed based on one or more of the following parameters, and/or one or more additional or alternative parameters, e.g., as described below:

TABLE 3

| | Codeword length-$L_{CW}$ | | Number of data bits-$L_{CWD}$ | |
| --- | --- | --- | --- | --- |
| Code rate | Short | Long | Short | Long |
| 1/2 | 672 | 1344 | 336 | 672 |
| 5/8 | 672 | 1344 | 420 | 840 |
| 3/4 | 672 | 1344 | 504 | 1008 |
| 13/16 | 672 | 1344 | 546 | 1092 |
| 7/8 | 624 or 672 | 1248 or 1344 | 546 or 588 | 10921176 |

In some demonstrative embodiments, some or all of the parameters of Table 3 may be implemented, one or more parameters may be defined in a different manner, and/or one or more additional or alternative parameters may be implemented.

In some demonstrative embodiments, an EDMG LDPC encoding procedure for LDPC encoding with a codeword length $L_{CW}=672$ or 1344 may include solving the linear system of equations $H \times (c^{(m)})^T = 0$, which may be defined, for example, by a parity matrix H of size $L_{CWP}$ by $L_{CW}$, where $c^{(m)}=(b^{(m)},p^{(m)})$ defines an m-th LDPC codeword, $b^{(m)}=(b_1^{(m)},b_2^{(m)},\ldots,b_{L_{CWD}}^{(m)})$ defines an m-th data word, and $p^{(m)}=(p_1^{(m)},p_2^{(m)},\ldots,p_{L_{CWD}}^{(m)})$ defines parity bits for the m-th LDPC codeword.

In some demonstrative embodiments, an EDMG LDPC encoding procedure for LDPC encoding with a codeword length $L_{CW}=624$ or 1248, may include employing the original matrices H with $L_{CW}=672$ and 1344 for a code rate R=13/16; and applying a puncturing procedure to get a desired code rate R=7/8. For example, for $L_{CW}=624$, the first 48 parity bits may be discarded, and/or for $L_{CW}=1248$, the first 96 parity bits may be discarded.

In some demonstrative embodiments, an EDMG LDPC encoding procedure for LDPC encoding may use parity check matrices in accordance with an IEEE 802.11ay Specification, e.g., as described below.

In some demonstrative embodiments, devices 102 and/or 140 may be configured to implement one or more operations to support and/or enable an LDPC encoding procedure for a single spatial stream ($i_{SS}=1$), e.g., as described below.

In some demonstrative embodiments, the encoding procedure for the $i_{user}$-th user may be implemented, e.g., as follows:
a) Compute the number of data pad bits $N_{DATA\_PADi_{user}}$, using a number of LDPC codewords $N_{CWi_{user}}$, e.g., as follows:

$$N_{CWi_{user}} = \left\lceil \frac{Length_{i_{user}} \cdot 8}{L_{CW} R_{i_{user}}} \right\rceil \quad (7)$$

$$N_{BLK\_PADi_{user}} = N_{CW} \cdot L_{CW} \cdot R_{i_{user}} - Length_{i_{user}} \cdot 8$$

The scrambled PSDU is concatenated with $N_{DATA\_PADi_{user}}$ zero bits. They are scrambled using a continuation of the scrambler sequence that scrambled the PSDU input bits.

b) Convert the scrambled PSDU data bits to LDPC codewords, for example, depending on the codeword length and code rate, e.g., as follows:
  a. If LCW=672, 1344:
    i. The output stream of scrambler is broken into the blocks of length LCWD=LCW×R bits such that the m-th data word may be, e.g., as follows:

$$b^{(m)} = (b_1^{(m)}, b_2^{(m)}, \ldots, b_{L_{CWD}}^{(m)}), m \leq N_{CW\ i_{user}} \quad (8)$$

ii. To each data word, parity bits $p^{(m)} = (p_1^{(m)}, p_2^{(m)}, \ldots, p_{L_{CWP}}^{(m)})$, $L_{CWP} = L_{CW} - L_{CWD}$, are added to create the codeword $c^{(m)} = (b^{(m)}, p^{(m)}), m \leq N_{CW\ i_{user}}$ such that $H \cdot (c^{(m)})^T = 0$
  b. If $L_{CW} = 624$, R=7/8:
    i. The output stream of scrambler is broken into the blocks of length 546 bits such that the m-th data word may be, e.g., as follows:

$$b^{(m)} = (b_1^{(m)}, b_2^{(m)}, \ldots, b_{546}^{(m)}), m \leq N_{CW\ i_{user}} \quad (9)$$

ii. To each data word, parity bits $p^{(m)} = (p_1^{(m)}, p_2^{(m)}, \ldots, p_{L_{126}}^{(m)})$ are added to create the codeword $(b^{(m)}, p^{(m)})$, $m \leq N_{CW\ i_{user}}$, and parity bits are computed applying $L_{CW} = 672$, R=13/16 LDPC matrix.
    iii. Finally, the first 48 parity bits are discarded (punctured) to create the output codeword, e.g., as follows:

$$c^{(m)} = (b_1^{(m)}, b_2^{(m)}, \ldots, b_{546}^{(m)}, p_{49}^{(m)}, p_{50}^{(m)}, \ldots, p_{126}^{(m)}), m \leq N_{CW\ i_{user}} \quad (10)$$

c. If $L_{CW} = 1248$, R=7/8:
    i. The output stream of scrambler is broken into the blocks of length 1092 bits such that the m-th data word may be, e.g., as follows:

$$b^{(m)} = (b_1^{(m)}, b_2^{(m)}, \ldots, b_{1092}^{(m)}), m \leq N_{CW\ i_{user}} \quad (11)$$

ii. To each data word, parity bits $p^{(m)} = (p_1^{(m)}, p_2^{(m)}, \ldots, p_{L_{252}}^{(m)})$ are added to create a codeword $(b^{(m)}, p^{(m)})$, $m \leq N_{CW\ i_{user}}$, and parity bits are computed applying $L_{CW} = 1344$, R=13/16 LDPC matrix.
    iii. Finally, the first 96 parity bits are discarded (punctured) to create the output codeword, e.g., as follows:

$$c^{(m)} = (b_1^{(m)}, b_2^{(m)}, \ldots, b_{1092}^{(m)}, p_{97}^{(m)}, p_{98}^{(m)}, \ldots, p_{252}^{(m)}), m \leq N_{CW\ i_{user}} \quad (12)$$

c) Concatenate LDPC codewords one after the other to create a coded bits stream $$(c^{(1)}, c^{(2)}, \ldots, c^{(N_{CW\ i_{user}})})$$

d) Compute the number of coded pad bits, $N_{SYM\_PADi_{user}}$, using the number of OFDM symbols, $N_{SYMSi_{user}}$, e.g., as follows:

$$N_{SYMSi_{user}}, = \left\lceil \frac{N_{CWi_{user}} \cdot L_{CW}}{N_{SD} \cdot N_{BPSCi_{user}}} \right\rceil \quad (13)$$

If BRP PPDU and $N_{SYSMi_{user}}, < N_{SYMSmin}$, then $N_{SYMSi_{user}}, = N_{SYMSmin}$ If STBC applied and $N_{SYMSi_{user}}$ is odd, then $N_{SYMSi_{user}} = N_{SYMSi_{user}} + 1$ $$N_{SYM\_PADi_{user}} = N_{SYMSi_{user}} \cdot N_{SD} \cdot N_{BPSCi_{user}} - N_{CWi_{user}} \cdot L_{CW}$$

e) Concatenate coded bit stream with $N_{SYM\_PADi_{user}}$ zero bits. The bits may be scrambled, for example, using a continuation of the scrambler sequence that scrambled the PSDU input bits and data pad bits at step a).

In some demonstrative embodiments, the parameters used in the above algorithm may include one or more of the parameters defined above in Table 2 and/or any other parameters may be used.

In some demonstrative embodiments, for each user, for example, if a STBC coding is applied, a single spatial stream $N_{SSi_{user}} = 1$ may be mapped to two space-time streams $N_{STSi_{user}} = 2$.

In some demonstrative embodiments, for each user, for example, if a STBC coding is not applied, a single spatial stream $N_{SSi_{user}} = 1$ may be mapped to a single space-time stream $N_{STSi_{user}} = 1$.

In some demonstrative embodiments, a space-time stream index per user $i_{STS\ i_{user}}$ may be mapped to the space-time stream index over all users $i_{STS}$, e.g., as follows:

$$i_{STS} = \sum_{m=0}^{i_{user}-1} Num_m + i_{STSi_{user}}, \quad (14)$$

$$1 \leq i_{STSi_{user}} \leq N_{STSi_{user}}, 1 \leq i_{user} \leq N_{user}$$

$Num_m = N_{STSm}$ for $m > 0$ and $Num_m = 0$ otherwise

In some demonstrative embodiments, a value of $N_{SYMSmin}$ may be defined per user basis, for example, in a Requested BRP OFDM Blocks field, for example, within a responder's EDMG Capabilities element, or in any other field and/or message. For example, if the Requested BRP Blocks field is not included in the EDMG Capabilities element, then $N_{BLKSmin}$=aBRPminOFDMblocks.

In other embodiments, any other definition of $N_{SYMSmin}$ may be used.

In some demonstrative embodiments, devices 102 and/or 140 may be configured to implement one or more operations to support and/or enable LDPC encoding for multiple spatial streams ($i_{SS} > 1$), e.g., as described below.

In some demonstrative embodiments, devices 102 and/or 140 may be configured to implement one or more operations to support and/or enable the LDPC encoding process for an $i_{user}$-th user, e.g., as follows:
a) Compute the number of data pad bits $N_{DATA\_PADi_{user}}$, using a number of LDPC codewords per $i_{SS}$-th spatial stream $N_{CW\ i_{user},i_{SS}}$, e.g., as follows:

$$N_{CW_{i_{user}i_{SS}}} = \left\lceil \frac{Length_{i_{user}} \cdot 8}{\sum_{i_{SS}=1}^{N_{SSi_{user}}} N_{BPSCi_{user}i_{SS}} \cdot L_{CW} \cdot R_{i_{user}i_{SS}}} \right\rceil \cdot N_{BPSCi_{user}i_{SS}} \quad (15)$$

$$N_{DATA\_PADi_{user}} = \sum_{i_{SS}=1}^{N_{SS}} N_{CW_{i_{user}i_{SS}}} \cdot L_{CW} \cdot R_{i_{user}i_{SS}} - Length_{i_{user}} \cdot 8$$

The scrambled PSDU is concatenated with $N_{DATA\_PADi_{user}}$ zero bits. They are scrambled using a continuation of the scrambler sequence that scrambled the PSDU input bits.
All spatial streams may use an LDPC codeword of a same length.

b) Distribute the PSDU scrambled bits over $N_{SSi_{user}}$ spatial streams. For example, bits distribution may be performed on a group basis with a number of bits in a group, e.g., as follows:

$$Ng_{i_{user}i_{SS}} = N_{BPSCi_{user}i_{SS}} \times R_{i_{user}i_{SS}} \times 16) \quad (16)$$

The first group of bits comes to the first stream, the second group of bits comes to the second stream and so on. The procedure may be repeated when the maximum number of spatial streams $N_{SSi_{user}}$ is reached.

c) For each spatial stream convert the scrambled PSDU bits to LDPC codewords, e.g., as described above with respect to step b) of the LDPC encoding procedure for a single spatial stream.

d) For each spatial stream concatenate LDPC codewords one after the other to create the coded bits stream, e.g., as follows:

$$\left( c_{i_{SS}}^{(1)}, c_{i_{SS}}^{(2)}, \ldots, c_{i_{SS}}^{(N_{CW\ i_{user}\ i_{SS}})} \right), i_{SS} = 1, 2, \ldots, N_{SSi_{user}} \quad (17)$$

e) Compute the number of coded pad bits per $i_{SS}$-th spatial stream, $N_{SYM\_PADi_{user}i_{SS}}$, using the number of OFDM symbols, $N_{SYMSi_{user}}$, e.g., as follows:

$$N_{SYMSi_{user}} = \left\lceil \frac{N_{CW_{i_{user}i_{SS}}} \cdot L_{CW}}{N_{SB} \cdot N_{BPSCi_{user}i_{SS}}} \right\rceil \quad (18)$$

If BRP PPDU and $N_{SYMSi_{user}} < N_{SYMSmin}$,
then $N_{SYMSi_{user}} = N_{SYMSmin}$ $$N_{(SYM\_PADi)_{user}i_{SS}} = N_{SYSMi_{user}} \cdot N_{SD} \cdot N_{BPSCi_{user}i_{SS}} - N_{CW_{i_{user}i_{SS}}} \cdot L_{CW}$$

f) Concatenate coded bits for $i_{SS}$-th spatial stream with $N_{SYM\_PADi_{user}i_{SS}}$ zero bits.
The bits may be scrambled, for example, using a continuation of the scrambler sequence that scrambled the PSDU input bits and data pad bits at step a). The pad bits of the first spatial stream are scrambled first, the pad bits of the second spatial stream are scrambled second, and so on.

In some demonstrative embodiments, the parameters used in the above algorithm may include one or more of the parameters defined above in Table 2 and/or any other parameters may be used.

In some demonstrative embodiments, for each user, a one-to-one mapping of $N_{SSi_{user}}$ spatial streams to $N_{STSi_{user}}$ space-time streams may be applied. For example, the space-time stream index per user $i_{STS\ i_{user}}$ may be mapped to the space-time stream index over all users $i_{STS}$ e.g., as follows:

$$i_{STS} = \sum_{m=0}^{i_{user}-1} Num_m + i_{STS\ i_{user}}, \quad (19)$$

$$1 \leq i_{STS\ i_{user}} \leq N_{STS\ i_{user}}, 1 \leq i_{user} \leq N_{user}$$

$Num_m = N_{STS\ m}$ for $m > 0$ and $Num_m = 0$ otherwise

In some demonstrative embodiments, devices 102 and/or 140 may be configured to implement one or more operations to support and/or enable MU PPDU padding, e.g., as described below.

In some demonstrative embodiments, devices 102 and/or 140 may be configured to align in time PPDUs for all users, e.g., for MU PPDU transmissions.

In some demonstrative embodiments, for example, if necessary to achieve the alignment of the PPDUs, the PSDUs may be padded, e.g., as follows:

a) Compute the maximum number of OFDM symbols over all users, e.g., as follows:

$$N_{SYMS\ max} = \max_{i_{user}}(N_{SYMS\ i_{user}}) \text{ for } i_{user} = 1, 2, \ldots, N_{user} \quad (20)$$

b) Update the number of OFDM symbols at step d) in the LDPC encoding procedure for a single spatial stream, e.g., in Equation 13, and/or at step e) in the LDPC encoding for a multiple spatial stream, e.g., in Equation 18, as $N_{SYMS\ i_{user}} = N_{SYMS\ max}$ for $i_{user}=1, 2, \ldots, N_{user}$. Update the number of pad bits for $i_{user}$-th user accordingly.

c) The number of pad OFDM symbols for MU PPDU transmission for $i_{user}$-th user is defined, e.g., as follows:

$$N_{SYM\_BLKSi_{user}} = N_{SYMS\ max} - N_{SYMS\ i_{user}} \quad (21)$$

In some demonstrative embodiments, devices 102 and/or 140 may be configured to implement one or more operations to support and/or enable a Spoofing error length indicator.

In some demonstrative embodiments, in order to correctly decode a multi-user EDMG OFDM PPDU, the STAs processing the PPDU, e.g., devices 102 and/or 140, must know the number of padding symbols added to their stream(s), e.g., by using the Spoofing error length indicator.

In some demonstrative embodiments, devices 102 and/or 140 may be configured to generate, transmit, receive and/or process one or more transmissions of an EDMG SC PHY PPDU, for example, using a SU mode or a MU mode, for example, with different types of spatial mapping, e.g., as described below.

In some demonstrative embodiments, controller 124 may be configured to cause, trigger, and/or control the wireless station implemented by device 102, e.g., an EDMG STA, to generate an EDMG SC PPDU, e.g., PPDU 200 (FIG. 2), including at least pre-EDMG fields and a data field, e.g., data field 218 (FIG. 2), e.g., as described below.

In some demonstrative embodiments, the pre-EDMG fields may include a L-STF, e.g., L-STF 202 (FIG. 2), a L-CEF, e.g., L-CEF 204 (FIG. 2), a L-Header, e.g., L-Header 206 (FIG. 2), and an EDMG-Header-A, e.g., EDMG Header A 208 (FIG. 2), e.g., as described below.

In some demonstrative embodiments, controller 124 may be configured to cause, trigger, and/or control the wireless station implemented by device 102 to generate one or more PPDU waveforms for the pre-EDMG and data fields, e.g., as described below.

In some demonstrative embodiments, the one or more PPDU waveforms may be configured for spatial mapping to one or more respective transmit chains, e.g., as described below.

In some demonstrative embodiments, the spatial mapping may include digital beamforming, e.g., according to a spatial mapping matrix, or spatial expansion, for example, according to a cyclic time shift, e.g., as described below.

In some demonstrative embodiments, a PPDU waveform corresponding to a transmit chain of the one or more transmit chains may be based on a transmit chain number of the transmit chain, e.g., as described below.

In some demonstrative embodiments, controller 124 may be configured to cause, trigger, and/or control the wireless station implemented by device 102 to transmit the EDMG SC PPDU in a SC transmission via the one or more transmit chains over a channel bandwidth of at least 2.16 GHz in a frequency band above 45 GHz, e.g., as described below.

In some demonstrative embodiments, transmission of the EDMG SC PPDU via the transmit chain may be based on the PPDU waveform corresponding to the transmit chain, e.g., as described below.

In some demonstrative embodiments, controller 124 may be configured to cause, trigger, and/or control the wireless station implemented by device 102 to transmit the EDMG SC PPDU over a channel bandwidth of 2.16 GHz, e.g., as described below.

In some demonstrative embodiments, controller 124 may be configured to cause, trigger, and/or control the wireless station implemented by device 102 to transmit the EDMG SC PPDU over a channel bandwidth including a plurality of 2.16 GHz channel bandwidths, e.g., as described below.

In some demonstrative embodiments, controller 124 may be configured to cause, trigger, and/or control the wireless station implemented by device 102 to transmit the EDMG SC PPDU over a channel bandwidth of 2.16 GHz, 4.32 GHz, 6.48 GHz, or 8.64 GHz, e.g., as described below.

In other embodiments, device 102 may transmit the EDMG SC PPDU over any other channel bandwidth.

In some demonstrative embodiments, the spatial mapping may include the digital beamforming according to the spatial mapping matrix, e.g., as described below.

In some demonstrative embodiments, the PPDU waveform corresponding to the transmit chain may be based, for example, on a matrix element of the spatial mapping matrix, e.g., as described below.

In some demonstrative embodiments, an index of the matrix element may be based on the transmit chain number of the transmit chain, e.g., as described below.

In some demonstrative embodiments, the index of the matrix element may include a row index of the spatial mapping matrix, e.g., as described below.

In some demonstrative embodiments, the row index may be equal to the transmit chain number of the transmit chain, e.g., as described below.

In some demonstrative embodiments, the matrix element may be in a row of the spatial mapping matrix having a row index equal to 1, e.g., as described below.

In other embodiments, the row index may include any other value.

In some demonstrative embodiments, controller 124 may be configured to cause, trigger, and/or control the wireless station implemented by device 102 to determine the PPDU waveform corresponding to the transmit chain based on the matrix element of the spatial mapping matrix, e.g., as follows:

$$r_{pre-EDMG,Data}^{i_{TX}}(nT_c) = [Q]_{i_{TX},1} \cdot r_{pre-EDMG,Data}(nT_c),$$
$$1 \le i_{TX} \le N_{TX} \tag{22}$$

wherein $N_{TX}$ denotes a total count of the one or more transmit chains, $r_{pre-EDMG,Data}^{i_{TX}}(nT_c)$ denotes the PPDU waveform corresponding to the transmit chain number $i_{TX}$, $r_{pre-EDMG,Data}(nT_c)$ denotes the pre-EDMG and data fields, Q denotes the spatial mapping matrix, and $[\ ]_{m,n}$ denotes a matrix element from an m-th row and an n-th column.

In some demonstrative embodiments, the spatial mapping may include the spatial expansion according to the cyclic time shift, e.g., as described below.

In some demonstrative embodiments, the PPDU waveform corresponding to the transmit chain may include the cyclic time shift of the pre-EDMG and data fields, e.g., as described below.

In some demonstrative embodiments, the cyclic time shift may be based on the transmit chain number of the transmit chain, e.g., as described below.

In some demonstrative embodiments, the cyclic time shift may include a cyclic time shift $T_{SC}^{i_{TX}}$ in SC chip units, wherein $i_{Tx}$ denotes the transmit chain number, e.g., as described below.

In some demonstrative embodiments, the cyclic time shift $T_{SC}^{i_{TX}}$ may be $(i_{TX}-1) \times N_c \times T_c$, wherein $N_c$ denotes a factor value, and $T_c$ denotes a SC chip time duration, e.g., as described below.

In some demonstrative embodiments, the factor value $N_c$ may be equal to 4, e.g., as described below.

In other embodiments, the factor value $N_c$ may include any other value.

In some demonstrative embodiments, controller 124 may be configured to cause, trigger, and/or control the wireless station implemented by device 102 to determine the PPDU waveform corresponding to the transmit chain, for example, by applying the cyclic time shift $T_{SC}^{i_{TX}}$ to the pre-EDMG and data fields, e.g., as follows:

$$r_{pre-EDMG,Data}^{i_{TX}}(nT_c) = \tag{23}$$
$$\begin{cases} r_{pre-EDMG,Data}(nT_c + T_{SC}^{i_{TX}}), & n = 0, 1, \ldots, N-1-T_{SC}^{i_{TX}}/T_c \\ r_{pre-EDMG,Data}(nT_c - (NT_c - T_{SC}^{i_{TX}})), & n = N - T_{SC}^{i_{TX}}/T_c, \ldots, N-1 \end{cases},$$
$$1 \le i_{TX} \le N_{TX}$$

wherein $N_{Tx}$ denotes a total count of the one or more transmit chains, $r_{pre-EDMG,Data}^{i_{TX}}(nT_c)$ denotes the PPDU waveform corresponding to the transmit chain number $i_{TX}$, $r_{pre-EDMG,Data}(nT_c)$ denotes the pre-EDMG and data fields, $T_c$ denotes a SC chip time duration, and N=length $(r_{pre-EDMG,\ Data})$.

In some demonstrative embodiments, controller 124 may be configured to cause, trigger, and/or control the wireless station implemented by device 102 to generate the EDMG SC PPDU including a TRN field, and to generate the PPDU waveform corresponding to the transmit chain by concatenating the pre-EDMG and data fields with the TRN field, e.g., as described below.

In some demonstrative embodiments, controller 124 may be configured to cause, trigger, and/or control the wireless station implemented by device 102 to up-sample and filter the PPDU waveform corresponding to the transmit chain, e.g., as described below.

In some demonstrative embodiments, controller 124 may be configured to cause, trigger, and/or control the wireless station implemented by device 102 to transmit the EDMG SC PPDU over a channel bandwidth of 2.16 GHz, e.g., as described below.

In some demonstrative embodiments, controller 124 may be configured to cause, trigger, and/or control the wireless station implemented by device 102 to transmit the EDMG SC PPDU over a channel bandwidth including a plurality of 2.16 GHz channel bandwidths, e.g., as described below.

In some demonstrative embodiments, controller 124 may be configured to cause, trigger, and/or control the wireless station implemented by device 102 to determine the PPDU waveform corresponding to the transmit chain to include an up-sampled and filtered waveform corresponding to the transmit chain, for example, duplicated, with time delay, over the plurality of 2.16 GHz channel bandwidths, e.g., as described below.

In some demonstrative embodiments, controller 124 may be configured to cause, trigger, and/or control the wireless station implemented by device 102 to transmit the EDMG SC PPDU as a SU PPDU, e.g., as described below.

In some demonstrative embodiments, controller 124 may be configured to cause, trigger, and/or control the wireless station implemented by device 102 to transmit the EDMG SC PPDU as a MU PPDU to a plurality of users, the MU PPDU including an EDMG Header B, and an EDMG preamble, e.g., as described below.

In some demonstrative embodiments, transmission of the EDMG SC PHY PPDU may be defined and/or performed based on one or more of the following parameters, and/or one or more additional or alternative parameters:

TABLE 4

| Symbol | Explanation |
| --- | --- |
| $i_{STS}$ | Space-time stream number or index |
| $N_{STS}$ | Total number of space-time streams over all users |
| $i_{user}$ | User number or index |
| $N_{user}$ | Total number of users |
| $i_{TX}$ | Transmit chain number or index |
| $N_{TX}$ | Total number of transmit chains |
| $F_c$ | SC chip rate, equal to 1.76 GHz, or any other chip rate |
| $T_c$ | SC chip time duration, equal to $1/F_c$ |
| $N_{CB}$ | Number of contiguous 2.16 GHz channels used for PPDU transmission, e.g., $1 \leq N_{CB} \leq 4$, or any other factor |
| Q | Spatial mapping matrix of size $N_{TX}$ by $N_{STS}$ |
| $N_{up}$ | Up-sampling parameter |

In some demonstrative embodiments, some or all of the parameters of Table 4 may be implemented, one or more parameters may be defined in a different manner, and/or one or more additional or alternative parameters may be implemented.

In some demonstrative embodiments, devices 102 and/or 140 may be configured to generate, transmit, receive and/or process one or more transmissions of an EDMG SC PHY PPDU, for example, according to a spatial mapping scheme, e.g., as described below.

In some demonstrative embodiments, a spatial mapping scheme may define a mapping of a plurality of space-time streams, e.g., $N_{STS}$ space-time streams, to a plurality of transmit chains or antennas, e.g., $N_{TX}$ transmit chains, for example, wherein $N_{STS} \leq N_{TX}$.

In some demonstrative embodiments, the spatial mapping scheme may be implemented, for example, according to a spatial mapping matrix, denoted Q, e.g., of a size $N_{TX}$ by $N_{STS}$, and/or a Cyclic Shift Diversity (CSD) scheme.

In some demonstrative embodiments, the spatial mapping matrix Q may be independent on the chip time index or subcarrier index, and/or may be constant in time. In other embodiments any other mapping matrix may be implemented.

In some demonstrative embodiments, the mapping scheme may include a mapping scheme selected from a plurality of predefined (basic) mapping schemes, for example, in accordance with an IEEE 802.11ay Specification and/or any other Specification, and/or any other mapping scheme.

In some demonstrative embodiments, for example, the mapping scheme may include a direct mapping scheme, an indirect mapping scheme, a digital beamforming scheme, and/or a spatial expansion scheme. In other embodiments, any other additional or alternative scheme may be implemented.

For example, the mapping scheme may implement one or more of the following spatial mapping methods and/or Q matrices, for example, with respect to one or more use cases, implementations and/or scenarios:

1. Direct mapping, $N_{STS}=N_{TX}$: spatial mapping matrix Q is a square diagonal complex values matrix of size $N_{TX}$, which may be, for example, defined, e.g., as follows and/or using any other definition:
   a. $[Q]_{i,i}=1, i=i_{STS}=i_{TX}=1,2,\ldots,N_{TX}$, the identity matrix
   b. $[Q]_{i,i}=\exp(j2\pi\phi_i), i=i_{STS}=i_{TX}=1,2,\ldots,N_{TX}$, exponential matrix
2. Indirect mapping, $N_{STS}=N_{TX}$: spatial mapping matrix Q is a square matrix of size $N_{TX}$ which may include, for example, complex values, which may be, for example, defined, e.g., as follows and/or using any other definition:
   a. Q=F, the discrete Fourier matrix
   b. Q=H, the normalized Hadamard matrix
3. Digital beamforming, $N_{STS} \leq N_{TX}$: spatial mapping matrix Q is a rectangular matrix of size $N_{TX}$ by $N_{STS}$, which may include, complex values, which may be, for example, defined based on some knowledge of the channel between a beamformer and beamformee.
4. Spatial expansion, $N_{STS}=1<N_{TX}$: the spatial expansion may be performed, for example, by application of a cyclic shift (CSD) over different transmit chains. The cyclic shift may be applied, for example, to the number of consecutive fields in the PPDU. This may allow, for example, duplication of the transmission of the PPDU fields over the $N_{TX}$ transmit chains, for example, while allowing to avoid unintentional beamforming, which may exist with a coherent signal transmission. In one example, the spatial expansion technique may not be applied to one or more fields, for example, the TRN field, which may be, for example, transmitted using an orthogonal sequence set.

In some demonstrative embodiments, devices 102 and/or 140 may be configured to generate, transmit, receive and/or process one or more transmissions of an EDMG SC PHY PPDU, for example, as part of an EDMG SU PPDU transmission, e.g., as described below.

In some demonstrative embodiments, devices 102 and/or 140 may be configured to generate, transmit, receive and/or process a PPDU transmission over a 2.16 GHz channel with $i_{STS}=1$, e.g., as described below.

In some demonstrative embodiments, a SC mode EDMG SU PPDU transmitted over a 2.16 GHz channel with a single space-time stream (e.g., $i_{STS}=1$) may include, for example, a pre-EDMG field, a data field, and a TRN field, e.g., as described below.

In some demonstrative embodiments, the SC mode EDMG SU PPDU may include, for example, one or more pre-EDMG fields, a data field, e.g., data field 218 (FIG. 2), and a TRN field, e.g., TRN field 224 (FIG. 2). In some embodiments, the SC mode EDMG SU PPDU may include only some of these fields and/or one or more other fields.

In some demonstrative embodiments, the pre-EDMG part of the SC mode EDMG SU PPDU may include, for example, an L-STF, e.g., L-STF 202 (FIG. 2), an L-CEF, e.g., L-CEF 204 (FIG. 2), an L-Header, e.g., L-Header 206 (FIG. 2), and/or an EDMG Header-A, e.g., EDMG Header A 208 (FIG. 2).

In other embodiments, the SC mode EDMG SU PPDU may include any other additional or alternative fields.

In some demonstrative embodiments, a total number of transmit chains $N_{Tx}$ may be maintained constant during transmission, for example, over the different fields of the EDMG SU PPDU.

In some demonstrative embodiments, the pre-EDMG and data part of the EDMG SU PPDU may be defined, for example, to include the following modulated fields:

$$r_{pre-EDMG,Data}(nT_c) = r_{L-STF}(nT_c) + r_{L-CEF}(nT_c - t_{L-CEF}) + r_{L-Header}(nT_c - t_{L-Header}) + r_{EDMG-Header-A}(nT_c + t_{EDMG-Header-A}) + r_{Data}(nT_c - t_{Data}) \quad (24)$$

wherein:

$t_{L-CEF} = T_{L-STF}$ is a duration of the L-STF field of the PPDU;

$t_{L-Header} = t_{L-CEF} + T_{L-CEF}$ is a total duration of the L-STF and L-CEF fields of the PPDU;

$t_{EDMG-Header-A} = t_{L-Header} + T_{L-Header}$ is a total duration of the L-STF, L-CEF, and L-Header fields of the PPDU; and/or $t_{Data} = t_{EDMG-Header-A} + T_{EDMG-Header-A}$ is a total duration of the L-STF, L-CEF, L-Header, and EDMG-Header-A fields of the PPDU.

In some demonstrative embodiments, for example, for digital beamforming transmission of the EDMG SU PPDU, the pre-EDMG and data part waveform for an $i_{TX}$-th transmit chain may be defined, for example, as follows:

$$r_{pre-EDMG,Data}^{iTX}(nT_c) = [Q]_{i_{TX},1} \cdot r_{pre-EDMG,Data}(nT_c), \quad 1 \le i_{TX} \le N_{TX} \quad (25)$$

wherein:

Q denotes a spatial mapping matrix; and $[\ ]_{m,n}$ denotes a matrix element from an m-th row and an n-th column.

In some demonstrative embodiments, devices 102 and/or 140 may be configured to generate, transmit, receive and/or process the EDMG SU PPDU, which may be transmitted via $N_{Tx}$ transmit chains, wherein $N_{Tx}$ is an integer equal to or greater than 1, e.g., as described below.

In some demonstrative embodiments, devices 102 and/or 140 may be configured to generate, transmit, receive and/or process at least a portion of the EDMG SU PPDU, e.g., a pre-EDMG and/or a data portion of the EDMG SU PPDU, which may be transmitted, e.g., in duplicate, via the $N_{Tx}$ transmit chains, e.g., as described below.

In some demonstrative embodiments, for example, transmission of the pre-EDMG and/or the data portion of the EDMG SU PPDU via an $i_{TX}$-th transmit chain, may include, for example, a cyclic shift, which may be configured, for example, to be dependent at least on the particular transmit chain number of the $i_{TX}$-th transmit chain to be used, e.g., as described below.

In some demonstrative embodiments, devices 102 and/or 140 may be configured to generate, transmit, receive and/or process an EDMG SU PPDU having a pre-EDMG and data part of the PPDU transmitted using multiple transmit chains, for example, according to a spatial expansion mechanism, e.g., as described below.

In some demonstrative embodiments, a spatial expansion with Cyclic Shift Diversity (CSD) may be applied, for example, to transmit the pre-EDMG and data part of the EDMG SU PPDU, for example, using multiple transmit chains, e.g., as described below.

In some demonstrative embodiments, the pre-EDMG and/or data part of the EDMG SU PPDU waveform for an $i_{TX}$-th transmit chain may include, for example, a cyclic shift, denoted $T_{SC}^{iTX}$, which may be configured, for example, to be dependent at least on the particular transmit chain number of the $i_{TX}$-th transmit chain to be used, e.g., as described below.

In some demonstrative embodiments, the cyclic shift $T_{SC}^{iTX}$ may be implemented to include a time shift, which may be, for example, defined in SC chip units, e.g., as described below.

In some demonstrative embodiments, the cyclic shift $T_{SC}^{iTX}$ may include a time shift, which may be defined, for example, in SC time units, for example, as $(i_{TX}-1) \times N_c \times T_c$, wherein $N_c$ may be configured as a predefined factor value, for example, $N_c$ may be equal to 4 chips. For example, $T_c$ may include a chip time duration. In other embodiments, the cyclic shift $T_{SC}^{iTX}$ may be defined in any other manner.

In some demonstrative embodiments, for example, the pre-EDMG and/or the data part of the EDMG SU PPDU waveform for the $i_{TX}$-th transmit chain may be determined based on the cyclic shift e.g., $T_{SC}^{iTX}$, as follows:

$$r_{pre-EDMG,Data}^{iTX}(nT_c) = \begin{cases} r_{pre-EDMG,Data}(nT_c + T_{SC}^{iTX}), & n = 0, 1, \ldots, N - 1 - T_{SC}^{iTX}/T_c \\ r_{pre-EDMG,Data}(nT_c - (NT_c - T_{SC}^{iTX})), & n = N - T_{SC}^{iTX}/T_c, \ldots, N - 1 \end{cases}, \quad 1 \le i_{TX} \le N_{TX} \quad (26)$$

wherein:

$N = \text{length}(r_{pre-EDMG, Data})$

In some demonstrative embodiments, the TRN field $r_{TRN}^{iTX}(nT_c)$ of the EDMG SU PPDU shall be defined at the SC chip rate equal to 1.76 GHz, for example, per $i_{TX}$-th transmit chain, e.g., in compliance with an IEEE 802.11ay Specification.

In some demonstrative embodiments, the EDMG SU PPDU waveform, for example, for transmission over a 2.16 GHz channel and a single space-time stream (e.g., $i_{STS}=1$), may be determined, for the $i_{TX}$-th transmit chain, for example, by concatenating the preamble and data part with the TRN field, e.g., as follows:

$$r_{EDMG}^{iTX(1)}(nT_c) = r_{pre-EDMG,Data}^{iTX}(nT_c) + r_{TRN}^{iTX}(nT_c - t_{TRN}), 1 \le i_{TX} \le N_{TX} \quad (27)$$

wherein:

$t_{TRN} = t_{Data} + T_{Data}$ is a total duration of the L-STF, L-CEF, L-Header, EDMG-Header-A, and Data fields of the PPDU.

In some demonstrative embodiments, a filtering procedure may be applied to the EDMG SU PPDU, for example, with a pulse shaping filter $h_{SCCB}$, which may be, for example, defined at a sampling rate of $N_{up} \times 1.76$ GHz, e.g., as follows:

$$r_{EDMG}^{i_{TX}(2)}\left(n\frac{T_c}{N_{up}}\right) = \begin{cases} r_{EDMG}^{i_{TX}(1)}\left(n\frac{T_c}{N_{up}}\right), & n = 0, N_{up}, 2*N_{up}... \\ 0 & \text{otherwise} \end{cases} \quad (28)$$

$$r_{EDMG}^{i_{TX}(3)}\left(n\frac{T_c}{N_{up}}\right) = \sum_{k=0}^{K-1} r_{EDMG}^{i_{TX}(2)}\left((n-k)\frac{T_c}{N_{up}}\right) h_{SCCB}(k), n = 0, 1, \ldots$$

$$r_{EDMG}^{i_{TX}}\left(n\frac{T_c}{N_{up}}\right) = r_{EDMG}^{i_{TX}(3)}\left(\left(n + \frac{K-1}{2}\right)\frac{T_c}{N_{up}}\right), n = 0, 1, \ldots$$

wherein:

K denotes a length of the filter $h_{SCCB}$ in samples; and $$r_{EDMG}^{i_{TX}(2)}\left(n\frac{T_c}{N_{up}}\right) = 0, \text{ for } n < 0 \text{ and } n \geq \text{length}\left(r_{EDMG}^{i_{TX}(1)}\right) \times N_{up}$$

In some demonstrative embodiments, one or more parameters, which may be implemented for the EDMG SU PPDU waveform, for example, the pulse shaping filter impulse response $h_{SCCB}$ and/or the parameter $N_{up}$, may be, for example, implementation specific.

In some demonstrative embodiments, devices 102 and/or 140 may be configured to generate, transmit, receive and/or process a PPDU transmission over a 2.16 GHz channel with $i_{STS} > 1$, e.g., as described below.

In some demonstrative embodiments, devices 102 and/or 140 may be configured to generate, transmit, receive and/or process a PPDU transmission over a channel wider than 2.16 GHz, for example, a 4.32 GHz channel, a 6.48 GHz channel, an 8.64 GHz channel and/or any other channel, for example, with $i_{STS} \geq 1$, e.g., as described below.

In some demonstrative embodiments, a SC mode EDMG SU PPDU to be transmitted over a 2.16 GHz channel with multiple streams ($i_{STS} > 1$), and/or a SC mode EDMG SU PPDU to be transmitted over a 4.32 GHz channel, a 6.48 GHz channel, and/or a 8.64 GHz channel, with single or multiple space-time streams ($i_{STS} \geq 1$), may include a pre-EDMG part, an EDMG preamble, a data part, and TRN field. In some embodiments, the SC mode EDMG SU PPDU may include only some of these fields and/or one or more other fields.

In other embodiments, the SC mode EDMG SU PPDU may include any other additional or alternative fields.

In some demonstrative embodiments, a total number of transmit chains $N_{TX}$ may be maintained constant during transmission, for example, over the different fields of the EDMG SU PPDU.

In some demonstrative embodiments, the pre-EDMG part of the EDMG SU PPDU may be defined, for example, to include the following modulated fields:

$$r_{pre-EDMG}(nT_c) = r_{L-STF}(nT_c) + r_{L-CEF}(nT_c - t_{L-CEF}) + r_{L-Header}(nT_c - t_{L-Header}) + r_{EDMG-Header-A}(nT_c - t_{EDMG-Header-A}) \quad (29)$$

wherein:

$t_{L-CEF} = T_{L-STF}$ is a duration of the L-STF field of the PPDU;

$t_{L-Header} = t_{L-CEF} + T_{L-CEF}$ is a total duration of the L-STF and L-CEF fields of the PPDU; and/or $t_{EDMG-Header-A} = t_{L-Header} + T_{L-Header}$ is a total duration of the L-STF, L-CEF, and L-Header fields of the PPDU.

In some demonstrative embodiments, for example, for digital beamforming transmission of the EDMG SU PPDU, the pre-EDMG part waveform for an $i_{TX}$-th transmit chain may be defined, for example, as follows:

$$r_{pre-EDMG}^{i_{TX}(1)}(nT_c) = [Q]_{i_{TX},1} \cdot r_{pre-EDMG}(nT_c),$$
$$1 \leq i_{TX} \leq N_{TX} \quad (30)$$

wherein:

Q denotes a spatial mapping matrix; and $[\ ]_{m,n}$ denotes a matrix element from an m-th row and an n-th column.

In some demonstrative embodiments, for example, in case of spatial expansion, the pre-EDMG part of PPDU waveform to be transmitted for the $i_{TX}$-th transmit chain may include a cyclic shift $T_{SC}^{i_{TX}}$, which may be configured, for example, to be dependent at least on the particular transmit chain number of the $i_{TX}$-th transmit chain to be used, e.g., as described below.

In some demonstrative embodiments, the cyclic shift $T_{SC}^{i_{TX}}$ may be implemented to include a time shift, which may be, for example, defined in SC chip units, e.g., as described below.

In some demonstrative embodiments, the cyclic shift $T_{SC}^{i_{TX}}$ may include a time shift, which may be defined, for example, in SC time units, for example, as $(i_{TX}-1) \times N_c \times T_c$, wherein $N_c$ may be configured as a predefined factor value, for example, $N_c$ may be equal to 4 chips. For example, T may include a chip time duration. In other embodiments, the cyclic shift $T_{SC}^{i_{TX}}$ may be defined in any other manner.

In some demonstrative embodiments, for example, the pre-EDMG part of the EDMG SU PPDU waveform for the $i_{TX}$-th transmit chain may be determined based on the cyclic shift e.g., $T_{SC}^{i_{TX}}$, as follows:

$$r_{pre-EDMG}^{i_{TX}(1)}(nT_c) = \quad (31)$$
$$\begin{cases} r_{pre-EDMG}(nT_c + T_{SC}^{i_{TX}}), & n = 0, 1, \ldots, N-1-T_{SC}^{i_{TX}}/T_c \\ r_{pre-EDMG}(nT_c - (NT_c - T_{SC}^{i_{TX}})), & n = N - T_{SC}^{i_{TX}}/T_c, \ldots, N-1 \end{cases},$$
$$1 \leq i_{TX} \leq N_{TX}$$

wherein:

$N = \text{length}(r_{pre-EDMG})$

In some demonstrative embodiments, the pre-EDMG waveform for the $i_{TX}$-th transmit chain may be obtained, for example, by up-sampling and filtering and, for example, applying an appropriate carrier frequency shift of the waveform $r_{pre-EDMG}^{i_{TX}(1)}(nT_c)$, e.g., if required.

In some demonstrative embodiments, for example, an up-sampling procedure may be applied, for example, by a factor of $N_{up}$.

In some demonstrative embodiments, for example, a filtering procedure may be performed, for example, with a pulse shaping filter $h_{SCCB}$, which may be defined, for example, at the $N_{up} \times 1.76$ GHz sampling rate or any other rate, e.g., as follows:

$$r_{EDMG}^{i_{TX}(2)}\left(n\frac{T_c}{N_{up}}\right) = \begin{cases} r_{EDMG}^{i_{TX}(1)}\left(n\frac{T_c}{N_{up}}\right), & n = 0, N_{up}, 2*N_{up}... \\ 0 & \text{otherwise} \end{cases} \quad (32)$$

$$r_{EDMG}^{i_{TX}(3)}\left(n\frac{T_c}{N_{up}}\right) = \sum_{k=0}^{K-1} r_{EDMG}^{i_{TX}(2)}\left((n-k)\frac{T_c}{N_{up}}\right) h_{SCCB}(k), n = 0, 1, \ldots$$

-continued $$r_{EDMG}^{i_{TX}(4)}\left(n\frac{T_c}{N_{up}}\right) = r_{EDMG}^{i_{TX}(3)}\left(\left(n + \frac{K-1}{2}\right)\frac{T_c}{N_{up}}\right), n = 0, 1, \ldots$$

wherein:

K denotes a length of the filter $h_{SCCB}$ in samples; and $$r_{pre-EDMG}^{i_{TX}(2)}\left(n\frac{T_c}{N_{up}}\right) = 0, \text{ for } n < 0 \text{ and } n \geq \text{length}\left(r_{pre-EDMG}^{i_{TX}(1)}\right) \times N_{up}$$

In some demonstrative embodiments, the pre-EDMG waveform for the $i_{TX}$-th transmit chain, for example, for transmission over a 2.16 GHz channel, may be defined, for example, as follows:

$$r_{pre-EDMG}^{i_{TX}}\left(n\frac{T_c}{N_{up}}\right) = r_{pre-EDMG}^{i_{TX}(4)}\left(n\frac{T_c}{N_{up}}\right), 1 \leq i_{TX} \leq N_{TX} \quad (33)$$

In some demonstrative embodiments, a pre-EDMG waveform for the $i_{TX}$-th transmit chain, for example, for duplicate transmission over a channel bandwidth including a plurality of 2.16 channel bandwidths, may be defined, for example, based on the channel bandwidth, e.g., as described below.

In some demonstrative embodiments, a pre-EDMG waveform for the $i_{TX}$-th transmit chain, for example, for duplicate transmission over a channel bandwidth including a plurality of 2.16 channel bandwidths, may be defined, for example, as a combination of a plurality of waveforms corresponding to the plurality of 2.16 channel bandwidths, e.g., as described below.

In some demonstrative embodiments, a pre-EDMG waveform for the $i_{TX}$-th transmit chain, for example, for duplicate transmission over a channel bandwidth of 4.32 GHz, may be defined, for example, as follows:

$$r_{pre-EDMG}^{i_{TX}}\left(n\frac{T_c}{N_{up}}\right) = \quad (34)$$

$$r_{pre-EDMG}^{i_{TX}(4)}\left(n\frac{T_c}{N_{up}} + \Delta t_1\right) \cdot \frac{1}{\sqrt{2}} \exp\left(-j2\pi\left(\frac{\Delta F}{2}\right)\left(\frac{T_c}{N_{up}}\right)n\right) + +$$

$$r_{pre-EDMG}^{i_{TX}(4)}\left(n\frac{T_c}{N_{up}} + \Delta t_2\right) \cdot \frac{1}{\sqrt{2}} \exp\left(+j2\pi\left(\frac{\Delta F}{2}\right)\left(\frac{T_c}{N_{up}}\right)n\right), 1 \leq i_{TX} \leq N_{TX}$$

wherein:

ΔF denotes a sub-channel spacing, e.g., a spacing equal to 2.16 GHz or any other spacing;

$\Delta t_1$ and $\Delta t_2$ are in the range [0, $T_c$], and/or any other combination of values and/or ranges may be implemented; and/or the primary channel shall have a zero delay.

In some demonstrative embodiments, a pre-EDMG waveform for the $i_{TX}$-th transmit chain, for example, for duplicate transmission over a channel bandwidth of 6.48 GHz, may be defined, for example, as follows:

$$r_{pre-EDMG}^{i_{TX}}\left(n\frac{T_c}{N_{up}}\right) = r_{pre-EDMG}^{i_{TX}(4)}\left(n\frac{T_c}{N_{up}} + \Delta t_1\right) \cdot \frac{1}{\sqrt{3}} \quad (35)$$

$$\exp\left(-j2\pi\Delta F\left(\frac{T_c}{N_{up}}\right)n\right) + +r_{pre-EDMG}^{i_{TX}(4)}\left(n\frac{T_c}{N_{up}} + \Delta t_2\right) \cdot \frac{1}{\sqrt{3}} + +$$

$$r_{pre-EDMG}^{i_{TX}(4)}\left(n\frac{T_c}{N_{up}} + \Delta t_3\right) \cdot \frac{1}{\sqrt{3}} \exp\left(+j2\pi\Delta F\left(\frac{T_c}{N_{up}}\right)n\right), 1 \leq i_{TX} \leq N_{TX}$$

wherein:

$\Delta t_1$, $\Delta t_2$, and $\Delta t_3$ are in the range [0, $T_c$], and/or any other combination of values and/or ranges may be implemented; and/or the primary channel shall have a zero delay.

In some demonstrative embodiments, a pre-EDMG waveform for the $i_{TX}$-th transmit chain, for example, for duplicate transmission over a channel bandwidth of 8.64 GHz, may be defined, for example, as follows:

$$r_{pre-EDMG}^{i_{TX}}\left(n\frac{T_c}{N_{up}}\right) = r_{pre-EDMG}^{i_{TX}(4)}\left(n\frac{T_c}{N_{up}} + \Delta t_1\right) \cdot \frac{1}{\sqrt{4}} \quad (36)$$

$$\exp\left(-j2\pi\left(\frac{3\Delta F}{2}\right)\left(\frac{T_c}{N_{up}}\right)n\right) + +r_{pre-EDMG}^{i_{TX}(4)}\left(n\frac{T_c}{N_{up}} + \Delta t_2\right) \cdot \frac{1}{\sqrt{4}}$$

$$\exp\left(-j2\pi\left(\frac{\Delta F}{2}\right)\left(\frac{T_c}{N_{up}}\right)n\right) + +r_{pre-EDMG}^{i_{TX}(4)}\left(n\frac{T_c}{N_{up}} + \Delta t_3\right) \cdot \frac{1}{\sqrt{4}}$$

$$\exp\left(+j2\pi\left(\frac{\Delta F}{2}\right)\left(\frac{T_c}{N_{up}}\right)n\right) + +r_{pre-EDMG}^{i_{TX}(4)}\left(n\frac{T_c}{N_{up}} + \Delta t_4\right) \cdot \frac{1}{\sqrt{4}}$$

$$\exp\left(+j2\pi\left(\frac{3\Delta F}{2}\right)\left(\frac{T_c}{N_{up}}\right)n\right), 1 \leq i_{TX} \leq N_{TX}$$

wherein:

$\Delta t_1$, $\Delta t_2$, $\Delta t_3$ and $\Delta t_4$ are in the range [0, $T_c$], and/or any other combination of values and/or ranges may be implemented; and/or the primary channel shall have a zero delay.

In some demonstrative embodiments, a pre-EDMG waveform for the $i_{TX}$-th transmit chain, for example, for duplicate transmission over any other additional or alternative channel bandwidth may be defined, for example, based on one or more of the above definitions.

In some demonstrative embodiments, one or more parameters, which may be implemented for the pre-EDMG waveform, for example, the pulse shaping filter impulse response $h_{SCCB}$ and/or the parameter $N_{up}$, may be, for example, implementation specific.

In some demonstrative embodiments, the EDMG preamble part and the data part of the EDMG SU PPDU may be defined, for example, for the $i_{STS}$-th space-time stream, for example, at a chip rate $N_{CB} \times 1.76$ GHz, e.g., wherein $1 \leq N_{CB} \leq 4$ or any other factor.

In some demonstrative embodiments, the EDMG preamble part and the data part of the EDMG SU PPDU may be defined, for example, to include the following modulated fields:

$$r_{EDMG-Pream,Data}^{i_{STS}}\left(n\frac{T_c}{N_{CB}}\right) = \quad (37)$$

$$r_{EDMG-STF}^{i_{STS}}\left(n\frac{T_c}{N_{CB}}\right) + r_{EDMG-CEF}^{i_{STS}}\left(n\frac{T_c}{N_{CB}} - t_{EDMG-CEF}\right) + +$$

$$r_{Data}^{i_{STS}}\left(n\frac{T_c}{N_{CB}} - t_{Data}\right), 1 \leq i_{STS} \leq N_{STS}$$

wherein:

$t_{EDMG-CEF} = T_{EDMG-STF}$ is a duration of the EDMG-STF field, e.g., field 212 (FIG. 2), of the PPDU; and $t_{Data} = t_{EDMG-CEF} + T_{EDMG-CEF}$ is a total duration of the EDMG-STF and EDMG-CEF, e.g., field 214 (FIG. 2), fields of the PPDU.

In some demonstrative embodiments, for example, in case of direct mapping, indirect mapping, and/or digital beamforming, the EDMG preamble and data part waveform for the $i_{TX}$-th transmit chain, may be defined, for example, as follows:

$$r^{i_{TX}}_{EDMG-Pream,Data}\left(n\frac{T_c}{N_{CB}}\right) = [Q]_{i_{TX},i_{STS}} \cdot r^{i_{STS}}_{EDMG-Pream,Data}\left(n\frac{T_c}{N_{CB}}\right), \quad (38)$$
$$1 \le i_{TX} \le N_{TX}$$

wherein:
Q denotes a spatial mapping matrix; and
[ ]$_{m,n}$ denotes a matrix element from an m-th row and an n-th column.

In some demonstrative embodiments, for example, in case of spatial expansion (e.g., $i_{STS}=1$), the EDMG preamble and data part of PPDU waveform to be transmitted for the $i_{TX}$-th transmit chain may include a cyclic shift $T_{SC}^{i_{TX}}$, which may be configured, for example, to be dependent at least on the particular transmit chain number of the $i_{TX}$-th transmit chain to be used, e.g., as described below.

In some demonstrative embodiments, the cyclic shift $T_{SC}^{i_{TX}}$ may be implemented to include a time shift, which may be, for example, defined in SC chip units, e.g., as described below.

In some demonstrative embodiments, the cyclic shift $T_{SC}^{i_{TX}}$ may include a time shift, which may be defined, for example, in SC time units, for example, as $(i_{TX}-1) \times N_c \times T_c$, wherein $N_c$ may be configured as a predefined factor value, for example, $N_c$ may be equal to 4 chips. For example, $T_c$ may include a chip time duration. In other embodiments, the cyclic shift $T_{SC}^{i_{TX}}$ may be defined in any other manner.

In some demonstrative embodiments, for example, the EDMG preamble and data part of the EDMG SU PPDU waveform for the $i_{TX}$-th transmit chain may be determined based on the cyclic shift $T_{SC}^{i_{TX}}$, e.g., as follows:

$$r^{i_{TX}}_{EDMG-Pream,Data}\left(n\frac{T_c}{N_{CB}}\right) == \begin{cases} r^{i_{STS}=1}_{EDMG-Pream,Data}\left(n\left(\frac{T_c}{N_{CB}}\right) + T_{SC}^{i_{TX}}\right), & n = 0, 1, \ldots, N - 1 - T_{SC}^{i_{TX}}/(T_c/N_{CB}) \\ r^{i_{STS}=1}_{EDMG-Pream,Data}\left(n\left(\frac{T_c}{N_{CB}}\right) - \left(N\left(\frac{T_c}{N_{CB}}\right) - T_{SC}^{i_{TX}}\right)\right), & n = N - T_{SC}^{i_{TX}}/(T_c/T_{CB}), \ldots, N - 1 \end{cases}, 1 \le i_{TX} \le N_{TX} \quad (39)$$

wherein:
N=length($r_{EDMG-Pream,Data}$)

In some demonstrative embodiments, the TRN field $$r^{i_{TX}}_{TRN}\left(n\frac{T_c}{N_{CB}}\right)$$

of the EDMG SU PPDU shall be defined at the SC chip rate equal to $N_{CB} \times 1.76$ GHz, for example, per $i_{TX}$-th transmit chain, e.g., in compliance with an IEEE 802.11ay Specification.

In some demonstrative embodiments, a filtering procedure may be applied to the EDMG preamble, the data part and/or the TRN field, e.g., as described below.

In some demonstrative embodiments, the EDMG preamble, data part, and TRN field for the $i_{TX}$-th transmit chain may be defined, for example, as follows:

$$r^{i_{TX}(1)}_{EDMG-Pream,DATA,TRN}\left(n\frac{T_c}{N_{CB}}\right) = \qquad (40)$$
$$r^{i_{TX}}_{EDMG-Pream,Data}\left(n\frac{T_c}{N_{CB}}\right) + + r^{i_{TX}}_{TRN}\left(n\frac{T_c}{N_{CB}} - t_{TRN}\right),$$
$$1 \le i_{TX} \le N_{TX}$$

wherein:
$t_{TRN} = t_{Data} + T_{Data}$ is a total duration of the EDMG-STF, EDMG-CEF, and data fields of the PPDU.

In some demonstrative embodiments, for example, the EDMG preamble, data, and/or TRN field may be filtered and resampled, for example, with a conversion rate ratio of $N_{up}/N_{CB}$, or any other conversation rate ratio.

In some demonstrative embodiments, for example, the resampling procedure for the ratio $N_{up}/N_{CB}=3/2$ may be defined, for example, as follows:

$$r^{i_{TX}(2)}_{EDMG-Pream,Data,TRN}\left(n\frac{T_c}{3N_{CB}}\right) = \qquad (41)$$
$$\begin{cases} r^{i_{TX}(1)}_{EDMG-Pream,Data,TRN}\left(n\frac{T_c}{3N_{CB}}\right) & n = 0, 3, 6 \ldots \\ 0 & \text{otherwise} \end{cases}$$

$$r^{i_{TX}(3)}_{EDMG-Pream,Data,TRN}\left(n\frac{T_c}{3N_{CB}}\right) = $$
$$\sum_{k=0}^{K-1} r^{i_{TX}(2)}_{EDMG-Pream,Data,TRN}\left((n-k)\frac{T_c}{3N_{CB}}\right) h_{SCCB}(k),$$
$$n = 0, 1, \ldots$$

$$r^{i_{TX}}_{EDMG-Pream,Data,TRN}\left(n\frac{2T_c}{3N_{CB}}\right) = $$
$$r^{i_{TX}(3)}_{EDMG-Pream,Data,TRN}\left(\left(2n + \frac{K-1}{2}\right)\frac{T_c}{3N_{CB}}\right),$$
$$n = 0, 1, \ldots$$

wherein:
K denotes a length of the filter $h_{SCCB}$ in samples; and $$r^{i_{TX}(2)}_{EDMG-Pream,Data,TRN}\left(n\frac{T_c}{3N_{CB}}\right) = 0,$$

for $n < 0$ and $n \ge \text{length}(r^{i_{TX}(1)}_{EDMG-Pream,Data,TRN}) \times 3$ In some demonstrative embodiments, the SC mode EDMG SU PPDU waveform for the $i_{TX}$-th transmit chain may include, for example, a concatenation of the waveforms of the pre-EDMG and EDMG preamble, data, and TRN fields, for example, as follows:

$$r^{i_{TX}}_{PPDU}\left(n\frac{T_c}{N_{up}}\right) = \qquad (42)$$

-continued $$r^{i_{TX}}_{pre-EDMG}\left(n\frac{T_c}{N_{up}}\right) + r^{i_{TX}}_{EDMG-Pream,Data,TRN}\left(n\frac{T_c}{N_{up}} - t_{TRN}\right),$$

$$1 \leq i_{TX} \leq N_{TX}$$

wherein:

$t_{TRN} = t_{Data} + T_{Data}$ is a total duration of the L-STF, L-CEF, L-Header, EDMG-Header-A, EDMG-STF, EDMG-CEF, and data fields of the PPDU.

In some demonstrative embodiments, one or more parameters, which may be implemented for the EDMG SU PPDU waveform, for example, the pulse shaping filter impulse response $h_{SCCB}$ and/or the parameter $N_{up}$, may be, for example, implementation specific.

In some demonstrative embodiments, devices 102 and/or 140 may be configured to generate, transmit, receive and/or process an EDMG MU PPDU transmission, e.g., as described below.

In some demonstrative embodiments, devices 102 and/or 140 may be configured to generate, transmit, receive and/or process an EDMG MU non-Frequency Division Multiple Access (non-FDMA) PPDU transmission, e.g., as described below.

In some demonstrative embodiments, devices 102 and/or 140 may be configured to generate, transmit, receive and/or process a SC mode EDMG MU non-FDMA PPDU to be transmitted over a 2.16 GHz channel, a 4.32 GHz channel, a 6.48 GHz channel, a 8.64 GHz channel, and/or any other channel, with multiple space-time streams ($i_{STS}>1$), for example, for two or more users ($i_{user}>1$), e.g., as described below.

In some demonstrative embodiments, a SC mode EDMG MU non-FDMA PPDU to be transmitted over a 2.16 GHz channel, a 4.32 GHz channel, a 6.48 GHz channel, a 8.64 GHz channel, and/or any other channel, with multiple space-time streams ($i_{STS}>1$), for example, for two or more users ($i_{user}>1$), may include a pre-EDMG part, e.g., including fields 202, 204, 206, and/or 208 (FIG. 2), an EDMG preamble, e.g., including fields 212 and/or 214 (FIG. 2), an EDMG Header B, e.g., EDMG heard B field 216 (FIG. 2), a data part, e.g., data field 218 (FIG. 2), and a TRN field, e.g., TRN field 224 (FIG. 2). In some embodiments, the SC mode EDMG MU PPDU may include only some of these fields and/or one or more other fields.

In other embodiments, the SC mode EDMG MU non-FDMA PPDU may include any other additional or alternative fields.

In some demonstrative embodiments, a total number of transmit chains $N_{TX}$ may be maintained constant during transmission, for example, over the different fields of the SC mode EDMG MU non-FDMA PPDU.

In some demonstrative embodiments, the pre-EDMG part of the EDMG MU PPDU may be defined, for example, to include one or more of the modulated fields, for example, as described above with respect to the EDMG SU PPDU.

In some demonstrative embodiments, the EDMG preamble part, the EDMG Header B, and the data part of the EDMG MU PPDU may be defined, for example, for the $i_{STS}$-th space-time stream at the chip rate $N_{CB} \times 1.76$ GHz, e.g., wherein $1 \leq N_{CB} \leq 4$ or any other factor, and may include, for example, the following modulated fields:

$$r^{i_{STS}}_{EDMG-Pream,EDMG-Header-B,Data}\left(n\frac{T_c}{N_{CB}}\right) = \quad (43)$$

$$r^{i_{STS}}_{EDMG-STF}\left(n\frac{T_c}{N_{CB}}\right) + r^{i_{STS}}_{EDMG-CEF}\left(n\frac{T_c}{N_{CB}} - t_{EDMG-CEF}\right) + +$$

$$r^{i_{STS}}_{EDMG-Header-B}\left(n\frac{T_c}{N_{CB}} - t_{EDMG-Header-B}\right) +$$

$$r^{i_{STS}}_{Data}\left(n\frac{T_c}{N_{CB}} - t_{Data}\right),$$

$$1 \leq i_{STS} \leq N_{STS}$$

wherein:

$t_{EDMG-CEF} = T_{EDMG-STF}$ is a duration of the EDMG-STF field, e.g., field 212 (FIG. 2), of the PPDU;

$t_{EDMG-Header-B} = t_{EDMG-CEF} + T_{EDMG-CEF}$ is a total duration of the EDMG-STF and EDMG-CEF, e.g., field 214 (FIG. 2), fields of the PPDU; and $t_{Data} = t_{EDMG-CEF} + T_{EDMG-CEF}$ is a total duration of the EDMG-STF, EDMG-CEF, and EDMG-Header-B fields of the PPDU.

In some demonstrative embodiments, for example, in case of direct mapping, indirect mapping, and/or digital beamforming, the EDMG preamble, EDMG Header B, and data part waveform for the $i_{TX}$-th transmit chain, may be defined, for example, as follows:

$$r^{i_{TX}}_{EDMG-Pream,EDMG-Header-B,Data}\left(n\frac{T_c}{N_{CB}}\right) == \quad (44)$$

$$[Q]_{i_{TX},i_{STS}} \cdot r^{i_{STS}}_{EDMG-Pream,EDMG-Header-B,Data}\left(n\frac{T_c}{N_{CB}}\right),$$

$$1 \leq i_{TX} \leq N_{TX}$$

wherein:
Q denotes a spatial mapping matrix; and
$[\ ]_{m,n}$ denotes a matrix element from an m-th row and an n-th column.

$$r^{i_{TX}}_{TRN}\left(n\frac{T_c}{N_{CB}}\right)$$

In some demonstrative embodiments, the TRN field of the EDMG MU PPDU shall be defined at the SC chip rate equal to $N_{CB} \times 1.76$ GHz, for example, per $i_{TX}$-th transmit chain, e.g., in compliance with an IEEE 802.1 lay Specification.

In some demonstrative embodiments, a filtering procedure may be applied to the EDMG preamble, the EDMG Header B, the data part and/or the TRN field, e.g., as described below.

In some demonstrative embodiments, the EDMG preamble, the EDMG Header B, the data part, and TRN field for the $i_{TX}$-th transmit chain may be defined, for example, as follows:

$$r^{i_{TX}(1)}_{EDMG-Pream,EDMG-Header-B,Data,TRN}\left(n\frac{T_c}{N_{CB}}\right) == \quad (45)$$

$$r^{i_{TX}}_{EDMG-Pream,EDMG-Header-B,Data}\left(n\frac{T_c}{N_{CB}}\right) + + r^{i_{TX}}_{TRN}\left(n\frac{T_c}{N_{CB}} - t_{TRN}\right),$$

$$1 \leq i_{TX} \leq N_{TX}$$

wherein:

$t_{TRN} = t_{Data} + T_{Data}$ is a total duration of the EDMG-STF, EDMG-CEF, EDMG-Header-B, and data fields of the PPDU.

In some demonstrative embodiments, for example, the EDMG preamble, EDMG Header B, the data field, and/or TRN field may be filtered and resampled, for example, with a conversion rate ratio of $N_{up}/N_{CB}$, or any other conversation rate ratio.

In some demonstrative embodiments, for example, the resampling procedure for the ratio $N_{up}/N_{CB} = 3/2$ may be defined, for example, as follows:

$$r_{EDMG-Pream,Data,TRN}^{i_{TX}(2)}\left(n\frac{T_c}{3N_{CB}}\right) = \tag{46}$$

$$\begin{cases} r_{EDMG-Pream,Data,TRN}^{i_{TX}(1)}\left(n\frac{T_c}{3N_{CB}}\right) & n = 0, 3, 6 \ldots \\ 0 & \text{otherwise} \end{cases}$$

$$r_{EDMG-Pream,Data,TRN}^{i_{TX}(3)}\left(n\frac{T_c}{3N_{CB}}\right) =$$

$$\sum_{k=0}^{K-1} r_{EDMG-Pream,Data,TRN}^{i_{TX}(2)}\left((n-k)\frac{T_c}{3N_{CB}}\right) h_{SCCB}(k),$$

$n = 0, 1, \ldots$ $$r_{EDMG-Pream,Data,TRN}^{i_{TX}}\left(n\frac{2T_c}{3N_{CB}}\right) =$$

$$r_{EDMG-Pream,Data,TRN}^{i_{TX}(3)}\left(\left(2n + \frac{K-1}{2}\right)\frac{T_c}{3N_{CB}}\right),$$

$n = 0, 1, \ldots$ wherein:

K denotes a length of the filter $h_{SCCB}$ in samples; and $$r_{EDMG-Pream,Data,TRN}^{i_{TX}(2)}\left(n\frac{T_c}{3N_{CB}}\right) = 0,$$

for $n < 0$ and $n \geq \text{length}(r_{EDMG-Pream,Data,TRN}^{i_{TX}(1)}) \times 3$.

In some demonstrative embodiments, the SC mode EDMG MU PPDU waveform for the $i_{TX}$-th transmit chain may include, for example, a concatenation of the waveforms of the pre-EDMG and EDMG preamble, EDMG Header B, data, and TRN fields, for example, as follows:

$$r_{PPDU}^{i_{TX}}\left(n\frac{T_c}{N_{up}}\right) = \tag{47}$$

$$r_{pre-EDMG}^{i_{TX}}\left(n\frac{T_c}{N_{up}}\right) + + r_{EDMG-Pream,Header-B,Data,TRN}^{i_{TX}}\left(n\frac{T_c}{N_{up}} - t_{TRN}\right),$$

$1 \leq i_{TX} \leq N_{TX}$ wherein:

$t_{TRN} = t_{Data} + T_{Data}$ is a total duration of the L-STF, L-CEF, L-Header, EDMG-Header-A, EDMG-STF, EDMG-CEF, EDMG-Header-B, and data fields of the PPDU.

In some demonstrative embodiments, one or more parameters, which may be implemented for the EDMG MU PPDU waveform, for example, the pulse shaping filter impulse response $h_{SCCB}$ and/or the parameter $N_{up}$, may be, for example, implementation specific.

Figure 5:
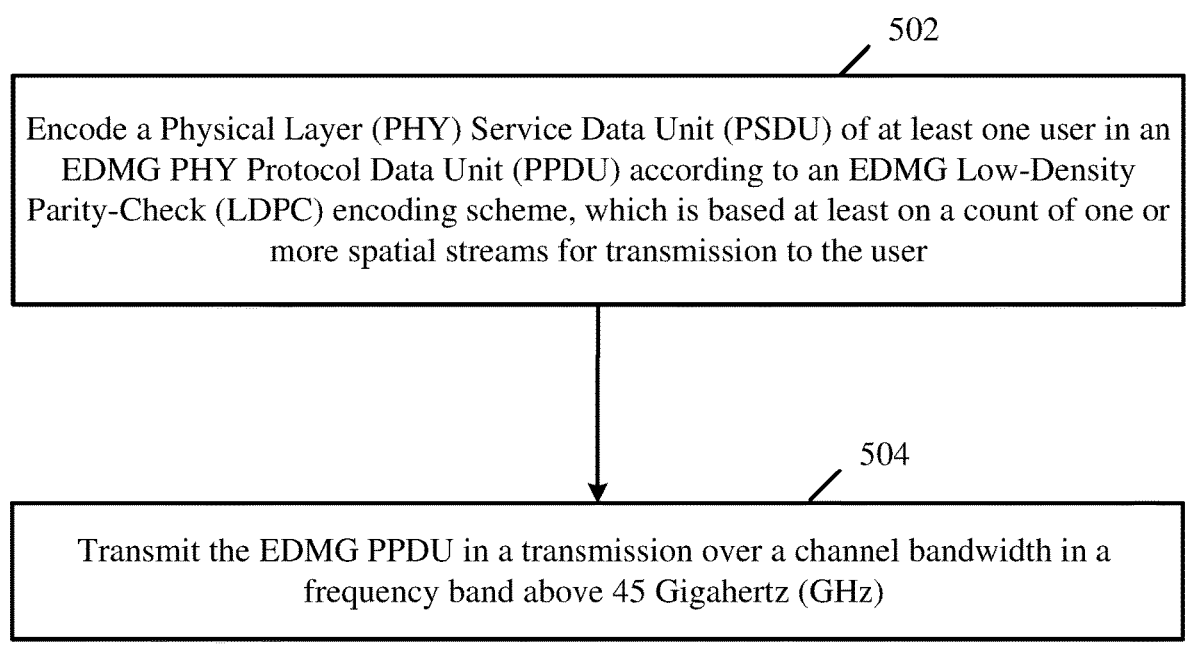
FIG. 5 is a schematic flow-chart illustration of a method of communicating a PPDU, in accordance with some demonstrative embodiments.

Reference is made to FIG. 5, which schematically illustrates a method of communicating a PPDU, in accordance with some demonstrative embodiments. For example, one or more of the operations of the method of FIG. 5 may be performed by one or more elements of a system, for example, system 100 (FIG. 1), for example, one or more wireless devices, e.g., device 102 (FIG. 1), and/or device 140 (FIG. 1), a controller, e.g., controller 124 (FIG. 1) and/or controller 154 (FIG. 1), a radio, e.g., radio 114 (FIG. 1) and/or radio 144 (FIG. 1), and/or a message processor, e.g., message processor 128 (FIG. 1) and/or message processor 158 (FIG. 1).

As indicated at block 502, the method may include encoding a PSDU of at least one user in an EDMG PPDU according to an EDMG LDPC encoding scheme, which is based at least on a count of one or more spatial streams for transmission to the user. For example, controller 124 (FIG. 1) may be configured to cause, trigger, and/or control the wireless station implemented by device 102 (FIG. 1) to encode the PSDU of the at least one user in the EDMG PPDU according to the EDMG LDPC encoding scheme, which is based at least on a count of one or more spatial streams for transmission to the user, e.g., as described above.

As indicated at block 504, the method may include transmitting the EDMG PPDU in a transmission over a channel bandwidth in a frequency band above 45 GHz. For example, controller 124 (FIG. 1) may be configured to cause, trigger, and/or control the wireless station implemented by device 102 (FIG. 1) to transmit the EDMG PPDU in the transmission over the channel bandwidth in the frequency band above 45 GHz, e.g., as described above.

Figure 6:
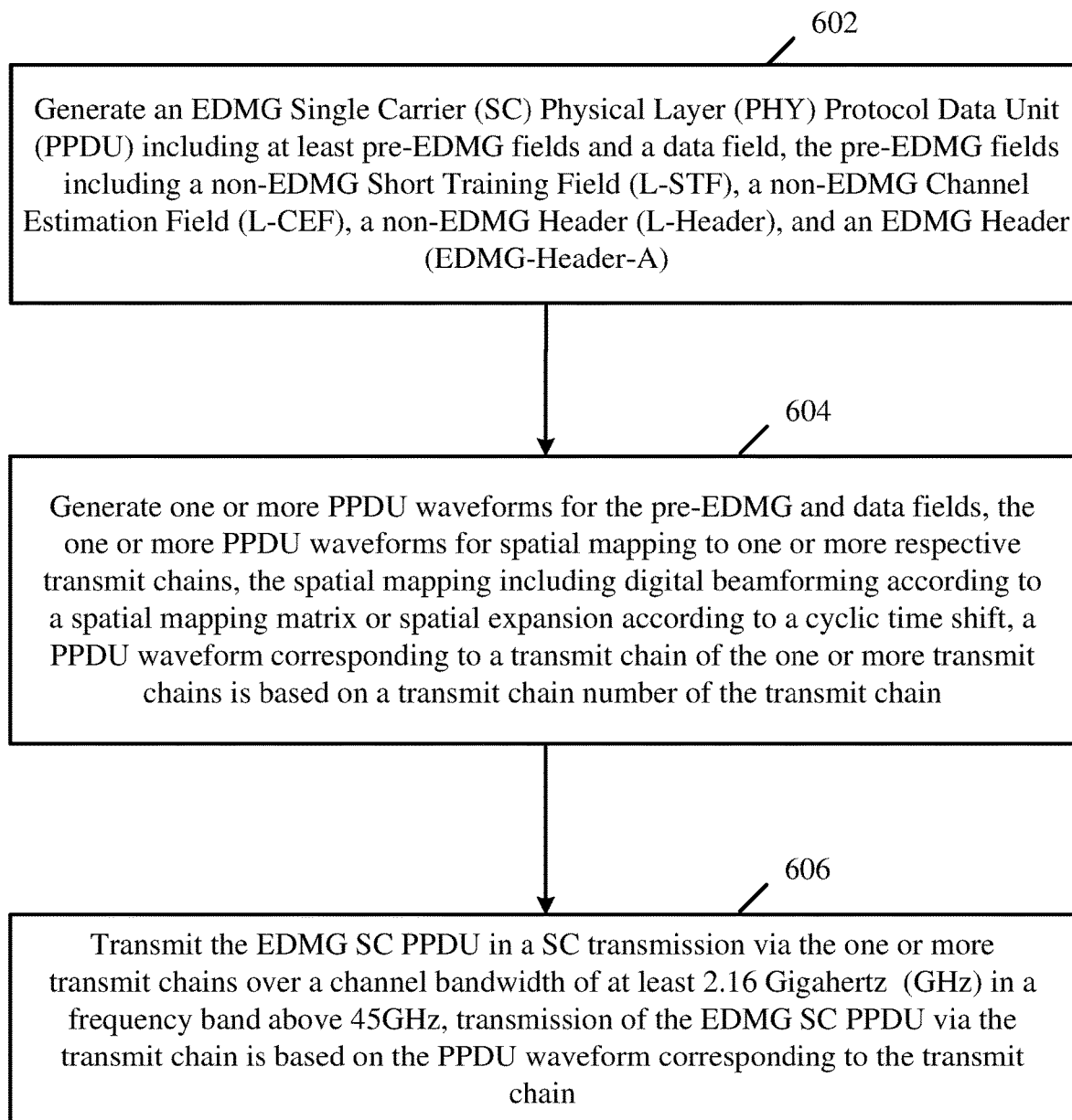
FIG. 6 is a schematic flow-chart illustration of a method of communicating a PPDU, in accordance with some demonstrative embodiments.

Reference is made to FIG. 6, which schematically illustrates a method of communicating a PPDU, in accordance with some demonstrative embodiments. For example, one or more of the operations of the method of FIG. 6 may be performed by one or more elements of a system, e.g., system 100 (FIG. 1), for example, one or more wireless devices, e.g., device 102 (FIG. 1), and/or device 140 (FIG. 1), a controller, e.g., controller 124 (FIG. 1) and/or controller 154 (FIG. 1), a radio, e.g., radio 114 (FIG. 1) and/or radio 144 (FIG. 1), and/or a message processor, e.g., message processor 128 (FIG. 1) and/or message processor 158 (FIG. 1).

As indicated at block 602, the method may include generating an EDMG SC PPDU including at least pre-EDMG fields and a data field, the pre-EDMG fields including a L-STF, a L-CEF, a L-Header, and an EDMG-Header-A. For example, controller 124 (FIG. 1) may be configured to cause, trigger, and/or control the wireless station implemented by device 102 (FIG. 1) to generate the EDMG SC PPDU including at least the pre-EDMG fields and the data field, for example, L-STF 202 (FIG. 2), L-CEF 204 (FIG. 2), L-Header 206 (FIG. 2), EDMG Header A 208 (FIG. 2) and/or data field 218 (FIG. 2), e.g., as described above.

As indicated at block 604, the method may include generating one or more PPDU waveforms for the pre-EDMG and data fields, the one or more PPDU waveforms for spatial mapping to one or more respective transmit chains, the spatial mapping including digital beamforming according to a spatial mapping matrix or spatial expansion according to a cyclic time shift. For example, controller 124 (FIG. 1) may be configured to cause, trigger, and/or control the wireless station implemented by device 102 (FIG. 1) to generate the one or more PPDU waveforms for the pre-EDMG and data fields for spatial mapping to one or more respective transmit chains with the digital beamforming or the spatial expansion, e.g., as described above.

In some demonstrative embodiments, a PPDU waveform corresponding to a transmit chain of the one or more transmit chains is based on a transmit chain number of the transmit chain, e.g., as described above.

As indicated at block 606, the method may include transmitting the EDMG SC PPDU in a SC transmission via the one or more transmit chains over a channel bandwidth of at least 2.16 GHz in a frequency band above 45 GHz, wherein, for example, transmission of the EDMG SC PPDU via the transmit chain is based on the PPDU waveform corresponding to the transmit chain. For example, controller 124 (FIG. 1) may be configured to cause, trigger, and/or control the wireless station implemented by device 102 (FIG. 1) to transmit the EDMG SC PPDU in the SC transmission via the one or more transmit chains over the channel bandwidth of the at least 2.16 GHz in the frequency band above 45 GHz, e.g., as described above.

Figure 7:
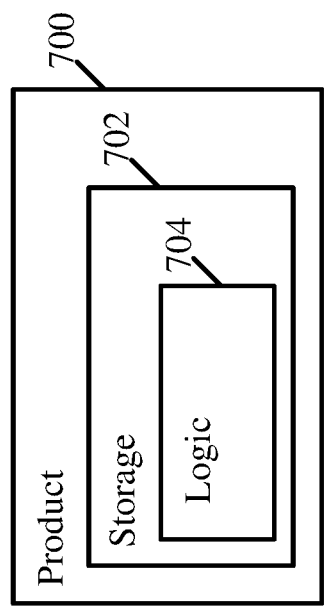
FIG. 7 is a schematic illustration of a product of manufacture, in accordance with some demonstrative embodiments.

Reference is made to FIG. 7, which schematically illustrates a product of manufacture 700, in accordance with some demonstrative embodiments. Product 700 may include one or more tangible computer-readable ("machine-readable") non-transitory storage media 702, which may include computer-executable instructions, e.g., implemented by logic 704, operable to, when executed by at least one computer processor, enable the at least one computer processor to implement one or more operations at device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), message processor 128 (FIG. 1), message processor 158 (FIG. 1), controller 124 (FIG. 1), and/or controller 154 (FIG. 1), to cause device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), message processor 128 (FIG. 1), message processor 158 (FIG. 1), controller 124 (FIG. 1), and/or controller 154 (FIG. 1) to perform, trigger and/or implement one or more operations and/or functionalities, and/or to perform, trigger and/or implement one or more operations and/or functionalities described with reference to the FIGS. 1, 2, 3, 4, 5, and/or 6, and/or one or more operations described herein. The phrases "non-transitory machine-readable medium" and "computer-readable non-transitory storage media" may be directed to include all machine and/or computer readable media, with the sole exception being a transitory propagating signal.

In some demonstrative embodiments, product 700 and/or machine readable storage media 702 may include one or more types of computer-readable storage media capable of storing data, including volatile memory, non-volatile memory, removable or non-removable memory, erasable or non-erasable memory, writeable or re-writeable memory, and the like. For example, machine readable storage media 402 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 704 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 704 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

EXAMPLES

The following examples pertain to further embodiments.

Example 1 includes an apparatus comprising logic and circuitry configured to cause an Enhanced Directional Multi-Gigabit (DMG) (EDMG) station (STA) to encode a Physical Layer (PHY) Service Data Unit (PSDU) of at least one user in an EDMG PHY Protocol Data Unit (PPDU) according to an EDMG Low-Density Parity-Check (LDPC) encoding scheme, which is based at least on a count of one or more spatial streams for transmission to the user; and transmit the EDMG PPDU in a transmission over a channel bandwidth in a frequency band above 45 Gigahertz (GHz).

Example 2 includes the subject matter of Example 1, and optionally, wherein the apparatus is configured to cause the EDMG STA to encode the PSDU of the user according to a count of data pad zero bits for the user, the count of data pad zero bits for the user is based on a number of LDPC codewords for the user over the one or more spatial streams.

Example 3 includes the subject matter of Example 2, and optionally, wherein the apparatus is configured to cause the EDMG STA to generate scrambled PSDU bits for the user based on the PSDU for the user and the data pad zero bits for the user, to generate an LDPC coded bit stream for the user based on the scrambled PSDU bits for the user, and to concatenate the LDPC coded bit stream for the user with coded pad zero bits for the user to provide an integer number of symbols, a count of the coded pad zero bits for the user is based on a count of symbols for the user.

Example 4 includes the subject matter of Example 3, and optionally, wherein the apparatus is configured to cause the EDMG STA to determine the count of symbols for the user based on a count of coded bits per symbol for the user and a spatial stream of the one or more spatial streams.

Example 5 includes the subject matter of Example 3 or 4, and optionally, wherein the apparatus is configured to cause the EDMG STA to convert the scrambled PSDU for the user into a plurality of LDPC codewords according to a codeword length and a code rate, and to generate the LDPC coded bit stream by concatenating the plurality of LDPC codewords.

Example 6 includes the subject matter of Example 5, and optionally, wherein the codeword length is 672, 1344, 624, or 1248.

Example 7 includes the subject matter of Example 5 or 6, and optionally, wherein the code rate is 7/8.

Example 8 includes the subject matter of any one of Examples 1-7, and optionally, wherein the apparatus is configured to cause the EDMG STA to encode the PSDU for the user into an encoded data field over a plurality of spatial streams for the user such that the encoded data field has a same length in each of the plurality of spatial streams.

Example 9 includes the subject matter of any one of Examples 1-8, and optionally, wherein the apparatus is configured to cause the EDMG STA to map the one or more spatial streams for the user to one or more space-time streams.

Example 10 includes the subject matter of any one of Examples 1-9, and optionally, wherein the EDMG PPDU comprises an EDMG Single User (SU) PPDU.

Example 11 includes the subject matter of any one of Examples 1-9, and optionally, wherein the EDMG PPDU comprises an EDMG Multi User (MU) PPDU comprising a plurality of user PPDUs to a respective plurality of users.

Example 12 includes the subject matter of Example 11, and optionally, wherein the apparatus is configured to cause the EDMG STA to align all of the plurality of user PPDUs in time.

Example 13 includes the subject matter of Example 12, and optionally, wherein the apparatus is configured to cause the EDMG STA to align the user PPDUs by padding one or more PSDUs in the MU PPDU.

Example 14 includes the subject matter of any one of Examples 11-13, and optionally, wherein the apparatus is configured to cause the EDMG STA to, when the EDMG PPDU comprises a Single Carrier (SC) PPDU, determine a maximum number of SC symbol blocks over all users, and determine a count of pad SC symbol blocks for the user based on the maximum number of SC symbol blocks and a count of SC symbol blocks for the user.

Example 15 includes the subject matter of Example 14, and optionally, wherein the apparatus is configured to cause the EDMG STA to determine the count of pad SC symbol blocks for the user by subtracting from the maximum number of SC symbol blocks the count of SC symbol blocks for the user.

Example 16 includes the subject matter of Example 14 or 15, and optionally, wherein the apparatus is configured to cause the EDMG STA to update a number of coded pad zero bits for the user based on an updated count of SC symbol blocks for the user which is equal to the maximum number of SC symbol blocks.

Example 17 includes the subject matter of any one of Examples 11-13, and optionally, wherein the apparatus is configured to cause the EDMG STA to, when the EDMG PPDU comprises an Orthogonal Frequency Divisional Multiplexing (OFDM) PPDU, determine a maximum number of OFDM symbols over all users, and determine a count of pad OFDM symbols for the user based on the maximum number of OFDM symbols and a count of OFDM symbols for the user.

Example 18 includes the subject matter of Example 17, and optionally, wherein the apparatus is configured to cause the EDMG STA to determine the count of pad OFDM symbols for the user by subtracting from the maximum number of OFDM symbols the count of OFDM symbols for the user.

Example 19 includes the subject matter of Example 17 or 18, and optionally, wherein the apparatus is configured to cause the EDMG STA to update a number of coded pad zero bits for the user based on an updated count of OFDM symbols for the user which is equal to the maximum number of OFDM symbols.

Example 20 includes the subject matter of any one of Examples 1-19, and optionally, wherein the EDMG PPDU comprises a Single Carrier (SC) PPDU, the transmission comprising a SC transmission.

Example 21 includes the subject matter of any one of Examples 1-19, and optionally, wherein the EDMG PPDU comprises an Orthogonal Frequency Divisional Multiplexing (OFDM) PPDU, the transmission comprising an OFDM transmission.

Example 22 includes the subject matter of any one of Examples 1-21, and optionally, comprising a radio.

Example 23 includes the subject matter of any one of Examples 1-22, and optionally, comprising one or more antennas, a memory and a processor.

Example 24 includes a system of wireless communication comprising an Enhanced Directional Multi-Gigabit (DMG) (EDMG) station (STA), the EDMG STA comprising one or more antennas; a radio; a memory; a processor; and a controller configured to cause the EDMG STA to encode a Physical Layer (PHY) Service Data Unit (PSDU) of at least one user in an EDMG PHY Protocol Data Unit (PPDU) according to an EDMG Low-Density Parity-Check (LDPC) encoding scheme, which is based at least on a count of one or more spatial streams for transmission to the user; and transmit the EDMG PPDU in a transmission over a channel bandwidth in a frequency band above 45 Gigahertz (GHz).

Example 25 includes the subject matter of Example 24, and optionally, wherein the controller is configured to cause the EDMG STA to encode the PSDU of the user according to a count of data pad zero bits for the user, the count of data pad zero bits for the user is based on a number of LDPC codewords for the user over the one or more spatial streams.

Example 26 includes the subject matter of Example 25, and optionally, wherein the controller is configured to cause the EDMG STA to generate scrambled PSDU bits for the user based on the PSDU for the user and the data pad zero bits for the user, to generate an LDPC coded bit stream for the user based on the scrambled PSDU bits for the user, and to concatenate the LDPC coded bit stream for the user with coded pad zero bits for the user to provide an integer number of symbols, a count of the coded pad zero bits for the user is based on a count of symbols for the user.

Example 27 includes the subject matter of Example 26, and optionally, wherein the controller is configured to cause the EDMG STA to determine the count of symbols for the user based on a count of coded bits per symbol for the user and a spatial stream of the one or more spatial streams.

Example 28 includes the subject matter of Example 26 or 27, and optionally, wherein the controller is configured to cause the EDMG STA to convert the scrambled PSDU for the user into a plurality of LDPC codewords according to a codeword length and a code rate, and to generate the LDPC coded bit stream by concatenating the plurality of LDPC codewords.

Example 29 includes the subject matter of Example 28, and optionally, wherein the codeword length is 672, 1344, 624, or 1248.

Example 30 includes the subject matter of Example 28 or 29, and optionally, wherein the code rate is 7/8.

Example 31 includes the subject matter of any one of Examples 24-30, and optionally, wherein the controller is configured to cause the EDMG STA to encode the PSDU for the user into an encoded data field over a plurality of spatial streams for the user such that the encoded data field has a same length in each of the plurality of spatial streams.

Example 32 includes the subject matter of any one of Examples 24-31, and optionally, wherein the controller is configured to cause the EDMG STA to map the one or more spatial streams for the user to one or more space-time streams.

Example 33 includes the subject matter of any one of Examples 24-32, and optionally, wherein the EDMG PPDU comprises an EDMG Single User (SU) PPDU.

Example 34 includes the subject matter of any one of Examples 24-32, and optionally, wherein the EDMG PPDU comprises an EDMG Multi User (MU) PPDU comprising a plurality of user PPDUs to a respective plurality of users.

Example 35 includes the subject matter of Example 34, and optionally, wherein the controller is configured to cause the EDMG STA to align all of the plurality of user PPDUs in time.

Example 36 includes the subject matter of Example 35, and optionally, wherein the controller is configured to cause the EDMG STA to align the user PPDUs by padding one or more PSDUs in the MU PPDU.

Example 37 includes the subject matter of any one of Examples 34-36, and optionally, wherein the controller is configured to cause the EDMG STA to, when the EDMG PPDU comprises a Single Carrier (SC) PPDU, determine a maximum number of SC symbol blocks over all users, and determine a count of pad SC symbol blocks for the user based on the maximum number of SC symbol blocks and a count of SC symbol blocks for the user.

Example 38 includes the subject matter of Example 37, and optionally, wherein the controller is configured to cause the EDMG STA to determine the count of pad SC symbol blocks for the user by subtracting from the maximum number of SC symbol blocks the count of SC symbol blocks for the user.

Example 39 includes the subject matter of Example 37 or 38, and optionally, wherein the controller is configured to cause the EDMG STA to update a number of coded pad zero bits for the user based on an updated count of SC symbol blocks for the user which is equal to the maximum number of SC symbol blocks.

Example 40 includes the subject matter of any one of Examples 34-36, and optionally, wherein the controller is configured to cause the EDMG STA to, when the EDMG PPDU comprises an Orthogonal Frequency Divisional Multiplexing (OFDM) PPDU, determine a maximum number of OFDM symbols over all users, and determine a count of pad OFDM symbols for the user based on the maximum number of OFDM symbols and a count of OFDM symbols for the user.

Example 41 includes the subject matter of Example 40, and optionally, wherein the controller is configured to cause the EDMG STA to determine the count of pad OFDM symbols for the user by subtracting from the maximum number of OFDM symbols the count of OFDM symbols for the user.

Example 42 includes the subject matter of Example 40 or 41, and optionally, wherein the controller is configured to cause the EDMG STA to update a number of coded pad zero bits for the user based on an updated count of OFDM symbols for the user which is equal to the maximum number of OFDM symbols.

Example 43 includes the subject matter of any one of Examples 24-42, and optionally, wherein the EDMG PPDU comprises a Single Carrier (SC) PPDU, the transmission comprising a SC transmission.

Example 44 includes the subject matter of any one of Examples 24-42, and optionally, wherein the EDMG PPDU comprises an Orthogonal Frequency Divisional Multiplexing (OFDM) PPDU, the transmission comprising an OFDM transmission.

Example 45 includes a method to be performed at an Enhanced Directional Multi-Gigabit (DMG) (EDMG) station (STA), the method comprising encoding a Physical Layer (PHY) Service Data Unit (PSDU) of at least one user in an EDMG PHY Protocol Data Unit (PPDU) according to an EDMG Low-Density Parity-Check (LDPC) encoding scheme, which is based at least on a count of one or more spatial streams for transmission to the user; and transmitting the EDMG PPDU in a transmission over a channel bandwidth in a frequency band above 45 Gigahertz (GHz).

Example 46 includes the subject matter of Example 45, and optionally, comprising encoding the PSDU of the user according to a count of data pad zero bits for the user, the count of data pad zero bits for the user is based on a number of LDPC codewords for the user over the one or more spatial streams.

Example 47 includes the subject matter of Example 46, and optionally, comprising generating scrambled PSDU bits for the user based on the PSDU for the user and the data pad zero bits for the user, generating an LDPC coded bit stream for the user based on the scrambled PSDU bits for the user, and concatenating the LDPC coded bit stream for the user with coded pad zero bits for the user to provide an integer number of symbols, a count of the coded pad zero bits for the user is based on a count of symbols for the user.

Example 48 includes the subject matter of Example 47, and optionally, comprising determining the count of symbols for the user based on a count of coded bits per symbol for the user and a spatial stream of the one or more spatial streams.

Example 49 includes the subject matter of Example 47 or 48, and optionally, comprising converting the scrambled PSDU for the user into a plurality of LDPC codewords according to a codeword length and a code rate, and generating the LDPC coded bit stream by concatenating the plurality of LDPC codewords.

Example 50 includes the subject matter of Example 49, and optionally, wherein the codeword length is 672, 1344, 624, or 1248.

Example 51 includes the subject matter of Example 49 or 50, and optionally, wherein the code rate is 7/8.

Example 52 includes the subject matter of any one of Examples 45-51, and optionally, comprising encoding the PSDU for the user into an encoded data field over a plurality of spatial streams for the user such that the encoded data field has a same length in each of the plurality of spatial streams.

Example 53 includes the subject matter of any one of Examples 45-52, and optionally, comprising mapping the one or more spatial streams for the user to one or more space-time streams.

Example 54 includes the subject matter of any one of Examples 45-53, and optionally, wherein the EDMG PPDU comprises an EDMG Single User (SU) PPDU.

Example 55 includes the subject matter of any one of Examples 45-53, and optionally, wherein the EDMG PPDU comprises an EDMG Multi User (MU) PPDU comprising a plurality of user PPDUs to a respective plurality of users.

Example 56 includes the subject matter of Example 55, and optionally, comprising aligning all of the plurality of user PPDUs in time.

Example 57 includes the subject matter of Example 56, and optionally, comprising aligning the user PPDUs by padding one or more PSDUs in the MU PPDU.

Example 58 includes the subject matter of any one of Examples 55-57, and optionally, comprising, when the EDMG PPDU comprises a Single Carrier (SC) PPDU, determining a maximum number of SC symbol blocks over all users, and determining a count of pad SC symbol blocks for the user based on the maximum number of SC symbol blocks and a count of SC symbol blocks for the user.

Example 59 includes the subject matter of Example 58, and optionally, comprising determining the count of pad SC symbol blocks for the user by subtracting from the maximum number of SC symbol blocks the count of SC symbol blocks for the user.

Example 60 includes the subject matter of Example 58 or 59, and optionally, comprising updating a number of coded pad zero bits for the user based on an updated count of SC symbol blocks for the user which is equal to the maximum number of SC symbol blocks.

Example 61 includes the subject matter of any one of Examples 55-57, and optionally, comprising, when the EDMG PPDU comprises an Orthogonal Frequency Divisional Multiplexing (OFDM) PPDU, determining a maximum number of OFDM symbols over all users, and determining a count of pad OFDM symbols for the user based on the maximum number of OFDM symbols and a count of OFDM symbols for the user.

Example 62 includes the subject matter of Example 61, and optionally, comprising determining the count of pad OFDM symbols for the user by subtracting from the maximum number of OFDM symbols the count of OFDM symbols for the user.

Example 63 includes the subject matter of Example 61 or 62, and optionally, comprising updating a number of coded pad zero bits for the user based on an updated count of OFDM symbols for the user which is equal to the maximum number of OFDM symbols.

Example 64 includes the subject matter of any one of Examples 45-63, and optionally, wherein the EDMG PPDU comprises a Single Carrier (SC) PPDU, the transmission comprising a SC transmission.

Example 65 includes the subject matter of any one of Examples 45-63, and optionally, wherein the EDMG PPDU comprises an Orthogonal Frequency Divisional Multiplexing (OFDM) PPDU, the transmission comprising an OFDM transmission.

Example 66 includes a product comprising one or more tangible computer-readable non-transitory storage media comprising computer-executable instructions operable to, when executed by at least one processor, enable the at least one processor to cause an Enhanced Directional Multi-Gigabit (DMG) (EDMG) station (STA) to encode a Physical Layer (PHY) Service Data Unit (PSDU) of at least one user in an EDMG PHY Protocol Data Unit (PPDU) according to an EDMG Low-Density Parity-Check (LDPC) encoding scheme, which is based at least on a count of one or more spatial streams for transmission to the user; and transmit the EDMG PPDU in a transmission over a channel bandwidth in a frequency band above 45 Gigahertz (GHz).

Example 67 includes the subject matter of Example 66, and optionally, wherein the instructions, when executed, cause the EDMG STA to encode the PSDU of the user according to a count of data pad zero bits for the user, the count of data pad zero bits for the user is based on a number of LDPC codewords for the user over the one or more spatial streams.

Example 68 includes the subject matter of Example 67, and optionally, wherein the instructions, when executed, cause the EDMG STA to generate scrambled PSDU bits for the user based on the PSDU for the user and the data pad zero bits for the user, to generate an LDPC coded bit stream for the user based on the scrambled PSDU bits for the user, and to concatenate the LDPC coded bit stream for the user with coded pad zero bits for the user to provide an integer number of symbols, a count of the coded pad zero bits for the user is based on a count of symbols for the user.

Example 69 includes the subject matter of Example 68, and optionally, wherein the instructions, when executed, cause the EDMG STA to determine the count of symbols for the user based on a count of coded bits per symbol for the user and a spatial stream of the one or more spatial streams.

Example 70 includes the subject matter of Example 68 or 69, and optionally, wherein the instructions, when executed, cause the EDMG STA to convert the scrambled PSDU for the user into a plurality of LDPC codewords according to a codeword length and a code rate, and to generate the LDPC coded bit stream by concatenating the plurality of LDPC codewords.

Example 71 includes the subject matter of Example 70, and optionally, wherein the codeword length is 672, 1344, 624, or 1248.

Example 72 includes the subject matter of Example 70 or 71, and optionally, wherein the code rate is 7/8.

Example 73 includes the subject matter of any one of Examples 66-72, and optionally, wherein the instructions, when executed, cause the EDMG STA to encode the PSDU for the user into an encoded data field over a plurality of spatial streams for the user such that the encoded data field has a same length in each of the plurality of spatial streams.

Example 74 includes the subject matter of any one of Examples 66-73, and optionally, wherein the instructions, when executed, cause the EDMG STA to map the one or more spatial streams for the user to one or more space-time streams.

Example 75 includes the subject matter of any one of Examples 66-74, and optionally, wherein the EDMG PPDU comprises an EDMG Single User (SU) PPDU.

Example 76 includes the subject matter of any one of Examples 66-74, and optionally, wherein the EDMG PPDU comprises an EDMG Multi User (MU) PPDU comprising a plurality of user PPDUs to a respective plurality of users.

Example 77 includes the subject matter of Example 76, and optionally, wherein the instructions, when executed, cause the EDMG STA to align all of the plurality of user PPDUs in time.

Example 78 includes the subject matter of Example 77, and optionally, wherein the instructions, when executed, cause the EDMG STA to align the user PPDUs by padding one or more PSDUs in the MU PPDU.

Example 79 includes the subject matter of any one of Examples 76-78, and optionally, wherein the instructions, when executed, cause the EDMG STA to, when the EDMG PPDU comprises a Single Carrier (SC) PPDU, determine a maximum number of SC symbol blocks over all users, and determine a count of pad SC symbol blocks for the user based on the maximum number of SC symbol blocks and a count of SC symbol blocks for the user.

Example 80 includes the subject matter of Example 79, and optionally, wherein the instructions, when executed, cause the EDMG STA to determine the count of pad SC symbol blocks for the user by subtracting from the maximum number of SC symbol blocks the count of SC symbol blocks for the user.

Example 81 includes the subject matter of Example 79 or 80, and optionally, wherein the instructions, when executed, cause the EDMG STA to update a number of coded pad zero bits for the user based on an updated count of SC symbol blocks for the user which is equal to the maximum number of SC symbol blocks.

Example 82 includes the subject matter of any one of Examples 76-78, and optionally, wherein the instructions, when executed, cause the EDMG STA to, when the EDMG PPDU comprises an Orthogonal Frequency Divisional Multiplexing (OFDM) PPDU, determine a maximum number of OFDM symbols over all users, and determine a count of pad OFDM symbols for the user based on the maximum number of OFDM symbols and a count of OFDM symbols for the user.

Example 83 includes the subject matter of Example 82, and optionally, wherein the instructions, when executed, cause the EDMG STA to determine the count of pad OFDM symbols for the user by subtracting from the maximum number of OFDM symbols the count of OFDM symbols for the user.

Example 84 includes the subject matter of Example 82 or 83, and optionally, wherein the instructions, when executed, cause the EDMG STA to update a number of coded pad zero bits for the user based on an updated count of OFDM symbols for the user which is equal to the maximum number of OFDM symbols.

Example 85 includes the subject matter of any one of Examples 66-84, and optionally, wherein the EDMG PPDU comprises a Single Carrier (SC) PPDU, the transmission comprising a SC transmission.

Example 86 includes the subject matter of any one of Examples 66-84, and optionally, wherein the EDMG PPDU comprises an Orthogonal Frequency Divisional Multiplexing (OFDM) PPDU, the transmission comprising an OFDM transmission.

Example 87 includes an apparatus of wireless communication by an Enhanced Directional Multi-Gigabit (DMG) (EDMG) station (STA), the apparatus comprising means for encoding a Physical Layer (PHY) Service Data Unit (PSDU) of at least one user in an EDMG PHY Protocol Data Unit (PPDU) according to an EDMG Low-Density Parity-Check (LDPC) encoding scheme, which is based at least on a count of one or more spatial streams for transmission to the user; and means for transmitting the EDMG PPDU in a transmission over a channel bandwidth in a frequency band above 45 Gigahertz (GHz).

Example 88 includes the subject matter of Example 87, and optionally, comprising means for encoding the PSDU of the user according to a count of data pad zero bits for the user, the count of data pad zero bits for the user is based on a number of LDPC codewords for the user over the one or more spatial streams.

Example 89 includes the subject matter of Example 88, and optionally, comprising means for generating scrambled PSDU bits for the user based on the PSDU for the user and the data pad zero bits for the user, generating an LDPC coded bit stream for the user based on the scrambled PSDU bits for the user, and concatenating the LDPC coded bit stream for the user with coded pad zero bits for the user to provide an integer number of symbols, a count of the coded pad zero bits for the user is based on a count of symbols for the user.

Example 90 includes the subject matter of Example 89, and optionally, comprising means for determining the count of symbols for the user based on a count of coded bits per symbol for the user and a spatial stream of the one or more spatial streams.

Example 91 includes the subject matter of Example 89 or 90, and optionally, comprising means for converting the scrambled PSDU for the user into a plurality of LDPC codewords according to a codeword length and a code rate, and generating the LDPC coded bit stream by concatenating the plurality of LDPC codewords.

Example 92 includes the subject matter of Example 91, and optionally, wherein the codeword length is 672, 1344, 624, or 1248.

Example 93 includes the subject matter of Example 91 or 92, and optionally, wherein the code rate is ⅞.

Example 94 includes the subject matter of any one of Examples 87-93, and optionally, comprising means for encoding the PSDU for the user into an encoded data field over a plurality of spatial streams for the user such that the encoded data field has a same length in each of the plurality of spatial streams.

Example 95 includes the subject matter of any one of Examples 87-94, and optionally, comprising means for mapping the one or more spatial streams for the user to one or more space-time streams.

Example 96 includes the subject matter of any one of Examples 87-95, and optionally, wherein the EDMG PPDU comprises an EDMG Single User (SU) PPDU.

Example 97 includes the subject matter of any one of Examples 87-95, and optionally, wherein the EDMG PPDU comprises an EDMG Multi User (MU) PPDU comprising a plurality of user PPDUs to a respective plurality of users.

Example 98 includes the subject matter of Example 97, and optionally, comprising means for aligning all of the plurality of user PPDUs in time.

Example 99 includes the subject matter of Example 98, and optionally, comprising means for aligning the user PPDUs by padding one or more PSDUs in the MU PPDU.

Example 100 includes the subject matter of any one of Examples 97-99, and optionally, comprising means for, when the EDMG PPDU comprises a Single Carrier (SC) PPDU, determining a maximum number of SC symbol blocks over all users, and determining a count of pad SC symbol blocks for the user based on the maximum number of SC symbol blocks and a count of SC symbol blocks for the user.

Example 101 includes the subject matter of Example 100, and optionally, comprising means for determining the count of pad SC symbol blocks for the user by subtracting from the maximum number of SC symbol blocks the count of SC symbol blocks for the user.

Example 102 includes the subject matter of Example 100 or 101, and optionally, comprising means for updating a number of coded pad zero bits for the user based on an updated count of SC symbol blocks for the user which is equal to the maximum number of SC symbol blocks.

Example 103 includes the subject matter of any one of Examples 97-99, and optionally, comprising means for, when the EDMG PPDU comprises an Orthogonal Frequency Divisional Multiplexing (OFDM) PPDU, determining a maximum number of OFDM symbols over all users, and determining a count of pad OFDM symbols for the user based on the maximum number of OFDM symbols and a count of OFDM symbols for the user.

Example 104 includes the subject matter of Example 103, and optionally, comprising means for determining the count of pad OFDM symbols for the user by subtracting from the maximum number of OFDM symbols the count of OFDM symbols for the user.

Example 105 includes the subject matter of Example 103 or 104, and optionally, comprising means for updating a number of coded pad zero bits for the user based on an updated count of OFDM symbols for the user which is equal to the maximum number of OFDM symbols.

Example 106 includes the subject matter of any one of Examples 87-105, and optionally, wherein the EDMG PPDU comprises a Single Carrier (SC) PPDU, the transmission comprising a SC transmission.

Example 107 includes the subject matter of any one of Examples 87-105, and optionally, wherein the EDMG PPDU comprises an Orthogonal Frequency Divisional Multiplexing (OFDM) PPDU, the transmission comprising an OFDM transmission.

Example 108 includes an apparatus comprising logic and circuitry configured to cause an Enhanced Directional Multi-Gigabit (DMG) (EDMG) station (STA) to generate an EDMG Single Carrier (SC) Physical Layer (PHY) Protocol Data Unit (PPDU) comprising at least pre-EDMG fields and a data field, the pre-EDMG fields comprising a non-EDMG Short Training Field (L-STF), a non-EDMG Channel Estimation Field (L-CEF), a non-EDMG Header (L-Header), and an EDMG Header (EDMG-Header-A); generate one or more PPDU waveforms for the pre-EDMG and data fields, the one or more PPDU waveforms for spatial mapping to one or more respective transmit chains, the spatial mapping comprising digital beamforming according to a spatial mapping matrix or spatial expansion according to a cyclic time shift, a PPDU waveform corresponding to a transmit chain of the one or more transmit chains is based on a transmit chain number of the transmit chain; and transmit the EDMG SC PPDU in a SC transmission via the one or more transmit chains over a channel bandwidth of at least 2.16 Gigahertz (GHz) in a frequency band above 45 GHz, transmission of the EDMG SC PPDU via the transmit chain is based on the PPDU waveform corresponding to the transmit chain.

Example 109 includes the subject matter of Example 108, and optionally, wherein the spatial mapping comprises the digital beamforming according to the spatial mapping matrix, the PPDU waveform corresponding to the transmit chain is based on a matrix element of the spatial mapping matrix, an index of the matrix element is based on the transmit chain number of the transmit chain.

Example 110 includes the subject matter of Example 109, and optionally, wherein the index of the matrix element comprises a row index of the spatial mapping matrix, the row index is equal to the transmit chain number of the transmit chain.

Example 111 includes the subject matter of Example 109 or 110, and optionally, wherein the matrix element is in a row of the spatial mapping matrix having a row index equal to 1.

Example 112 includes the subject matter of any one of Examples 109-111, and optionally, wherein the apparatus is configured to cause the EDMG STA to determine the PPDU waveform corresponding to the transmit chain based on the matrix element of the spatial mapping matrix as follows:

$$r_{pre-EDMG,Data}^{iTX}(nT_c) = [Q]_{i_{TX},1} \cdot r_{pre-EDMG,Data}(nT_c),$$
$$1 \le i_{TX} \le N_{TX}$$

wherein $N_{TX}$ denotes a total count of the one or more transmit chains, $r_{pre-EDMG,Data}^{iTX}(nT_c)$ denotes the PPDU waveform corresponding to the transmit chain number $i_{TX}$, $r_{pre-EDMG,Data}(nT_c)$ denotes the pre-EDMG and data fields, Q denotes the spatial mapping matrix, and $[\ ]_{m,n}$ denotes a matrix element from an m-th row and an n-th column.

Example 113 includes the subject matter of Example 108, and optionally, wherein the spatial mapping comprises the spatial expansion according to the cyclic time shift, the PPDU waveform corresponding to the transmit chain comprising the cyclic time shift of the pre-EDMG and data fields, the cyclic time shift is based on the transmit chain number of the transmit chain.

Example 114 includes the subject matter of Example 113, and optionally, wherein the cyclic time shift comprises a cyclic time shift $T_{SC}^{iTX}$ in SC chip units, wherein $i_{TX}$ denotes the transmit chain number.

Example 115 includes the subject matter of Example 114, and optionally, wherein the cyclic time shift $T_{SC}^{iTX}$ is $(i_{TX}-1) \times N_c \times T_c$, wherein $N_c$ denotes a factor value, and $T_c$ denotes a SC chip time duration.

Example 116 includes the subject matter of Example 115, and optionally, wherein the factor value $N_c$ is equal to 4.

Example 117 includes the subject matter of any one of Examples 114-116, and optionally, wherein the apparatus is configured to cause the EDMG STA to determine the PPDU waveform corresponding to the transmit chain by applying the cyclic time shift $T_{SC}^{iTX}$ to the pre-EDMG and data fields as follows:

$$r_{pre-EDMG,Data}^{iTX}(nT_c) =$$
$$\begin{cases} r_{pre-EDMG,Data}(nT_c + T_{SC}^{iTX}), & n = 0, 1, \ldots, N - 1 - T_{SC}^{iTX}/T_c \\ r_{pre-EDMG,Data}(nT_c - (NT_c - T_{SC}^{iTX})), & n = N - T_{SC}^{iTX}/T_c, \ldots, N-1 \end{cases},$$
$$1 \le i_{TX} \le N_{TX}$$

wherein $N_{TX}$ denotes a total count of the one or more transmit chains, $r_{pre-EDMG,Data}^{iTX}(nT_c)$ denotes the PPDU waveform corresponding to the transmit chain number $i_{TX}$, $r_{pre-EDMG,Data}(nT_c)$ denotes the pre-EDMG and data fields, $T_c$ denotes a SC chip time duration, and N=length $(r_{pre-EDMG,Data})$.

Example 118 includes the subject matter of any one of Examples 108-117, and optionally, wherein the apparatus is configured to cause the EDMG STA to generate the EDMG SC PPDU comprising a training (TRN) field, and to generate the PPDU waveform corresponding to the transmit chain by concatenating the pre-EDMG and data fields with the TRN field.

Example 119 includes the subject matter of any one of Examples 108-118, and optionally, wherein the apparatus is configured to cause the EDMG STA to up-sample and filter the PPDU waveform corresponding to the transmit chain.

Example 120 includes the subject matter of any one of Examples 108-119, and optionally, wherein the apparatus is configured to cause the EDMG STA to transmit the EDMG SC PPDU over a channel bandwidth of 2.16 GHz.

Example 121 includes the subject matter of any one of Examples 108-119, and optionally, wherein the apparatus is configured to cause the EDMG STA to transmit the EDMG SC PPDU over a channel bandwidth comprising a plurality of 2.16 GHz channel bandwidths.

Example 122 includes the subject matter of Example 121, and optionally, wherein the apparatus is configured to cause the EDMG STA to determine the PPDU waveform corresponding to the transmit chain to comprise an up-sampled and filtered waveform corresponding to the transmit chain duplicated, with time delay, over the plurality of 2.16 GHz channel bandwidths.

Example 123 includes the subject matter of any one of Examples 108-122, and optionally, wherein the apparatus is configured to cause the EDMG STA to transmit the EDMG SC PPDU as a single User (SU) PPDU.

Example 124 includes the subject matter of any one of Examples 108-122, and optionally, wherein the apparatus is configured to cause the EDMG STA to transmit the EDMG SC PPDU as a Multi User (MU) PPDU to a plurality of users, the MU PPDU comprising another EDMG Header (EDMG Header B) and an EDMG preamble.

Example 125 includes the subject matter of any one of Examples 108-124, and optionally, wherein the apparatus is configured to cause the EDMG STA to transmit the EDMG SC PPDU over a channel bandwidth of 2.16 GHz, 4.32 GHz, 6.48 GHz, or 8.64 GHz.

Example 126 includes the subject matter of any one of Examples 108-125, and optionally, comprising a radio.

Example 127 includes the subject matter of any one of Examples 108-126, and optionally, comprising one or more antennas, a memory and a processor.

Example 128 includes a system of wireless communication comprising an Enhanced Directional Multi-Gigabit (DMG) (EDMG) station (STA), the EDMG STA comprising one or more antennas; a radio; a memory; a processor; and a controller configured to cause the EDMG STA to generate an EDMG Single Carrier (SC) Physical Layer (PHY) Protocol Data Unit (PPDU) comprising at least pre-EDMG fields and a data field, the pre-EDMG fields comprising a non-EDMG Short Training Field (L-STF), a non-EDMG Channel Estimation Field (L-CEF), a non-EDMG Header (L-Header), and an EDMG Header (EDMG-Header-A); generate one or more PPDU waveforms for the pre-EDMG and data fields, the one or more PPDU waveforms for spatial mapping to one or more respective transmit chains, the spatial mapping comprising digital beamforming according to a spatial mapping matrix or spatial expansion according to a cyclic time shift, a PPDU waveform corresponding to a transmit chain of the one or more transmit chains is based on a transmit chain number of the transmit chain; and transmit the EDMG SC PPDU in a SC transmission via the one or more transmit chains over a channel bandwidth of at least 2.16 Gigahertz (GHz) in a frequency band above 45 GHz, transmission of the EDMG SC PPDU via the transmit chain is based on the PPDU waveform corresponding to the transmit chain.

Example 129 includes the subject matter of Example 128, and optionally, wherein the spatial mapping comprises the digital beamforming according to the spatial mapping matrix, the PPDU waveform corresponding to the transmit chain is based on a matrix element of the spatial mapping matrix, an index of the matrix element is based on the transmit chain number of the transmit chain.

Example 130 includes the subject matter of Example 129, and optionally, wherein the index of the matrix element comprises a row index of the spatial mapping matrix, the row index is equal to the transmit chain number of the transmit chain.

Example 131 includes the subject matter of Example 129 or 130, and optionally, wherein the matrix element is in a row of the spatial mapping matrix having a row index equal to 1.

Example 132 includes the subject matter of any one of Examples 129-131, and optionally, wherein the controller is configured to cause the EDMG STA to determine the PPDU waveform corresponding to the transmit chain based on the matrix element of the spatial mapping matrix as follows:

$$r_{pre\text{-}EDMG,Data}^{iTX}(nT_c) = [Q]_{i_{TX},1} \cdot r_{pre\text{-}EDMG,Data}(nT_c),$$
$$1 \le i_{TX} \le N_{TX}$$

wherein $N_{TX}$ denotes a total count of the one or more transmit chains, $r_{pre\text{-}EDMG,Data}^{iTX}(nT_c)$ denotes the PPDU waveform corresponding to the transmit chain number $i_{TX}$, $r_{pre\text{-}EDMG,Data}(nT_c)$ denotes the pre-EDMG and data fields, Q denotes the spatial mapping matrix, and $[\ ]_{m,n}$ denotes a matrix element from an m-th row and an n-th column.

Example 133 includes the subject matter of Example 128, and optionally, wherein the spatial mapping comprises the spatial expansion according to the cyclic time shift, the PPDU waveform corresponding to the transmit chain comprising the cyclic time shift of the pre-EDMG and data fields, the cyclic time shift is based on the transmit chain number of the transmit chain.

Example 134 includes the subject matter of Example 133, and optionally, wherein the cyclic time shift comprises a cyclic time shift $T_{SC}^{iTX}$ in SC chip units, wherein $i_{TX}$ denotes the transmit chain number.

Example 135 includes the subject matter of Example 134, and optionally, wherein the cyclic time shift $T_{SC}^{iTX}$ is $(i_{TX}-1) \times N_c \times T_c$, wherein $N_c$ denotes a factor value, and $T_c$ denotes a SC chip time duration.

Example 136 includes the subject matter of Example 135, and optionally, wherein the factor value $N_c$ is equal to 4.

Example 137 includes the subject matter of any one of Examples 134-136, and optionally, wherein the controller is configured to cause the EDMG STA to determine the PPDU waveform corresponding to the transmit chain by applying the cyclic time shift $T_{SC}^{iTX}$ to the pre-EDMG and data fields as follows:

$$r_{pre\text{-}EDMG,Data}^{iTX}(nT_c) =$$
$$\begin{cases} r_{pre\text{-}EDMG,Data}(nT_c + T_{SC}^{iTX}), & n = 0, 1, \ldots, N - 1 - T_{SC}^{iTX}/T_c \\ r_{pre\text{-}EDMG,Data}(nT_c - (NT_c - T_{SC}^{iTX})), & n = N - T_{SC}^{iTX}/T_c, \ldots, N-1 \end{cases},$$
$$1 \le i_{TX} \le N_{TX}$$

wherein $N_{TX}$ denotes a total count of the one or more transmit chains, $r_{pre\text{-}EDMG,Data}^{iTX}(nT_c)$ denotes the PPDU waveform corresponding to the transmit chain number $i_{TX}$, $r_{pre\text{-}EDMG,Data}(nT_c)$ denotes the pre-EDMG and data fields, $T_c$ denotes a SC chip time duration, and N=length $(r_{pre\text{-}EDMG,Data})$.

Example 138 includes the subject matter of any one of Examples 128-137, and optionally, wherein the controller is configured to cause the EDMG STA to generate the EDMG SC PPDU comprising a training (TRN) field, and to generate the PPDU waveform corresponding to the transmit chain by concatenating the pre-EDMG and data fields with the TRN field.

Example 139 includes the subject matter of any one of Examples 128-138, and optionally, wherein the controller is configured to cause the EDMG STA to up-sample and filter the PPDU waveform corresponding to the transmit chain.

Example 140 includes the subject matter of any one of Examples 128-139, and optionally, wherein the controller is configured to cause the EDMG STA to transmit the EDMG SC PPDU over a channel bandwidth of 2.16 GHz.

Example 141 includes the subject matter of any one of Examples 128-139, and optionally, wherein the controller is configured to cause the EDMG STA to transmit the EDMG SC PPDU over a channel bandwidth comprising a plurality of 2.16 GHz channel bandwidths.

Example 142 includes the subject matter of Example 141, and optionally, wherein the controller is configured to cause the EDMG STA to determine the PPDU waveform corresponding to the transmit chain to comprise an up-sampled and filtered waveform corresponding to the transmit chain duplicated, with time delay, over the plurality of 2.16 GHz channel bandwidths.

Example 143 includes the subject matter of any one of Examples 128-142, and optionally, wherein the controller is configured to cause the EDMG STA to transmit the EDMG SC PPDU as a single User (SU) PPDU.

Example 144 includes the subject matter of any one of Examples 128-142, and optionally, wherein the controller is configured to cause the EDMG STA to transmit the EDMG SC PPDU as a Multi User (MU) PPDU to a plurality of users, the MU PPDU comprising another EDMG Header (EDMG Header B) and an EDMG preamble.

Example 145 includes the subject matter of any one of Examples 128-144, and optionally, wherein the controller is configured to cause the EDMG STA to transmit the EDMG SC PPDU over a channel bandwidth of 2.16 GHz, 4.32 GHz, 6.48 GHz, or 8.64 GHz.

Example 146 includes a method to be performed at an Enhanced Directional Multi-Gigabit (DMG) (EDMG) station (STA), the method comprising generating an EDMG Single Carrier (SC) Physical Layer (PHY) Protocol Data Unit (PPDU) comprising at least pre-EDMG fields and a data field, the pre-EDMG fields comprising a non-EDMG Short Training Field (L-STF), a non-EDMG Channel Estimation Field (L-CEF), a non-EDMG Header (L-Header), and an EDMG Header (EDMG-Header-A); generating one or more PPDU waveforms for the pre-EDMG and data fields, the one or more PPDU waveforms for spatial mapping to one or more respective transmit chains, the spatial mapping comprising digital beamforming according to a spatial mapping matrix or spatial expansion according to a cyclic time shift, a PPDU waveform corresponding to a transmit chain of the one or more transmit chains is based on a transmit chain number of the transmit chain; and transmitting the EDMG SC PPDU in a SC transmission via the one or more transmit chains over a channel bandwidth of at least 2.16 Gigahertz (GHz) in a frequency band above 45 GHz, transmission of the EDMG SC PPDU via the transmit chain is based on the PPDU waveform corresponding to the transmit chain.

Example 147 includes the subject matter of Example 146, and optionally, wherein the spatial mapping comprises the digital beamforming according to the spatial mapping matrix, the PPDU waveform corresponding to the transmit chain is based on a matrix element of the spatial mapping matrix, an index of the matrix element is based on the transmit chain number of the transmit chain.

Example 148 includes the subject matter of Example 147, and optionally, wherein the index of the matrix element comprises a row index of the spatial mapping matrix, the row index is equal to the transmit chain number of the transmit chain.

Example 149 includes the subject matter of Example 147 or 148, and optionally, wherein the matrix element is in a row of the spatial mapping matrix having a row index equal to 1.

Example 150 includes the subject matter of any one of Examples 147-149, and optionally, comprising determining the PPDU waveform corresponding to the transmit chain based on the matrix element of the spatial mapping matrix as follows:

$$r_{pre\text{-}EDMG,Data}^{iTX}(nT_c) = [Q]_{i_{TX},1} \cdot r_{pre\text{-}EDMG,Data}(nT_c),$$
$$1 \leq i_{TX} \leq N_{TX}$$

wherein $N_{TX}$ denotes a total count of the one or more transmit chains, $r_{pre\text{-}EDMG,Data}^{iTX}(nT_c)$ denotes the PPDU waveform corresponding to the transmit chain number $i_{TX}$, $r_{pre\text{-}EDMG,Data}(nT_c)$ denotes the pre-EDMG and data fields, Q denotes the spatial mapping matrix, and $[\ ]_{m,n}$ denotes a matrix element from an m-th row and an n-th column.

Example 151 includes the subject matter of Example 146, and optionally, wherein the spatial mapping comprises the spatial expansion according to the cyclic time shift, the PPDU waveform corresponding to the transmit chain comprising the cyclic time shift of the pre-EDMG and data fields, the cyclic time shift is based on the transmit chain number of the transmit chain.

Example 152 includes the subject matter of Example 151, and optionally, wherein the cyclic time shift comprises a cyclic time shift $T_{SC}^{iTX}$ in SC chip units, wherein $i_{TX}$ denotes the transmit chain number.

Example 153 includes the subject matter of Example 152, and optionally, wherein the cyclic time shift $T_{SC}^{iTX}$ is $(i_{TX}-1) \times N_c \times T_c$, wherein $N_c$ denotes a factor value, and $T_c$ denotes a SC chip time duration.

Example 154 includes the subject matter of Example 153, and optionally, wherein the factor value $N_c$ is equal to 4.

Example 155 includes the subject matter of any one of Examples 152-154, and optionally, comprising determining the PPDU waveform corresponding to the transmit chain by applying the cyclic time shift $T_{SC}^{iTX}$ to the pre-EDMG and data fields as follows:

$$r_{pre\text{-}EDMG,Data}^{iTX}(nT_c) = $$
$$\begin{cases} r_{pre\text{-}EDMG,Data}(nT_c + T_{SC}^{iTX}), & n = 0, 1, \ldots, N-1-T_{SC}^{iTX}/T_c \\ r_{pre\text{-}EDMG,Data}(nT_c - (NT_c - T_{SC}^{iTX})), & n = N - T_{SC}^{iTX}/T_c, \ldots, N-1 \end{cases},$$
$$1 \leq i_{TX} \leq N_{TX}$$

wherein $N_{TX}$ denotes a total count of the one or more transmit chains, $r_{pre\text{-}EDMG,Data}^{iTX}(nT_c)$ denotes the PPDU waveform corresponding to the transmit chain number $i_{TX}$, $r_{pre\text{-}EDMG,Data}(nT_c)$ denotes the pre-EDMG and data fields, $T_c$ denotes a SC chip time duration, and N=length $(r_{pre\text{-}EDMG,Data})$.

Example 156 includes the subject matter of any one of Examples 146-155, and optionally, comprising generating the EDMG SC PPDU comprising a training (TRN) field, and generating the PPDU waveform corresponding to the transmit chain by concatenating the pre-EDMG and data fields with the TRN field.

Example 157 includes the subject matter of any one of Examples 146-156, and optionally, comprising up-sampling and filtering the PPDU waveform corresponding to the transmit chain.

Example 158 includes the subject matter of any one of Examples 146-157, and optionally, comprising transmitting the EDMG SC PPDU over a channel bandwidth of 2.16 GHz.

Example 159 includes the subject matter of any one of Examples 146-157, and optionally, comprising transmitting the EDMG SC PPDU over a channel bandwidth comprising a plurality of 2.16 GHz channel bandwidths.

Example 160 includes the subject matter of Example 159, and optionally, comprising determining the PPDU waveform corresponding to the transmit chain to comprise an up-sampled and filtered waveform corresponding to the transmit chain duplicated, with time delay, over the plurality of 2.16 GHz channel bandwidths.

Example 161 includes the subject matter of any one of Examples 146-160, and optionally, comprising transmitting the EDMG SC PPDU as a single User (SU) PPDU.

Example 162 includes the subject matter of any one of Examples 146-160, and optionally, comprising transmitting the EDMG SC PPDU as a Multi User (MU) PPDU to a plurality of users, the MU PPDU comprising another EDMG Header (EDMG Header B) and an EDMG preamble.

Example 163 includes the subject matter of any one of Examples 146-162, and optionally, comprising transmitting the EDMG SC PPDU over a channel bandwidth of 2.16 GHz, 4.32 GHz, 6.48 GHz, or 8.64 GHz.

Example 164 includes a product comprising one or more tangible computer-readable non-transitory storage media comprising computer-executable instructions operable to, when executed by at least one processor, enable the at least one processor to cause an Enhanced Directional Multi-Gigabit (DMG) (EDMG) station (STA) to generate an EDMG Single Carrier (SC) Physical Layer (PHY) Protocol Data Unit (PPDU) comprising at least pre-EDMG fields and a data field, the pre-EDMG fields comprising a non-EDMG Short Training Field (L-STF), a non-EDMG Channel Estimation Field (L-CEF), a non-EDMG Header (L-Header), and an EDMG Header (EDMG-Header-A); generate one or more PPDU waveforms for the pre-EDMG and data fields, the one or more PPDU waveforms for spatial mapping to one or more respective transmit chains, the spatial mapping comprising digital beamforming according to a spatial mapping matrix or spatial expansion according to a cyclic time shift, a PPDU waveform corresponding to a transmit chain of the one or more transmit chains is based on a transmit chain number of the transmit chain; and transmit the EDMG SC PPDU in a SC transmission via the one or more transmit chains over a channel bandwidth of at least 2.16 Gigahertz (GHz) in a frequency band above 45 GHz, transmission of the EDMG SC PPDU via the transmit chain is based on the PPDU waveform corresponding to the transmit chain.

Example 165 includes the subject matter of Example 164, and optionally, wherein the spatial mapping comprises the digital beamforming according to the spatial mapping matrix, the PPDU waveform corresponding to the transmit chain is based on a matrix element of the spatial mapping matrix, an index of the matrix element is based on the transmit chain number of the transmit chain.

Example 166 includes the subject matter of Example 165, and optionally, wherein the index of the matrix element comprises a row index of the spatial mapping matrix, the row index is equal to the transmit chain number of the transmit chain.

Example 167 includes the subject matter of Example 165 or 166, and optionally, wherein the matrix element is in a row of the spatial mapping matrix having a row index equal to 1.

Example 168 includes the subject matter of any one of Examples 165-167, and optionally, wherein the instructions, when executed, cause the EDMG STA to determine the PPDU waveform corresponding to the transmit chain based on the matrix element of the spatial mapping matrix as follows:

$$r_{pre-EDMG,Data}^{iTX}(nT_c) = [Q]_{i_{TX},1} \cdot r_{pre-EDMG,Data}(nT_c),$$
$$1 \leq i_{TX} \leq N_{TX}$$

wherein $N_{TX}$ denotes a total count of the one or more transmit chains, $r_{pre-EDMG,Data}^{iTX}(nT_c)$ denotes the PPDU waveform corresponding to the transmit chain number $i_{TX}$, $r_{pre-EDMG,Data}(nT_c)$ denotes the pre-EDMG and data fields, Q denotes the spatial mapping matrix, and $[\ ]_{m,n}$ denotes a matrix element from an m-th row and an n-th column.

Example 169 includes the subject matter of Example 164, and optionally, wherein the spatial mapping comprises the spatial expansion according to the cyclic time shift, the PPDU waveform corresponding to the transmit chain comprising the cyclic time shift of the pre-EDMG and data fields, the cyclic time shift is based on the transmit chain number of the transmit chain.

Example 170 includes the subject matter of Example 169, and optionally, wherein the cyclic time shift comprises a cyclic time shift $T_{SC}^{iTX}$ in SC chip units, wherein $i_{TX}$ denotes the transmit chain number.

Example 171 includes the subject matter of Example 170, and optionally, wherein the cyclic time shift $T_{SC}^{iTX}$ is $(i_{TX}-1) \times N_c \times T_c$, wherein $N_c$ denotes a factor value, and $T_c$ denotes a SC chip time duration.

Example 172 includes the subject matter of Example 171, and optionally, wherein the factor value $N_c$ is equal to 4.

Example 173 includes the subject matter of any one of Examples 170-172, and optionally, wherein the instructions, when executed, cause the EDMG STA to determine the PPDU waveform corresponding to the transmit chain by applying the cyclic time shift $T_{SC}^{iTX}$ to the pre-EDMG and data fields as follows:

$$r_{pre-EDMG,Data}^{iTX}(nT_c) =$$
$$\begin{cases} r_{pre-EDMG,Data}(nT_c + T_{SC}^{iTX}), & n = 0, 1, \ldots, N-1-T_{SC}^{iTX}/T_c \\ r_{pre-EDMG,Data}(nT_c - (NT_c - T_{SC}^{iTX})), & n = N - T_{SC}^{iTX}/T_c, \ldots, N-1 \end{cases},$$
$$1 \leq i_{TX} \leq N_{TX}$$

wherein $N_{Tx}$ denotes a total count of the one or more transmit chains, $r_{pre-EDMG,Data}^{iTX}(nT_c)$ denotes the PPDU waveform corresponding to the transmit chain number $i_{TX}$, $r_{pre-EDMG,Data}(nT_c)$ denotes the pre-EDMG and data fields, $T_c$ denotes a SC chip time duration, and N=length ($r_{pre-EDMG,Data}$).

Example 174 includes the subject matter of any one of Examples 164-173, and optionally, wherein the instructions, when executed, cause the EDMG STA to generate the EDMG SC PPDU comprising a training (TRN) field, and to generate the PPDU waveform corresponding to the transmit chain by concatenating the pre-EDMG and data fields with the TRN field.

Example 175 includes the subject matter of any one of Examples 164-174, and optionally, wherein the instructions, when executed, cause the EDMG STA to up-sample and filter the PPDU waveform corresponding to the transmit chain.

Example 176 includes the subject matter of any one of Examples 164-175, and optionally, wherein the instructions, when executed, cause the EDMG STA to transmit the EDMG SC PPDU over a channel bandwidth of 2.16 GHz.

Example 177 includes the subject matter of any one of Examples 164-175, and optionally, wherein the instructions, when executed, cause the EDMG STA to transmit the EDMG SC PPDU over a channel bandwidth comprising a plurality of 2.16 GHz channel bandwidths.

Example 178 includes the subject matter of Example 177, and optionally, wherein the instructions, when executed, cause the EDMG STA to determine the PPDU waveform corresponding to the transmit chain to comprise an up-sampled and filtered waveform corresponding to the transmit chain duplicated, with time delay, over the plurality of 2.16 GHz channel bandwidths.

Example 179 includes the subject matter of any one of Examples 164-178, and optionally, wherein the instructions, when executed, cause the EDMG STA to transmit the EDMG SC PPDU as a single User (SU) PPDU.

Example 180 includes the subject matter of any one of Examples 164-178, and optionally, wherein the instructions, when executed, cause the EDMG STA to transmit the EDMG SC PPDU as a Multi User (MU) PPDU to a plurality of users, the MU PPDU comprising another EDMG Header (EDMG Header B) and an EDMG preamble.

Example 181 includes the subject matter of any one of Examples 164-180, and optionally, wherein the instructions, when executed, cause the EDMG STA to transmit the EDMG SC PPDU over a channel bandwidth of 2.16 GHz, 4.32 GHz, 6.48 GHz, or 8.64 GHz.

Example 182 includes an apparatus of wireless communication by an Enhanced Directional Multi-Gigabit (DMG) (EDMG) station (STA), the apparatus comprising means for generating an EDMG Single Carrier (SC) Physical Layer (PHY) Protocol Data Unit (PPDU) comprising at least pre-EDMG fields and a data field, the pre-EDMG fields comprising a non-EDMG Short Training Field (L-STF), a non-EDMG Channel Estimation Field (L-CEF), a non-EDMG Header (L-Header), and an EDMG Header (EDMG-Header-A); means for generating one or more PPDU waveforms for the pre-EDMG and data fields, the one or more PPDU waveforms for spatial mapping to one or more respective transmit chains, the spatial mapping comprising digital beamforming according to a spatial mapping matrix or spatial expansion according to a cyclic time shift, a PPDU waveform corresponding to a transmit chain of the one or more transmit chains is based on a transmit chain number of the transmit chain; and means for transmitting the EDMG SC PPDU in a SC transmission via the one or more transmit chains over a channel bandwidth of at least 2.16 Gigahertz (GHz) in a frequency band above 45 GHz, transmission of the EDMG SC PPDU via the transmit chain is based on the PPDU waveform corresponding to the transmit chain.

Example 183 includes the subject matter of Example 182, and optionally, wherein the spatial mapping comprises the digital beamforming according to the spatial mapping matrix, the PPDU waveform corresponding to the transmit chain is based on a matrix element of the spatial mapping matrix, an index of the matrix element is based on the transmit chain number of the transmit chain.

Example 184 includes the subject matter of Example 183, and optionally, wherein the index of the matrix element comprises a row index of the spatial mapping matrix, the row index is equal to the transmit chain number of the transmit chain.

Example 185 includes the subject matter of Example 183 or 184, and optionally, wherein the matrix element is in a row of the spatial mapping matrix having a row index equal to 1.

Example 186 includes the subject matter of any one of Examples 183-185, and optionally, comprising means for determining the PPDU waveform corresponding to the transmit chain based on the matrix element of the spatial mapping matrix as follows:

$$r_{pre\text{-}EDMG,Data}^{i_{TX}}(nT_c) = [Q]_{i_{TX},1} \cdot r_{pre\text{-}EDMG,Data}(nT_c),$$
$$1 \leq i_{TX} \leq N_{TX}$$

wherein $N_{TX}$ denotes a total count of the one or more transmit chains, $r_{pre\text{-}EDMG,Data}^{i_{TX}}(nT_c)$ denotes the PPDU waveform corresponding to the transmit chain number $i_{TX}$, $r_{pre\text{-}EDMG,Data}(nT_c)$ denotes the pre-EDMG and data fields, Q denotes the spatial mapping matrix, and $[\ ]_{m,n}$ denotes a matrix element from an m-th row and an n-th column.

Example 187 includes the subject matter of Example 182, and optionally, wherein the spatial mapping comprises the spatial expansion according to the cyclic time shift, the PPDU waveform corresponding to the transmit chain comprising the cyclic time shift of the pre-EDMG and data fields, the cyclic time shift is based on the transmit chain number of the transmit chain.

Example 188 includes the subject matter of Example 187, and optionally, wherein the cyclic time shift comprises a cyclic time shift $T_{SC}^{i_{TX}}$ in SC chip units, wherein $i_{TX}$ denotes the transmit chain number.

Example 189 includes the subject matter of Example 188, and optionally, wherein the cyclic time shift $T_{SC}^{i_{TX}}$ is $(i_{TX}-1) \times N_c \times T_c$, wherein $N_c$ denotes a factor value, and $T_c$ denotes a SC chip time duration.

Example 190 includes the subject matter of Example 189, and optionally, wherein the factor value $N_c$ is equal to 4.

Example 191 includes the subject matter of any one of Examples 188-190, and optionally, comprising means for determining the PPDU waveform corresponding to the transmit chain by applying the cyclic time shift $T_{SC}^{i_{TX}}$ to the pre-EDMG and data fields as follows:

$$r_{pre-EDMG,Data}^{i_{TX}}(nT_c) = \begin{cases} r_{pre-EDMG,Data}(nT_c + T_{SC}^{i_{TX}}), & n = 0, 1, \ldots, N-1-T_{SC}^{i_{TX}}/T_c \\ r_{pre-EDMG,Data}(nT_c - (NT_c - T_{SC}^{i_{TX}})), & n = N - T_{SC}^{i_{TX}}/T_c, \ldots, N-1 \end{cases},$$
$$1 \leq i_{TX} \leq N_{TX}$$

wherein $N_{TX}$ denotes a total count of the one or more transmit chains, $r_{pre\text{-}EDMG,Data}^{i_{TX}}(nT_c)$ denotes the PPDU waveform corresponding to the transmit chain number $i_{TX}$, $r_{pre\text{-}EDMG,Data}(nT_c)$ denotes the pre-EDMG and data fields, $T_c$ denotes a SC chip time duration, and N=length $(r_{pre\text{-}EDMG,Data})$.

Example 192 includes the subject matter of any one of Examples 182-191, and optionally, comprising means for generating the EDMG SC PPDU comprising a training (TRN) field, and generating the PPDU waveform corresponding to the transmit chain by concatenating the pre-EDMG and data fields with the TRN field.

Example 193 includes the subject matter of any one of Examples 182-192, and optionally, comprising means for up-sampling and filtering the PPDU waveform corresponding to the transmit chain.

Example 194 includes the subject matter of any one of Examples 182-193, and optionally, comprising means for transmitting the EDMG SC PPDU over a channel bandwidth of 2.16 GHz.

Example 195 includes the subject matter of any one of Examples 182-193, and optionally, comprising means for transmitting the EDMG SC PPDU over a channel bandwidth comprising a plurality of 2.16 GHz channel bandwidths.

Example 196 includes the subject matter of Example 195, and optionally, comprising means for determining the PPDU waveform corresponding to the transmit chain to comprise an up-sampled and filtered waveform corresponding to the transmit chain duplicated, with time delay, over the plurality of 2.16 GHz channel bandwidths.

Example 197 includes the subject matter of any one of Examples 182-196, and optionally, comprising means for transmitting the EDMG SC PPDU as a single User (SU) PPDU.

Example 198 includes the subject matter of any one of Examples 182-196, and optionally, comprising means for transmitting the EDMG SC PPDU as a Multi User (MU) PPDU to a plurality of users, the MU PPDU comprising another EDMG Header (EDMG Header B) and an EDMG preamble.

Example 199 includes the subject matter of any one of Examples 182-198, and optionally, comprising means for transmitting the EDMG SC PPDU over a channel bandwidth of 2.16 GHz, 4.32 GHz, 6.48 GHz, or 8.64 GHz.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
a processor comprising logic and circuitry configured to cause an Enhanced Directional Multi-Gigabit (DMG) (EDMG) wireless communication station (STA) to:
determine one or more Physical Layer (PHY) Protocol Data Unit (PPDU) waveforms corresponding to one or more transmit chains, respectively, the one or more PPDU waveforms based on a spatial mapping of pre-EDMG modulated fields of an EDMG Single Carrier (SC) mode Multi User (MU) PPDU from a spatial stream to the one or more transmit chains, wherein a PPDU waveform corresponding to a transmit chain of the one or more transmit chains is based on a transmit chain number of the transmit chain, wherein the pre-EDMG modulated fields comprise a non-EDMG Short Training Field (L-STF), a non-EDMG Channel Estimation Field (L-CEF), a non-EDMG Header (L-Header), and a first EDMG Header (EDMG-Header-A);
determine one or more up-sampled and filtered waveforms corresponding to the one or more transmit chains, respectively, by up-sampling and filtering the one or more PPDU waveforms according to an up-sampling factor and a pulse-shaping filter impulse response;
determine one or more pre-EDMG waveforms corresponding to the one or more transmit chains, respectively, wherein a pre-EDMG waveform corresponding to the transmit chain is based on an up-sampled and filtered waveform corresponding to the transmit chain, and on a channel bandwidth for transmission of the EDMG SC mode MU PPDU;
determine one or more EDMG SC mode MU PPDU waveforms corresponding to the one or more transmit chains, respectively, wherein an EDMG SC mode MU PPDU waveform corresponding to the transmit chain comprises a concatenation of the pre-EDMG waveform corresponding to the transmit chain with an EDMG waveform corresponding to EDMG modulated fields of the EDMG SC mode MU PPDU, the EDMG modulated fields of the EDMG SC mode MU PPDU comprising an EDMG preamble, a second EDMG header (EDMG-Header-B), and a data field; and
transmit the EDMG SC mode MU PPDU via the one or more transmit chains over the channel bandwidth based on the one or more EDMG SC mode MU PPDU waveforms; and
a memory to store information processed by the processor.

2. The apparatus of claim 1 configured to cause the EDMG STA to determine the EDMG waveform by filtering and resampling the EDMG modulated fields of the EDMG SC mode MU PPDU according to a conversion rate ratio, which is based on a count of 2.16 Gigahertz (GHz) channels in the channel bandwidth.

3. The apparatus of claim 2, wherein the conversion rate ratio is $N_{up}/N_{CB}$, wherein $N_{up}$ denotes the up-sampling factor, and $N_{CB}$ denotes the count of 2.16 GHz channels in the channel bandwidth.

4. The apparatus of claim 2, wherein the conversion rate ratio is 3/2.

5. The apparatus of claim 2 configured to cause the EDMG STA to determine the EDMG waveform as follows:

$$r^{i_{TX}(2)}_{EDMG-Pream,Header-B,Data,TRN}\left(n\frac{T_c}{3N_{CB}}\right) ==$$

$$\begin{cases} r^{i_{TX}(1)}_{EDMG-Pream,Header-B,Data,TRN}\left(n\frac{T_c}{3N_{CB}}\right), & n = 0, 3, 6 \ldots \\ 0 & \text{otherwise} \end{cases}$$

$$r^{i_{TX}(3)}_{EDMG-Pream,Header-B,Data,TRN}\left(n\frac{T_c}{3N_{CB}}\right) ==$$

$$\sum_{k=0}^{K-1} r^{i_{TX}(2)}_{EDMG-Pream,Header-B,Data,TRN}\left((n-k)\frac{T_c}{3N_{CB}}\right) h_{SCCB}(k), n = 0, 1, \ldots$$

$$r^{i_{TX}}_{EDMG-Pream,Header-B,Data,TRN}\left(n\frac{T_c}{3N_{CB}}\right) ==$$

$$r^{i_{TX}(3)}_{EDMG-Pream,Header-B,Data,TRN}\left(\left(2n + \frac{K-1}{2}\right)\frac{T_c}{3N_{CB}}\right), n = 0, 1, \ldots$$

wherein:

$$r^{i_{TX}(1)}_{EDMG-Pream,EDMG-Header-B,Data,TRN}\left(n\frac{T_c}{N_{CB}}\right)$$

denotes the EDMG modulated fields corresponding to a transmit chain index $i_{TX}$, $$r^{i_{TX}}_{EDMG-Pream,Header-B,Data,TRN}\left(n\frac{2T_c}{3N_{CB}}\right)$$

denotes the EDMG waveform corresponding to the transmit chain index $i_{TX}$, $T_c$ denotes a chip time duration, $N_{CB}$ denotes the count of 2.16 Ghz channels in the channel bandwidth, and K denotes a length of the pulse-shaping filter impulse response in samples.

6. The apparatus of claim 1, wherein the EDMG modulated fields comprise a Training (TRN) field of the EDMG SC mode MU PPDU.

7. The apparatus of claim 1, wherein the PPDU waveform corresponding to the transmit chain is based on a matrix element of a spatial mapping matrix, an index of the matrix element is based on the transmit chain number of the transmit chain.

8. The apparatus of claim 7, wherein the index of the matrix element comprises a row index of the spatial mapping matrix, the row index is equal to the transmit chain number of the transmit chain.

9. The apparatus of claim 7, wherein the matrix element is in a column of the spatial mapping matrix having a column index equal to 1.

10. The apparatus of claim 1 configured to cause the EDMG STA to determine the PPDU waveform corresponding to the transmit chain as follows:

$$r_{pre-EDMG}^{iTX(1)}(nT_c) = [Q]_{i_{TX},1} \cdot r_{pre-EDMG}(nT_c),$$
$$1 \le i_{TX} \le N_{TX}$$

wherein $N_{Tx}$ denotes a total count of the one or more transmit chains, $i_{TX}$ denotes the transmit chain number, $r_{pre-EDMG}^{iTX(1)}(nT_c)$ denotes the PPDU waveform corresponding to the transmit chain number $i_{TX}$, $r_{pre-EDMG}(nT_c)$ denotes the pre-EDMG fields, Q denotes a spatial mapping matrix, and $[\ ]_{m,n}$ denotes a matrix element from an m-th row and an n-th column.

11. The apparatus of claim 1, wherein the spatial mapping comprises spatial expansion with Cyclic Shift Diversity (CSD), the PPDU waveform corresponding to the transmit chain comprising a cyclic shift based on the transmit chain number of the transmit chain.

12. The apparatus of claim 11, wherein the cyclic shift comprises a cyclic shift in SC chip units based on the transmit chain number.

13. The apparatus of claim 11, wherein the cyclic shift is $(i_{TX}-1) \times N_c \times T_c$, wherein $i_{TX}$ denotes the transmit chain number, $N_c$ denotes a factor value, and $T_c$ denotes a chip time duration.

14. The apparatus of claim 13, wherein the factor value $N_c$ is equal to 4.

15. The apparatus of claim 11 configured to cause the EDMG STA to determine the PPDU waveform corresponding to the transmit chain as follows:

$$r_{pre-EDMG}^{iTX(1)}(nT_C) =$$
$$\begin{cases} r_{pre-EDMG}(nT_c + T_{SC}^{iTX}), & n = 0, 1, \ldots, N-1 - \frac{T_{SC}^{iTX}}{T_c} \\ r_{pre-EDMG}(nT_c - (NT_c - T_{SC}^{iTX})), & n = N - \frac{T_{SC}^{iTX}}{T_c}, \ldots, N-1 \end{cases}$$

$$1 \le i_{TX} \le N_{TX}$$

wherein $N_{Tx}$ denotes a total count of the one or more transmit chains, $i_{TX}$ denotes the transmit chain number, $r_{pre-EDMG}^{iTX(1)}$ denotes the PPDU waveform corresponding to the transmit chain number $i_{TX}$, $r_{pre-EDMG}$ denotes the pre-EDMG fields, $T_c$ denotes a chip time duration, $T_{SC}^{iTX}$ denotes the cyclic shift for the transmit chain number $i_{TX}$, and N denotes a length of the pre-EDMG fields.

16. The apparatus of claim 1 configured to cause the EDMG STA to determine the up-sampled and filtered waveform corresponding to the transmit chain as follows:

$$r_{pre-EDMG}^{iTX(2)}\left(n\frac{T_c}{N_{up}}\right) = \begin{cases} r_{pre-EDMG}^{iTX(1)}\left(n\frac{T_c}{N_{up}}\right), & n = 0, N_{up}, 2*N_{up} \ldots \\ 0 & \text{otherwise} \end{cases}$$

$$r_{pre-EDMG}^{iTX(3)}\left(n\frac{T_c}{N_{up}}\right) = \sum_{k=0}^{K-1} r_{pre-EDMG}^{iTX(2)}\left((n-k)\frac{T_c}{N_{up}}\right) h_{SCCB}(k), n = 0, 1, \ldots$$

$$r_{pre-EDMG}^{iTX(4)}\left(n\frac{T_c}{N_{up}}\right) = r_{pre-EDMG}^{iTX(3)}\left(\left(n+\frac{K-1}{2}\right)\frac{T_c}{N_{up}}\right), n = 0, 1, \ldots$$

wherein $i_{TX}$ denotes the transmit chain number, $r_{pre-EDMG}^{iTX(1)}$ denotes the PPDU waveform corresponding to the transmit chain, $r_{pre-EDMG}^{iTX(4)}$ denotes the up-sampled and filtered waveform corresponding to the transmit chain, $h_{SCCB}$ denotes the pulse-shaping filter impulse response, $T_c$ denotes a chip time duration, $N_{up}$ denotes the up-sampling factor, and K denotes a length of $h_{SCCB}$ in samples.

17. The apparatus of claim 16 configured to cause the EDMG STA to, when the channel bandwidth is 2.16 Gigahertz (GHz), determine the pre-EDMG waveform corresponding to the transmit chain as follows:

$$r_{pre-EDMG}^{iTX}\left(n\frac{T_c}{N_{up}}\right) = r_{pre-EDMG}^{iTX(4)}\left(n\frac{T_c}{N_{up}}\right), 1 \le i_{TX} \le N_{TX}$$

wherein $N_{Tx}$ denotes a total count of the one or more transmit chains, and $$r_{pre-EDMG}^{iTX}\left(n\frac{T_c}{N_{up}}\right)$$

denotes the pre-EDMG waveform corresponding to the transmit chain with the transmit chain number $i_{TX}$.

18. The apparatus of claim 16 configured to cause the EDMG STA to, when the channel bandwidth is 4.32 Gigahertz (GHz), determine the pre-EDMG waveform corresponding to the transmit chain as follows:

$$r_{pre-EDMG}^{iTX}\left(n\frac{T_c}{N_{up}}\right) ==$$

$$r_{pre-EDMG}^{iTX(4)}\left(n\frac{T_c}{N_{up}} + \Delta t_1\right) \cdot \frac{1}{\sqrt{2}} \exp\left(-j2\pi\left(\frac{\Delta F}{2}\right)\left(\frac{T_c}{N_{up}}\right)n\right) ++$$

$$r_{pre-EDMG}^{iTX(4)}\left(n\frac{T_c}{N_{up}} + \Delta t_2\right) \cdot \frac{1}{\sqrt{2}} \exp\left(+j2\pi\left(\frac{\Delta F}{2}\right)\left(\frac{T_c}{N_{up}}\right)n\right), 1 \le i_{TX} \le N_{TX}$$

wherein:

$N_{Tx}$ denotes a total count of the one or more transmit chains, $$r_{pre-EDMG}^{iTX}\left(n\frac{T_c}{N_{up}}\right)$$

denotes the pre-EDMG waveform corresponding to the transmit chain with the transmit chain number $i_{TX}$, $\Delta F$ denotes a channel spacing equal to 2.16 GHz, and $\Delta t_1$ and $\Delta t_2$ are in the range $[0, T_c]$.

19. The apparatus of claim 16 configured to cause the EDMG STA to, when the channel bandwidth is 6.48 Gigahertz (GHz), determine the pre-EDMG waveform corresponding to the transmit chain as follows:

$$r^{i_{TX}}_{pre-EDMG}\left(n\frac{T_c}{N_{up}}\right) = r^{i_{TX}(4)}_{pre-EDMG}\left(n\frac{T_c}{N_{up}} + \Delta t_1\right) \cdot \frac{1}{\sqrt{3}}$$
$$\exp\left(-j2\pi\Delta F\left(\frac{T_c}{N_{up}}\right)n\right) + + r^{i_{TX}(4)}_{pre-EDMG}\left(n\frac{T_c}{N_{up}} + \Delta t_2\right) \cdot \frac{1}{\sqrt{3}} + +$$
$$r^{i_{TX}(4)}_{pre-EDMG}\left(n\frac{T_c}{N_{up}} + \Delta t_3\right) \cdot \frac{1}{\sqrt{3}} \exp\left(+j2\pi\Delta F\left(\frac{T_c}{N_{up}}\right)n\right), 1 \le i_{TX} \le N_{TX}$$

wherein:

$N_{Tx}$ denotes a total count of the one or more transmit chains, $$r^{i_{TX}}_{pre-EDMG}\left(n\frac{T_c}{N_{up}}\right)$$

denotes the pre-EDMG waveform corresponding to the transmit chain with the transmit chain number $i_{TX}$, $\Delta F$ denotes a channel spacing equal to 2.16 GHz, and $\Delta t_1$, $\Delta t_2$ and $\Delta t_3$ are in the range $[0, T_c]$.

20. The apparatus of claim 16 configured to cause the EDMG STA to, when the channel bandwidth is 8.64 Gigahertz (GHz), determine the pre-EDMG waveform corresponding to the transmit chain as follows:

$$r^{i_{TX}}_{pre-EDMG}\left(n\frac{T_c}{N_{up}}\right) =$$
$$r^{i_{TX}(4)}_{pre-EDMG}\left(n\frac{T_c}{N_{up}} + \Delta t_1\right) \cdot \frac{1}{\sqrt{4}} \exp\left(-j2\pi\left(\frac{3\Delta F}{2}\right)\left(\frac{T_c}{N_{up}}\right)n\right) + +$$
$$r^{i_{TX}(4)}_{pre-EDMG}\left(n\frac{T_c}{N_{up}} + \Delta t_2\right) \cdot \frac{1}{\sqrt{4}} \exp\left(-j2\pi\left(\frac{\Delta F}{2}\right)\left(\frac{T_c}{N_{up}}\right)n\right) + +$$
$$r^{i_{TX}(4)}_{pre-EDMG}\left(n\frac{T_c}{N_{up}} + \Delta t_3\right) \cdot \frac{1}{\sqrt{4}} \exp\left(+j2\pi\left(\frac{\Delta F}{2}\right)\left(\frac{T_c}{N_{up}}\right)n\right) + +$$
$$r^{i_{TX}(4)}_{pre-EDMG}\left(n\frac{T_c}{N_{up}} + \Delta t_4\right) \cdot \frac{1}{\sqrt{4}} \exp\left(+j2\pi\left(\frac{3\Delta F}{2}\right)\left(\frac{T_c}{N_{up}}\right)n\right), 1 \le i_{TX} \le N_{TX}$$

wherein:

$N_{Tx}$ denotes a total count of the one or more transmit chains, $$r^{i_{TX}}_{pre-EDMG}\left(n\frac{T_c}{N_{up}}\right)$$

denotes the pre-EDMG waveform corresponding to the transmit chain with the transmit chain number $i_{TX}$, $\Delta F$ denotes a channel spacing equal to 2.16 GHz, and $\Delta t_1$, $\Delta t_2$, $\Delta t_3$, and $\Delta t_4$ are in the range $[0, T_c]$.

21. The apparatus of claim 1, wherein the channel bandwidth is 2.16 Gigahertz (GHz), 4.32 GHz, 6.48 GHz, or 8.64 GHz.

22. The apparatus of claim 1 comprising a radio, the processor configured to cause the radio to transmit the EDMG SC mode MU PPDU.

23. The apparatus of claim 22 comprising one or more antennas connected to the radio, and another processor to execute instructions of an operating system.

24. A product comprising one or more tangible computer-readable non-transitory storage media comprising computer-executable instructions operable to, when executed by at least one processor, enable the at least one processor to cause an Enhanced Directional Multi-Gigabit (DMG) (EDMG) wireless communication station (STA) to:

determine one or more Physical Layer (PHY) Protocol Data Unit (PPDU) waveforms corresponding to one or more transmit chains, respectively, the one or more PPDU waveforms based on a spatial mapping of pre-EDMG modulated fields of an EDMG Single Carrier (SC) mode Multi User (MU) PPDU from a spatial stream to the one or more transmit chains, wherein a PPDU waveform corresponding to a transmit chain of the one or more transmit chains is based on a transmit chain number of the transmit chain, wherein the pre-EDMG modulated fields comprise a non-EDMG Short Training Field (L-STF), a non-EDMG Channel Estimation Field (L-CEF), a non-EDMG Header (L-Header), and a first EDMG Header (EDMG-Header-A);

determine one or more up-sampled and filtered waveforms corresponding to the one or more transmit chains, respectively, by up-sampling and filtering the one or more PPDU waveforms according to an up-sampling factor and a pulse-shaping filter impulse response;

determine one or more pre-EDMG waveforms corresponding to the one or more transmit chains, respectively, wherein a pre-EDMG waveform corresponding to the transmit chain is based on an up-sampled and filtered waveform corresponding to the transmit chain, and on a channel bandwidth for transmission of the EDMG SC mode MU PPDU;

determine one or more EDMG SC mode MU PPDU waveforms corresponding to the one or more transmit chains, respectively, wherein an EDMG SC mode MU PPDU waveform corresponding to the transmit chain comprises a concatenation of the pre-EDMG waveform corresponding to the transmit chain with an EDMG waveform corresponding to EDMG modulated fields of the EDMG SC mode MU PPDU, the EDMG modulated fields of the EDMG SC mode MU PPDU comprising an EDMG preamble, a second EDMG header (EDMG-Header-B), and a data field; and transmit the EDMG SC mode MU PPDU via the one or more transmit chains over the channel bandwidth based on the one or more EDMG SC mode MU PPDU waveforms.

25. The product of claim 24, wherein the instructions, when executed, cause the EDMG STA to determine the EDMG waveform by filtering and resampling the EDMG modulated fields of the EDMG SC mode MU PPDU according to a conversion rate ratio, which is based on a count of 2.16 Gigahertz (GHz) channels in the channel bandwidth.

* * * * *